US012765167B2

(12) United States Patent
Kim et al.

(10) Patent No.: US 12,765,167 B2
(45) Date of Patent: Oct. 13, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Heunggyu Kim, Yongin-si (KR); Sehun Kim, Yongin-si (KR); Myoungjin Park, Yongin-si (KR); Soohyun Park, Yongin-si (KR); Eunho Song, Yongin-si (KR); Yonghan Lee, Yongin-si (KR); Changhee Lee, Yongin-si (KR); Junghwan Lim, Yongin-si (KR); Jaekook Ha, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 960 days.

(21) Appl. No.: 18/146,944

(22) Filed: Dec. 27, 2022

(65) Prior Publication Data

US 2023/0217676 A1 Jul. 6, 2023

(30) Foreign Application Priority Data

Dec. 30, 2021 (KR) ........................ 10-2021-0193413

(51) Int. Cl.

| | |
|---|---|
| ***H10K 50/818*** | (2023.01) |
| ***H10K 50/16*** | (2023.01) |
| ***H10K 59/12*** | (2023.01) |
| ***H10K 59/35*** | (2023.01) |
| ***H10K 71/00*** | (2023.01) |
| ***H10K 85/60*** | (2023.01) |
| *H10K 102/00* | (2023.01) |

(52) U.S. Cl.

CPC ........... *H10K 50/166* (2023.02); *H10K 59/12* (2023.02); *H10K 59/35* (2023.02); *H10K 71/00* (2023.02); *H10K 85/60* (2023.02); *H10K 85/624* (2023.02); *H10K 85/6576* (2023.02); *H10K 59/1201* (2023.02); *H10K 2102/00* (2023.02); *H10K 2102/351* (2023.02)

(58) Field of Classification Search

None

See application file for complete search history.

(56) References Cited

U.S. PATENT DOCUMENTS

| | | | |
|---|---|---|---|
| 10,396,306 | B2 | 8/2019 | Kim et al. |
| 2019/0131557 | A1 | 5/2019 | Lee et al. |
| 2022/0056291 | A1 | 2/2022 | Kim et al. |
| 2022/0169878 | A1 | 6/2022 | Sim et al. |

FOREIGN PATENT DOCUMENTS

| | | | | | |
|---|---|---|---|---|---|
| CN | 106356469 | A | * | 1/2017 | ............. B33Y 10/00 |
| CN | 107099190 | A | | 8/2017 | |
| CN | 109825129 | A | | 5/2019 | |
| CN | 110277499 | A | | 9/2019 | |
| CN | 111653678 | A | | 9/2020 | |
| CN | 112300631 | A | | 2/2021 | |
| JP | 2010-168471 | A | | 8/2010 | |
| KR | 10-2019-0046401 | A | | 5/2019 | |
| KR | 10-2019-0079111 | A | | 7/2019 | |
| KR | 10-2022-0022518 | A | | 2/2022 | |
| KR | 10-2022-0077958 | A | | 6/2022 | |
| WO | WO-2020121398 | A1 | * | 6/2020 | ............. H10K 50/16 |

OTHER PUBLICATIONS

Lee, Taesoo, et al. "Highly efficient and bright inverted top-emitting InP quantum dot light-emitting diodes introducing a hole-suppressing interlayer." Small 15.50 (2019): 1905162. (Year: 2019).*

Park, Myeongjin, et al. "Improving Performance of Inverted Blue Quantum-Dot Light-Emitting Diodes by Adopting Organic/Inorganic Double Electron Transport Layers." physica status solidi (RRL)-Rapid Research Letters 14.5 (2020): 1900737. (Year: 2020).*

Wang, Qiang, Zhaoqi Deng, and Dongge Ma. "Highly efficient inverted top-emitting organic light-emitting diodes using a lead monoxide electron injection layer." Optics Express 17.20 (2009): 17269-17278. (Year: 2009).*

Hosono, Hideo, et al. "Transparent amorphous oxide semiconductors for organic electronics: Application to inverted OLEDs." Proceedings of the National Academy of Sciences 114.2 (2017): 233-238. (Year: 2017).*

Machine translation of CN-106356469, translation generated on Feb. 13, 2026, 8 pages. (Year: 2026).*

Machine translation of WO-2020121398, translation generated on Feb. 13, 2026, 12 pages. (Year: 2026).*

International Search Report for corresponding PCT Patent Application No. PCT/KR2022/021658 mailed Mar. 31, 2023, 7pp.

Fukagawa, Hirohiko et al.; "Long-Lived Flexible Displays Employing Efficient and Stable Inverted Organic Light-Emitting Diodes"; Adv. Mater.; 2018; 1706768; 7pp.

Wang, Shipan et al.; "All Organic Layers Inkjet Printed OLEDs with a Printable Electronic Transport Layer"; SID 2019 Digest; vol. 50; Issue 1; Jun. 2019; pp. 1157-1159.

* cited by examiner

*Primary Examiner* — Robert S Loewe

(74) *Attorney, Agent, or Firm* — Womble Bond Dickinson (US) LLP

(57) ABSTRACT

A light-emitting device having an electron transport layer that includes a first electron transport layer including an inorganic oxide and a second electron transport layer including an organic material is provided. The first electrode is a reflective electrode.

22 Claims, 2 Drawing Sheets

LIGHT-EMITTING DEVICE AND ELECTRONIC APPARATUS INCLUDING THE SAME

CROSS-REFERENCE TO RELATED APPLICATION

This application claims priority to and the benefit of Korean Patent Application No. 10-2021-0193413, filed on Dec. 30, 2021, in the Korean Intellectual Property Office, the entire content of which is hereby incorporated by reference.

BACKGROUND

1. Field

Aspects of one or more embodiments relate to a light-emitting device and an electronic apparatus including the same.

2. Description of the Related Art

Light-emitting devices are self-emissive devices that, as compared with devices of the related art, have wide viewing angles, high contrast ratios, short response times, and excellent characteristics in terms of luminance, driving voltage, and response speed.

Organic light-emitting devices (OLEDs) may include a first electrode (or a second electrode) on a substrate, and a hole transport region, an emission layer, an electron transport region, and a second electrode or (first electrode), sequentially stacked on the first electrode (or second electrode). Holes provided from the first electrode (or second electrode) may move toward the emission layer through the hole transport region, and electrons provided from the second electrode (or first electrode) may move toward the emission layer through the electron transport region. Carriers, such as holes and electrons, recombine in the emission layer to produce light.

SUMMARY

Aspects of one or more embodiments of the present disclosure are directed to a device etc. having improved (increased) efficiency.

Additional aspects of embodiments of the present disclosure will be set forth in part in the description which follows and, in part, will be apparent from the description, or may be learned by practice of the presented embodiments of the disclosure.

According to one or more embodiments, a light-emitting device includes a first electrode, a second electrode facing the first electrode, and an interlayer between the first electrode and the second electrode and including an emission layer, wherein an electron transport layer is between the emission layer and the first electrode, the electron transport layer includes a first electron transport layer including an inorganic oxide and a second electron transport layer including an organic material, and the first electrode is a reflective electrode.

According to one or more embodiments, an electronic apparatus includes the light-emitting device.

According to one or more embodiments, a method of manufacturing a light-emitting device includes forming a first electron transport layer by inkjetting a first inkjet composition and forming a second electron transport layer by inkjetting a second inkjet composition on the first electron transport layer.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
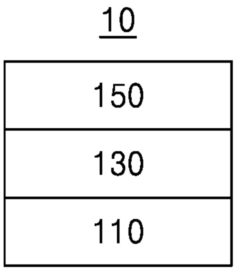
FIG. 1 is a schematic view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

An inverted organic light-emitting device (OLED) may have superior oxidation stability compared to that of the existing structure and may be driven in an n-type (or kind) thin-film transistor (TFT).

In the related art, an inorganic electron transport layer is formed by a sputtering or spin-coating process, and an organic electron transport layer is formed by a spin-coating process. However, through such a process, controlling thicknesses of the electron transport layers according to each RGB pixel is difficult or impossible, and it is difficult to implement a substantially uniform large area panel.

A light-emitting device that may solve such problems is needed.

In an embodiment, a light-emitting device may include:

a first electrode;

a second electrode facing the first electrode; and an interlayer between the first electrode and the second electrode and including an emission layer, wherein an electron transport layer may be between the emission layer and the first electrode, the electron transport layer may include a first electron transport layer including an inorganic oxide and a second electron transport layer including an organic material, and the first electrode may be a reflective electrode.

The first electrode and second electrode may each independently be an anode or a cathode.

In an embodiment, the first electrode may include indium tin oxide (ITO), indium zinc oxide (IZO), tin oxide ($SnO_2$), zinc oxide (ZnO), or one or more combinations thereof.

In an embodiment, the first electrode may include magnesium (Mg), silver (Ag), aluminum (Al), aluminum-lithium (Al—Li), calcium (Ca), magnesium-indium (Mg—In), magnesium-silver (Mg—Ag), or one or more combinations thereof. The first electrode may have a single-layered structure including (e.g., consisting of) a single layer or a multi-layered structure including a plurality of layers.

Because the first electrode is a reflective electrode, when the first electrode includes indium tin oxide (ITO), indium zinc oxide (IZO), tin oxide ($SnO_2$), zinc oxide (ZnO), or one or more combinations thereof, magnesium (Mg), silver (Ag), aluminum (Al), aluminum-lithium (Al—Li), calcium (Ca), magnesium-indium (Mg—In), magnesium-silver (Mg—Ag), or one or more combinations thereof may concurrently (e.g., simultaneously) be included. For example, the first electrode may have a two-layered structure of Ag/ITO or a three-layered structure of ITO/Ag/ITO.

In a light-emitting device according to an embodiment, the first electrode may be a cathode, the second electrode may be an anode, and the light-emitting device may further include a hole transport region that is between the second electrode and the emission layer and includes a hole injection layer, a hole transport layer, an electron blocking layer, or one or more combinations thereof.

In an embodiment, the first electron transport layer may be in direct contact with the second electron transport layer. For example, the first electron transport layer and the second electron transport layer may physically be in direct contact with each other.

In an embodiment, the first electron transport layer may be in direct contact with the first electrode. For example, the first electron transport layer and the first electrode may physically be in direct contact with each other.

In an embodiment, the second electron transport layer may be in direct contact with the emission layer. For example, the second electron transport layer and the emission layer may physically be in direct contact with each other.

In an embodiment, the inorganic oxide of the first electron transport layer may include an oxide of Ti, Zn, Mg, Al, Sn, or one or more combinations thereof. ZnO is excluded.

In an embodiment, the inorganic oxide of the first electron transport layer may include $TiO_2$, ZnMgO, ZnAlO, $SnO_2$, or one or more combinations thereof.

In one or more embodiments, the organic material of the second electron transport layer may include one or more of the following compounds:

Compound 101

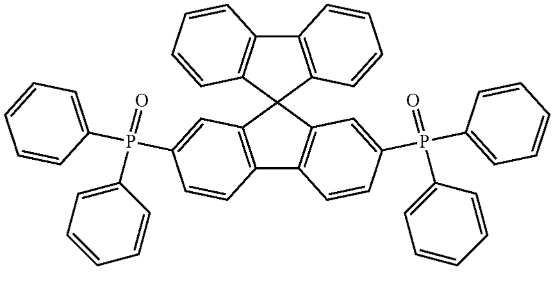

-continued

Compound 102

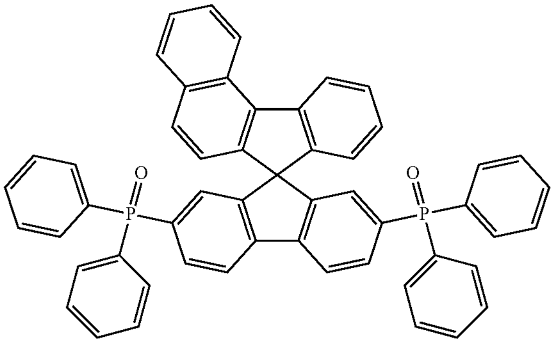

Compound 103

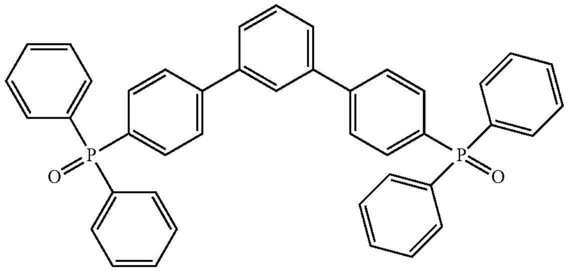

Compound 104

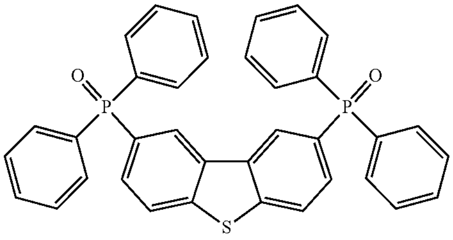

Compound 105

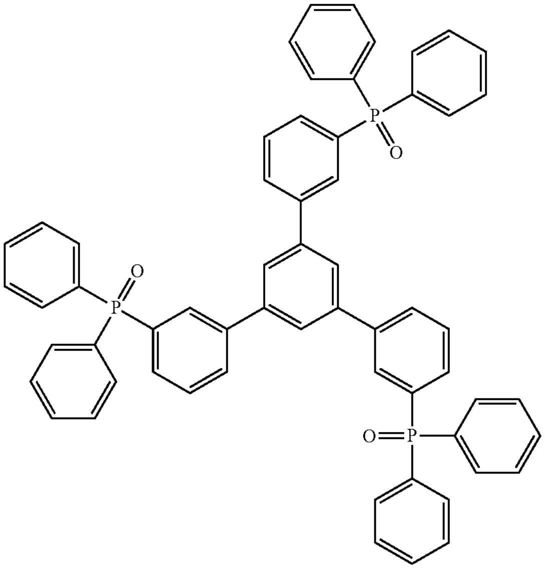

-continued

Compound 106

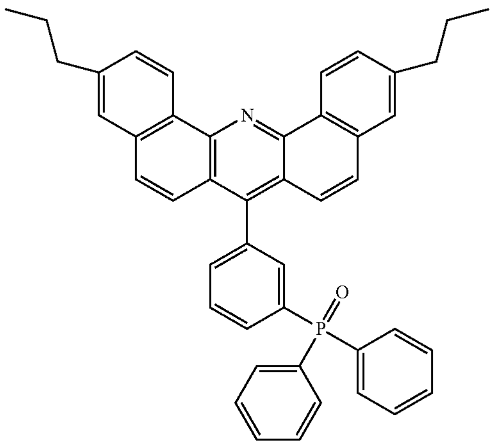

Compound 107

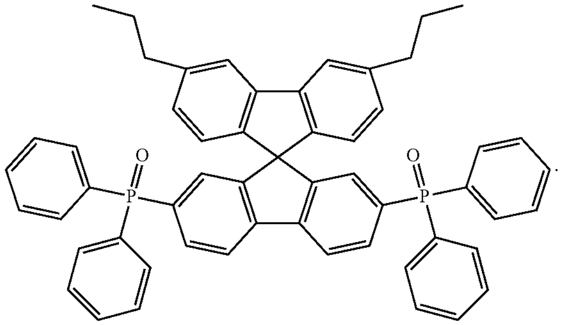

In an embodiment, the first electron transport layer may be thicker than the second electron transport layer. If the second electron transport layer is thicker than the first electron transport layer, the electron flow may not be smooth and may adversely affect the device efficiency.

In an embodiment, a thickness of the first electron transport layer may be in a range of about 200 Å to about 4,000 Å. For example, the thickness of the first electron transport layer may be in a range of about 300 Å to about 2,500 Å.

In an embodiment, a thickness of the second electron transport layer may be in a range of about 50 Å to about 600 Å. For example, the thickness of the second electron transport layer may be in a range of about 100 Å to about 250 Å.

In an embodiment, the first electron transport layer and the second electron transport layer may be layers formed by inkjetting.

When forming the first electron transport layer and the second electron transport layer, a first inkjet composition including an inorganic oxide may be used in the first electron transport layer, and a second inkjet composition including an organic material may be used in the second electron transport layer.

For example, the first inkjet composition may include: an oxide of Ti, Zn, Mg, Al, Sn, or one or more combinations thereof (however, ZnO is excluded); and a solvent. For example, the first inkjet composition may include $TiO_2$, ZnMgO, ZnAlO, $SnO_2$, or one or more combinations thereof; and solvent. The solvent may be, for example, alcohol-based, ester-based, etc. compounds. The first inkjet composition may include, for example, a dispersant, if needed (or suitable). The dispersant may include anionic, cationic, and/or nonionic polymeric materials.

For example, the second inkjet compound may include one of Compounds 101 to 107 and a solvent. The solvent may be, for example, alcohol-based, ester-based, etc. compounds.

Concentrations of the first inkjet composition and the second inkjet composition may be suitable for inkjetting. For example, the concentrations of the first inkjet composition and the second inkjet composition may each independently be in a range of about 0.1 wt % to about 5 wt % based on a total weight of 100 of the inkjet composition.

Because the first electron transport layer and the second electron transport layer of the light-emitting device according to an embodiment may be formed by the inkjet, the thicknesses of the first electron transport layer and the second electron transport layer may be controlled (or selected) according to each RGB.

For example, the light-emitting device may include a plurality of subpixels, the plurality of subpixels may include: a red subpixel including a red emission layer, a first electron transport layer (R), and a second electron transport layer (R); a green subpixel including a green emission layer, a first electron transport layer (G), and a second electron transport layer (G); a blue subpixel including a blue emission layer, a first electron transport layer (B), and a second electron transport layer (B); or one or more combinations thereof, and the thicknesses of each of the first electron transport layer (R), the second electron transport layer (R), the first electron transport layer (G), the second electron transport layer (G), the first electron transport layer (B), and the second electron transport layer (B) may be identical to or different from each other.

Because the first hole transport layer and the second transport layer of the light-emitting device according to an embodiment are formed by inkjetting, the thicknesses of the first electron transport layers and the second electron transport layers may be adjusted to be the same or to be different as suitable or desired.

Another aspect of an embodiment of the present disclosure provides an electronic apparatus including the light-emitting device.

In an embodiment, the electronic apparatus may further include a TFT, the TFT includes a source electrode and a drain electrode, and the first electrode of the light-emitting device may be electrically connected to the source or drain electrode of the TFT.

For example, the TFT may be an oxide TFT. The oxide TFT may include, for example, an N-channel metal oxide semiconductor (NMOS). The NMOS may have a lower hysteresis as compared to that of a P-channel metal oxide semiconductor (PMOS).

A major carrier of the oxide TFT is an electron and the electron mobility is relatively high. In addition, the oxide TFT is advantageous in being able to be processed at a low temperature and in a large area, and is similar to a-Si TFT. In addition, because the amount of leakage of current is small, capacitance of the device may be maintained, and driving of the device may be stable even at a low current.

In an embodiment, the electronic apparatus may further include a color filter, a color conversion layer, a touch screen layer, a polarizing layer, or one or more combinations thereof.

In an embodiment, a capping layer may be outside the first electrode and/or the second electrode.

The term "interlayer" as used herein refers to a single layer and/or all of a plurality of layers between the first electrode and the second electrode of the light-emitting device.

The method of manufacturing the light-emitting device according to another embodiment includes:

forming a first electron transport layer by inkjetting a first inkjet composition; and forming a second electron transport layer by inkjetting a second inkjet composition on the first electron transport layer.

For example, the first inkjet composition may include: an oxide of Ti, Zn, Mg, Al, Sn, or one or more combinations thereof (however, ZnO is excluded); and a solvent.

In an embodiment, the second inkjet composition may include a phosphine oxide compound; and a solvent.

In an embodiment, the phosphine oxide compound may include any compound of Compounds 101 to 107.

In an embodiment, the light-emitting device may include: a first electrode; a second electrode facing the first electrode; and an interlayer between the first electrode and the second electrode and including an emission layer, wherein the first electron transport layer and the second electrode transport layer are between the emission layer and the first electrode, and the first electrode may be a reflective electrode.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 1.

First Electrode 110

In FIG. 1, a substrate may be additionally located under the first electrode 110 or on the second electrode 150. As the substrate, a glass substrate and/or a plastic substrate may be used. In one or more embodiments, the substrate may be a flexible substrate, and may include plastics with excellent or suitable heat resistance and durability, such as polyimide, polyethylene terephthalate (PET), polycarbonate, polyethylene naphthalate, polyarylate (PAR), polyetherimide, or one or more combinations thereof.

The first electrode 110 may be a cathode, which is an electron injection electrode, and as a material for forming the first electrode 110, a metal, an alloy, an electrically conductive compound, or one or more combinations thereof, each having a low work function, may be used.

The second electrode 110 may include lithium (Li), Ag, Mg, Al, Al—Li, Ca, Mg—In, Mg—Ag, ytterbium (Yb), silver-ytterbium (Ag—Yb), ITO, IZO, or one or more combinations thereof. The first electrode 110 may be a reflective electrode.

The first electrode 110 may have a single-layered structure or a multi-layered structure including two or more layers.

The first electrode 110 may be the same as in the description of the first electrode.

Interlayer 130

The interlayer 130 may be on the first electrode 110. The interlayer 130 may include an emission layer.

The interlayer 130 may further include a hole transport region between the second electrode 150 and the emission layer and an electron transport region between the emission layer and the first electrode 110.

The interlayer 130 may further include, in addition to one or more suitable organic materials, a metal-containing compound such as an organometallic compound, an inorganic material such as quantum dots, and/or the like.

The interlayer 130 may include i) two or more emitting units sequentially stacked between the first electrode 110 and the second electrode 150, and ii) a charge generation layer between the two or more emitting units. When the interlayer 130 includes emitting units and a charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or one or more combinations thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are sequentially stacked from the second electrode 150.

The hole transport region may include a compound represented by Formula 201, a compound represented by Formula 202, or a combination thereof:

Formula 201

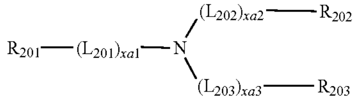

Formula 202

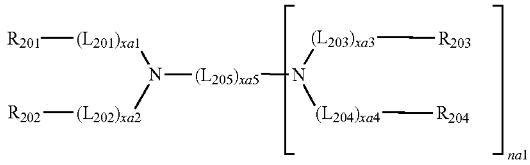

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$(for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

CY201

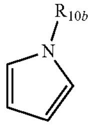

CY202

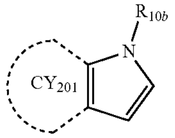

CY203

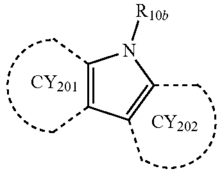

CY204

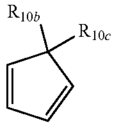

CY205

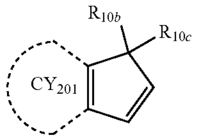

CY206

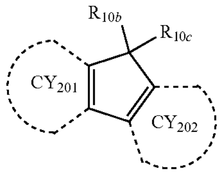

-continued

CY207

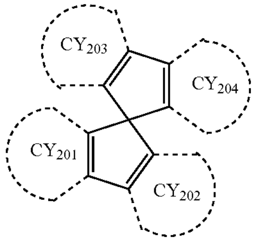

CY208

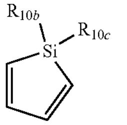

CY209

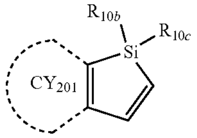

CY210

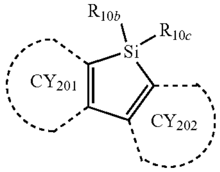

CY211

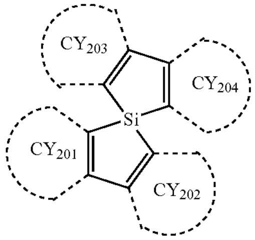

CY212

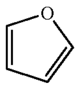

CY213

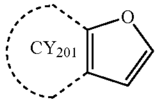

-continued

CY214

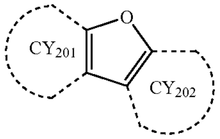

CY215

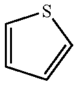

CY216

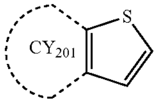

CY217

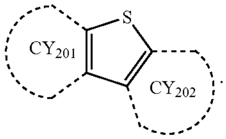

$R_{10b}$ and $R_{10c}$ in Formulae CY201 to CY217 are the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring $CY_{201}$ to ring $CY_{204}$ in Formulae $CY_{201}$ to $CY_{217}$ may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include (e.g., may exclude) a group represented by one of Formulae CY201 to CY203.

In one or more embodiments, each of Formulae 201 and 202 may not include (e.g., may exclude) a group represented by one of Formulae CY201 to CY203, and may include at least one of the groups represented by Formulae CY204 to CY217.

In one or more embodiments, each of Formulae 201 and 202 may not include (e.g., may exclude) a group represented by one of Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or one or more combinations thereof:

HT1

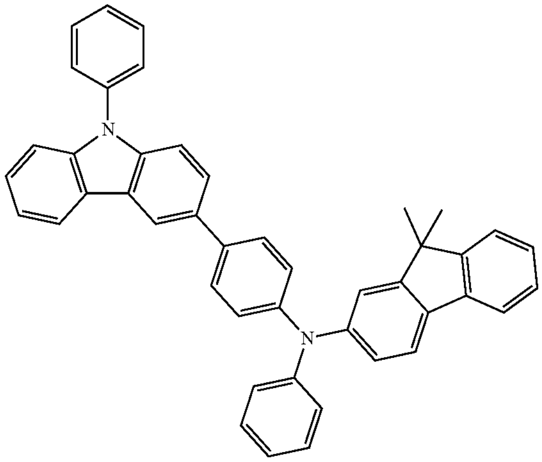

HT2

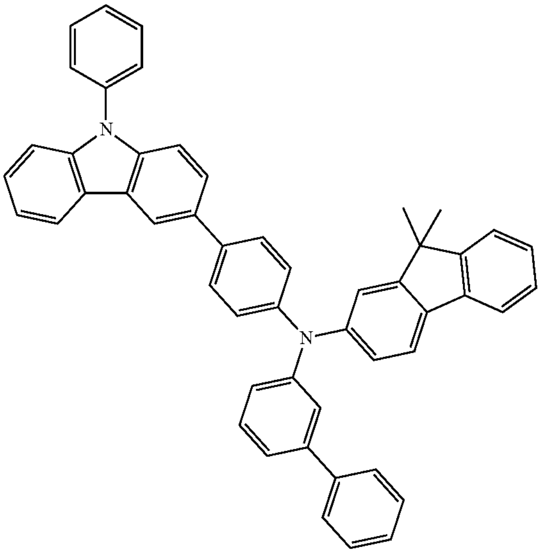

-continued
HT3
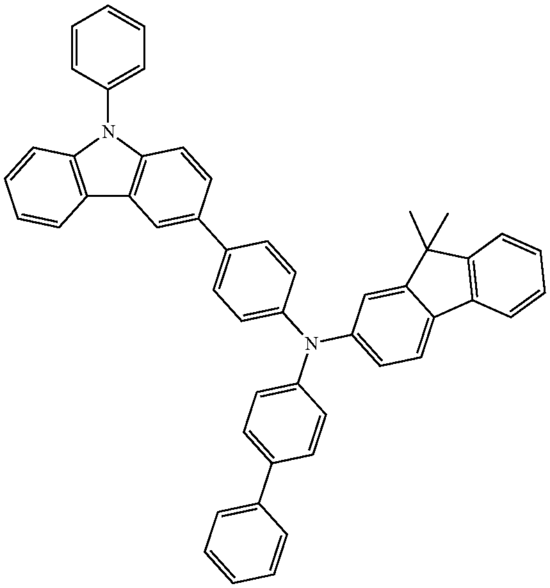
HT4
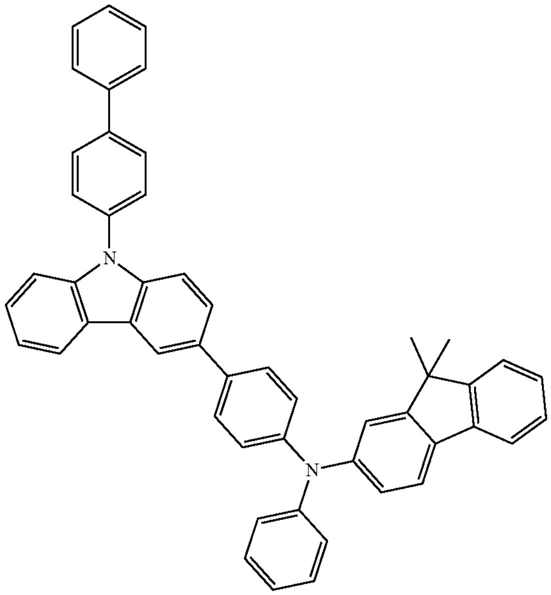
HT5
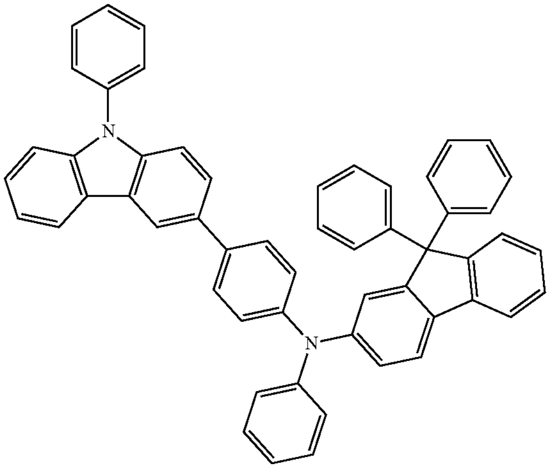
HT6
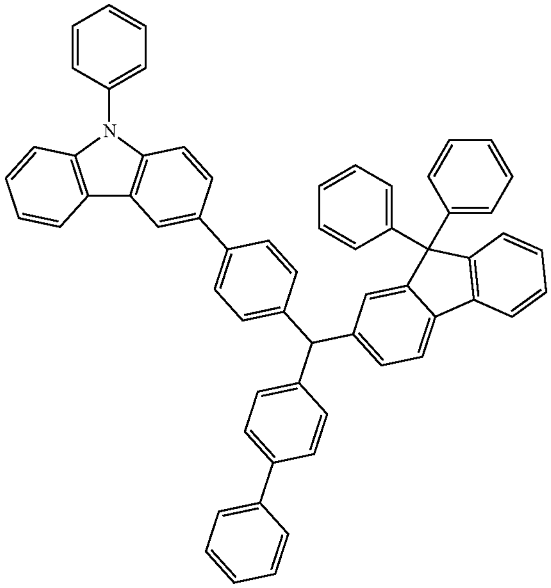

-continued
HT7
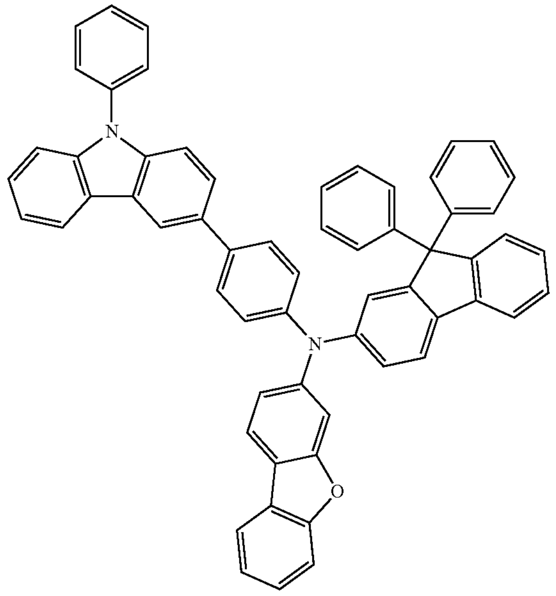
HT8
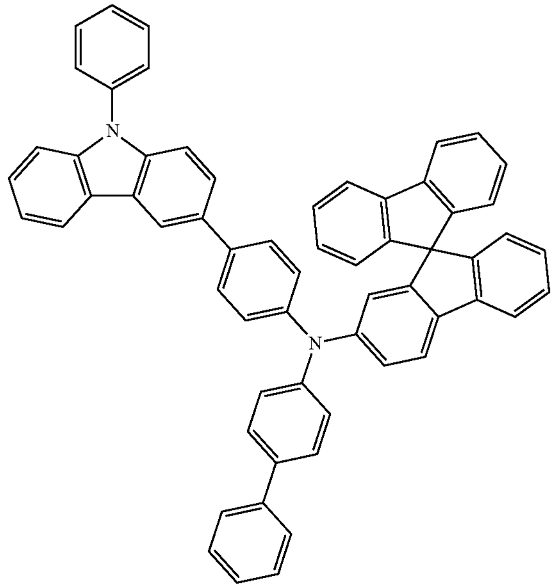
HT9
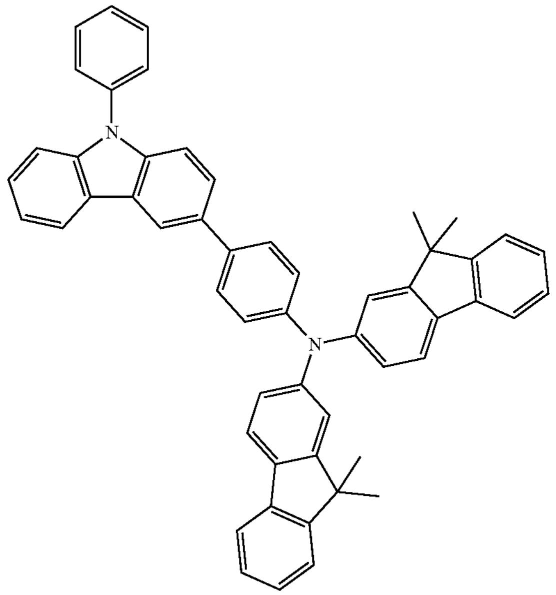
HT10
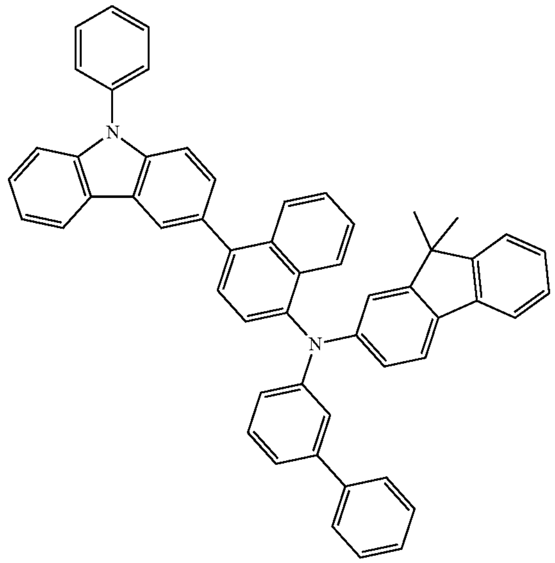

-continued
HT11
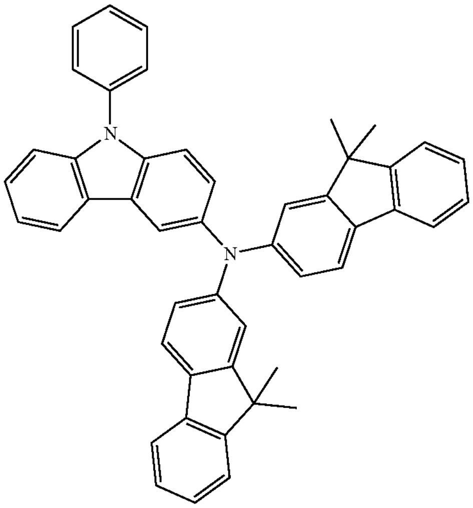
HT12
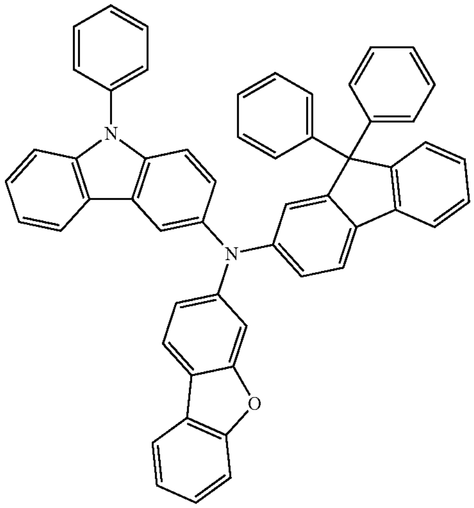
HT13
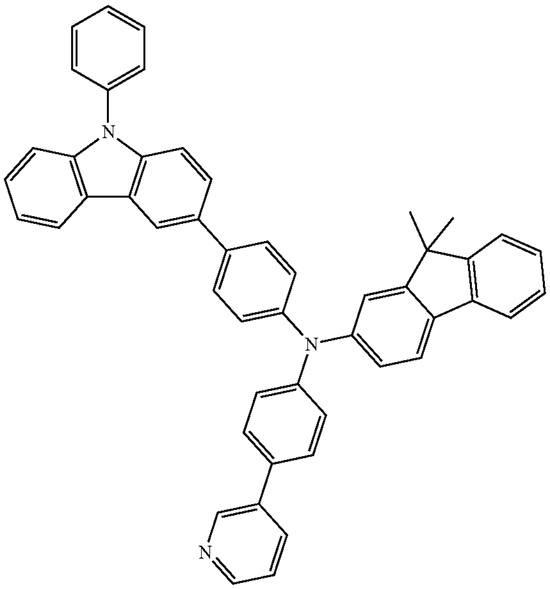
HT14
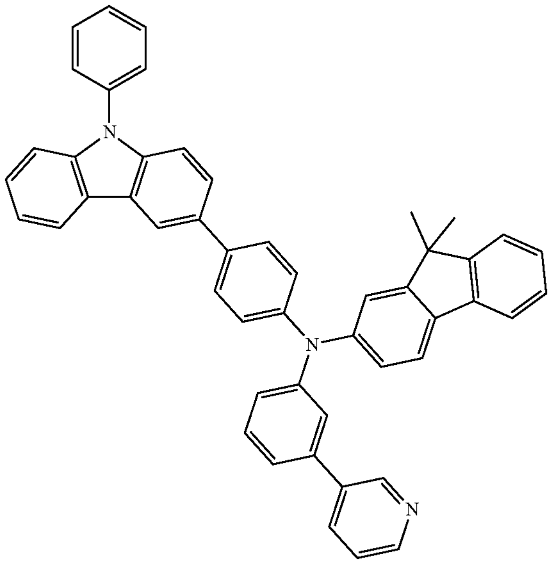
HT15
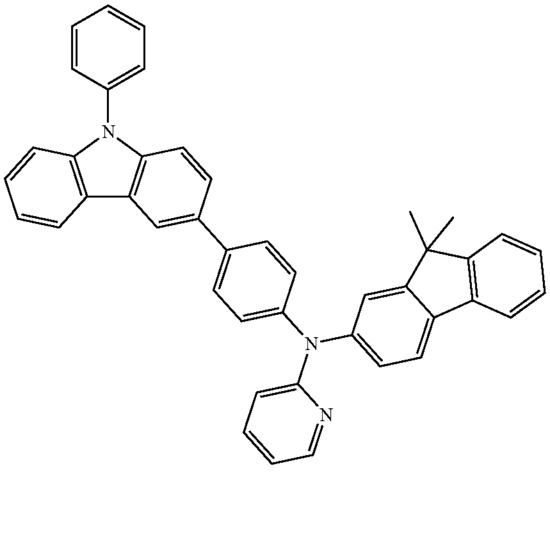
HT16
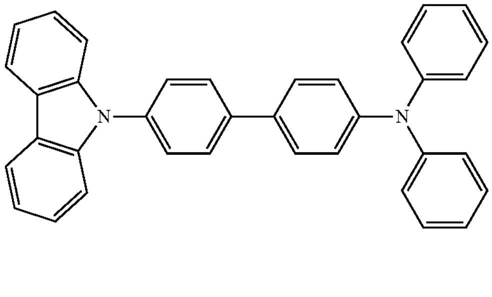

-continued
HT17
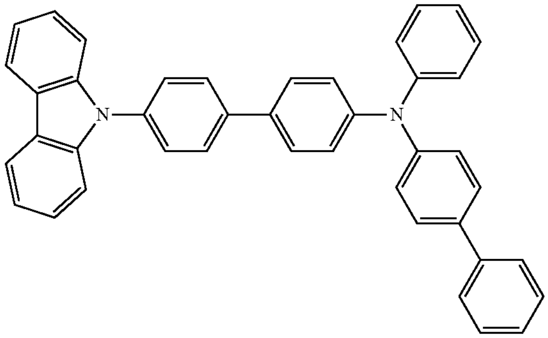
HT18
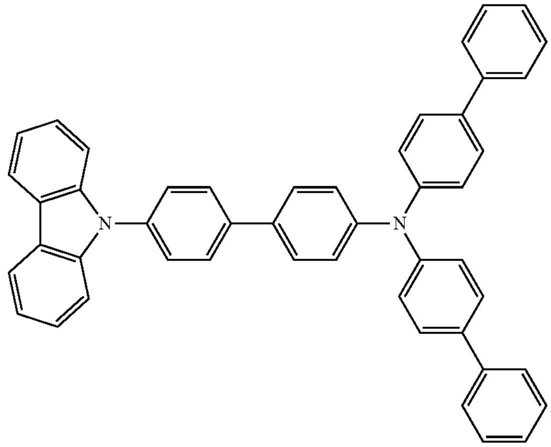
HT19
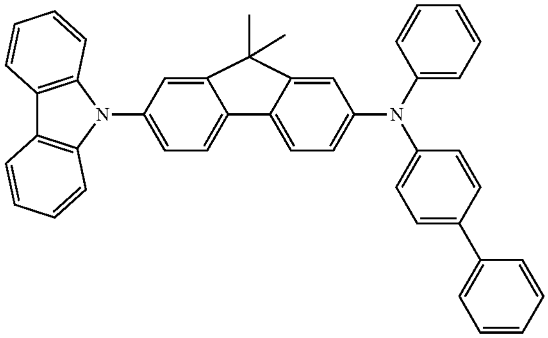
HT20
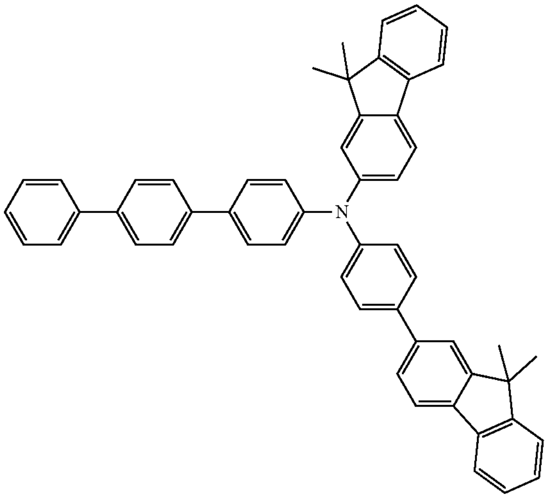
HT21
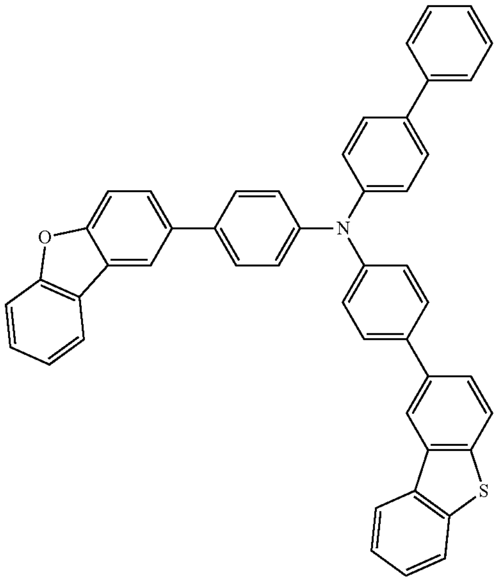
HT22
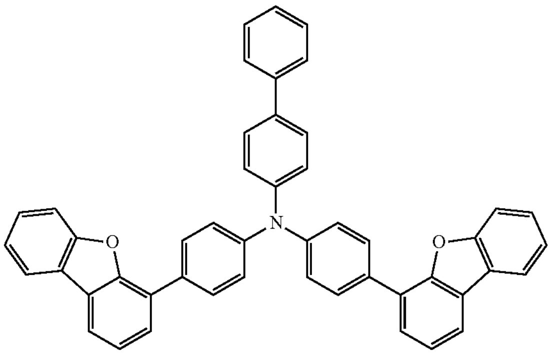

-continued
HT23
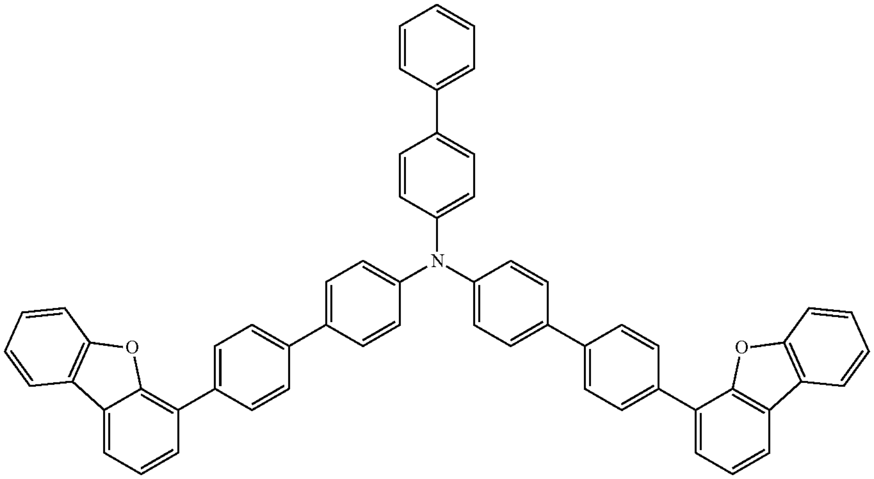
HT24
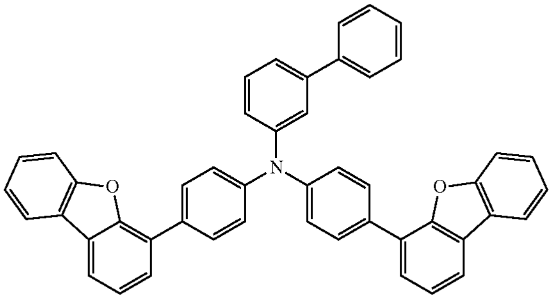
HT25
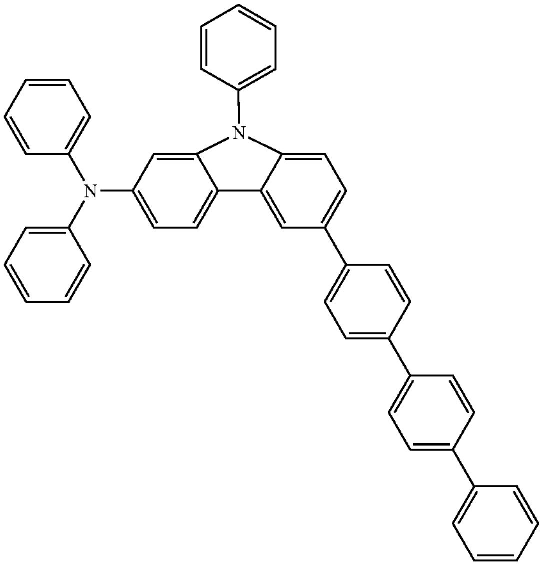
HT26
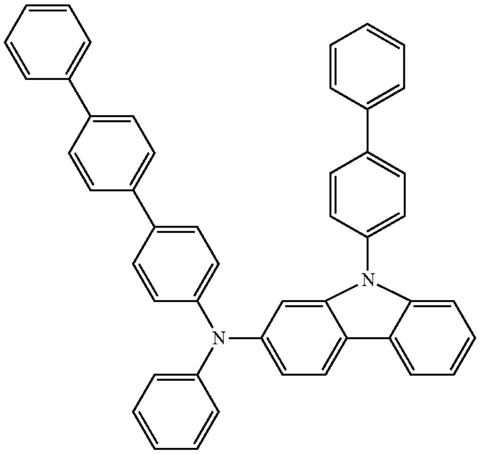
HT27
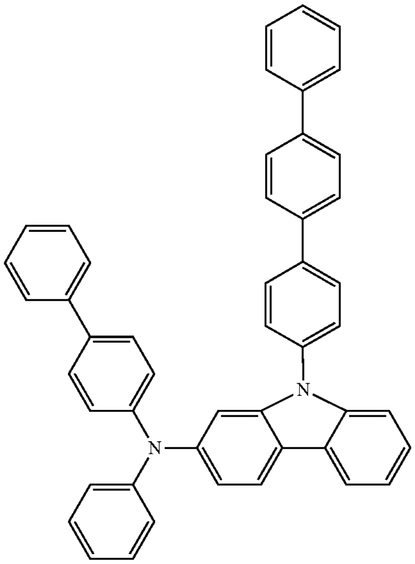

-continued
HT28
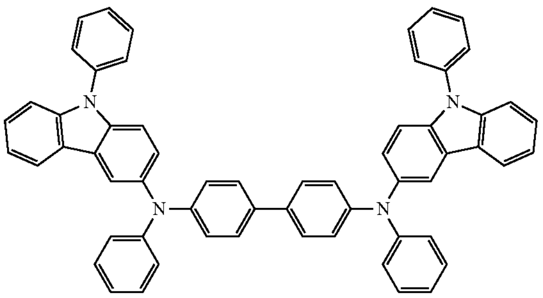
HT29
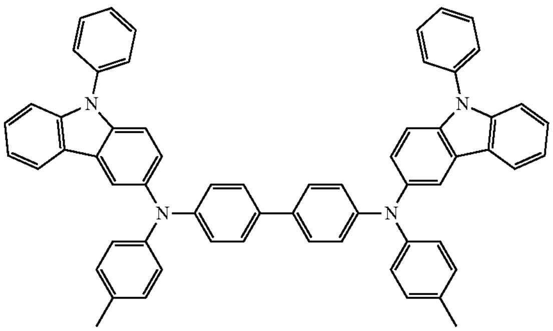
HT30
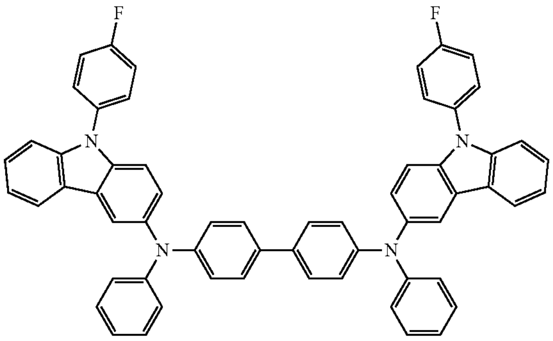
HT31
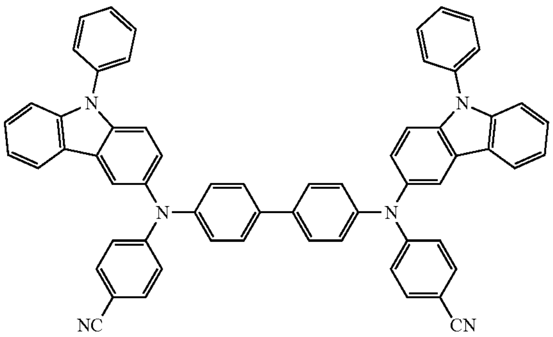
HT32
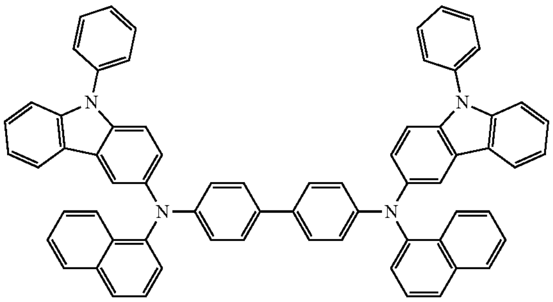
HT33
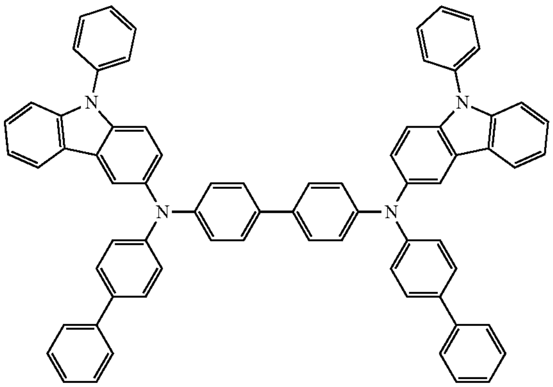
HT34
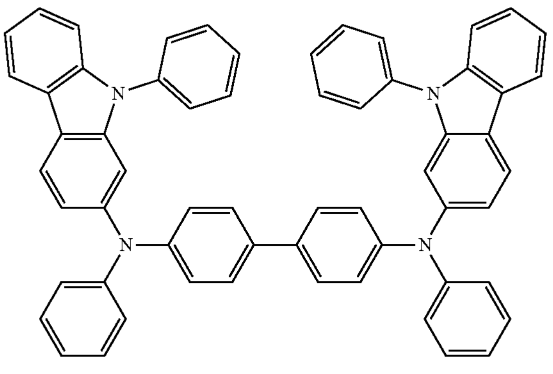
HT35
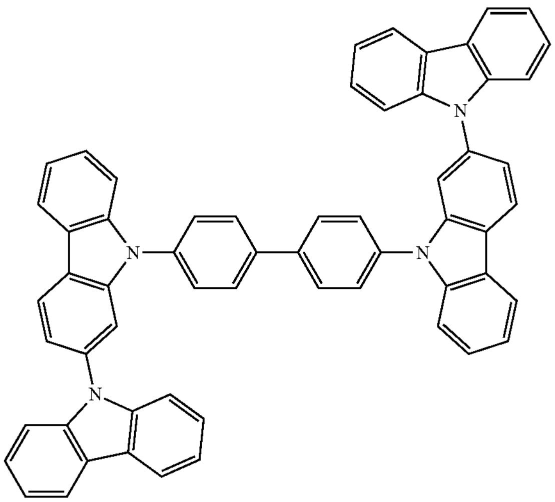

-continued
HT36
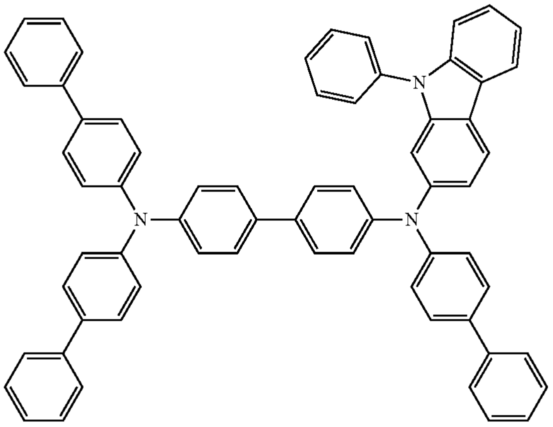
HT37
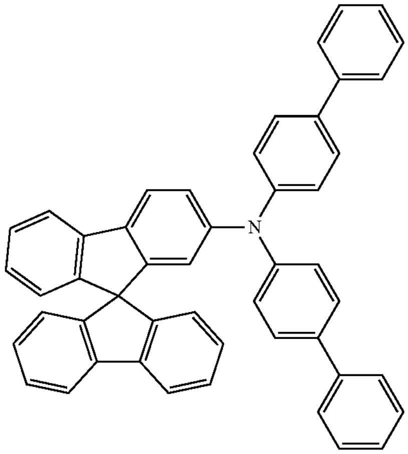
HT38
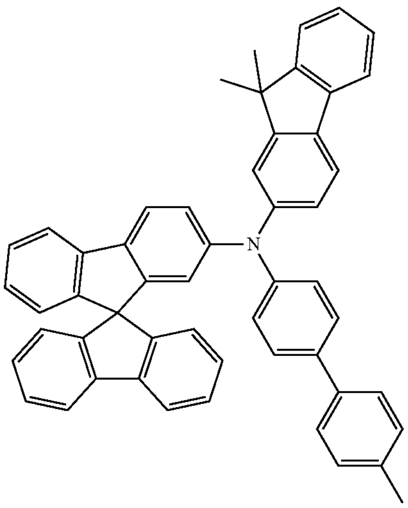
HT39
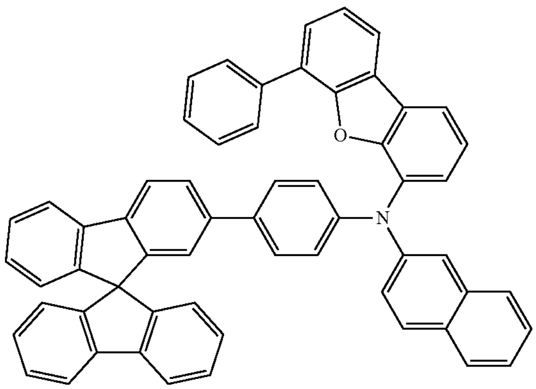
HT40
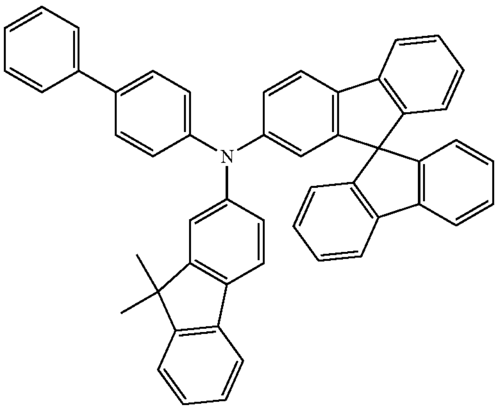
HT41
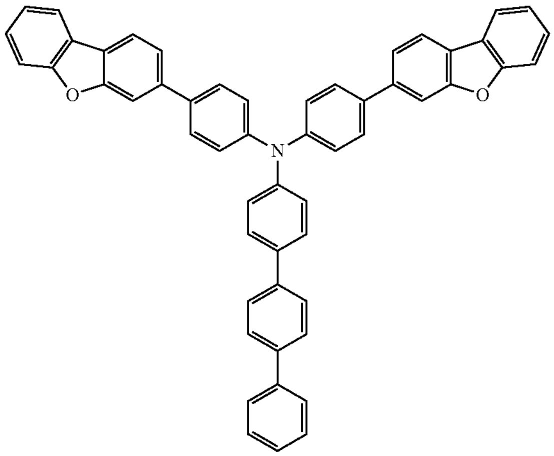

-continued
HT42
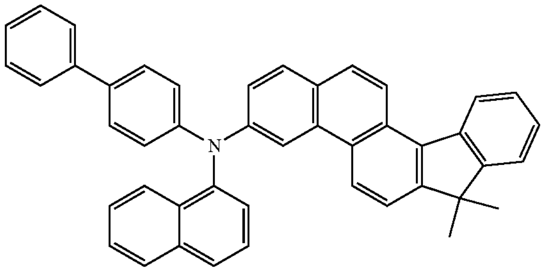
HT43
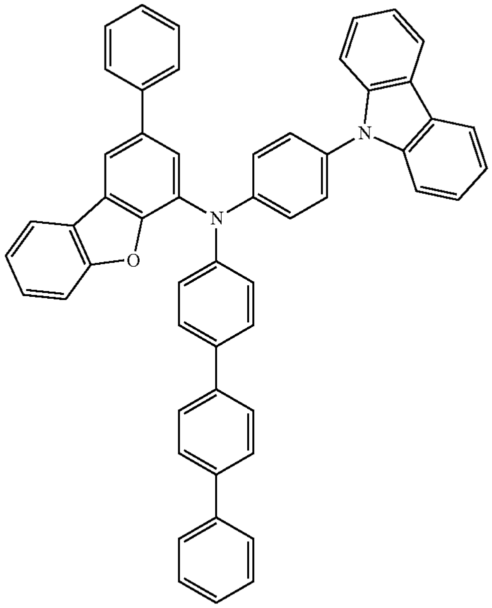
HT44
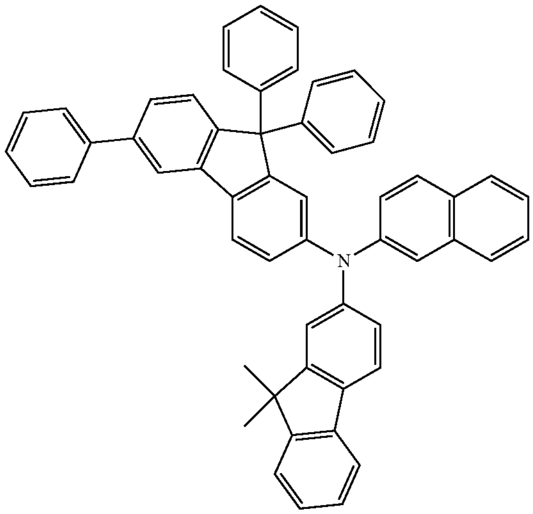
HT45
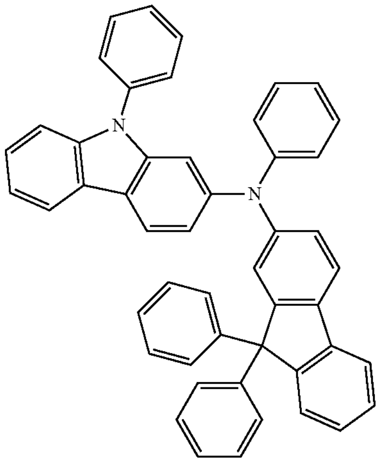

-continued
HT46
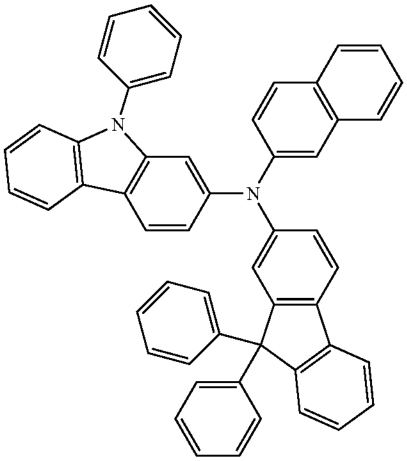
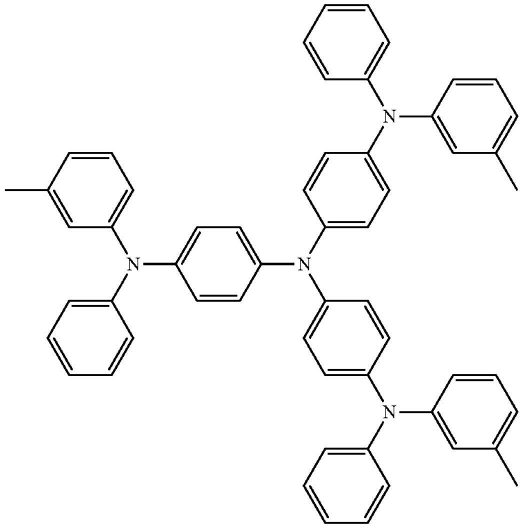
m-MTDATA
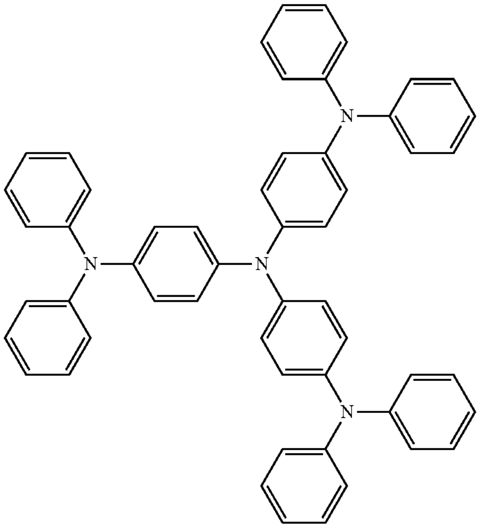
TDATA
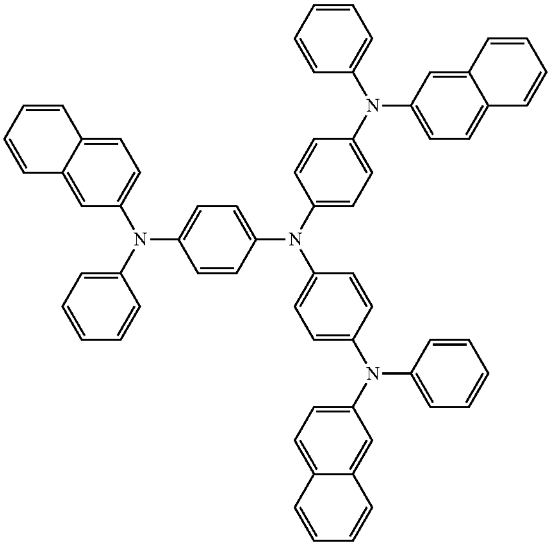
2-TNATA
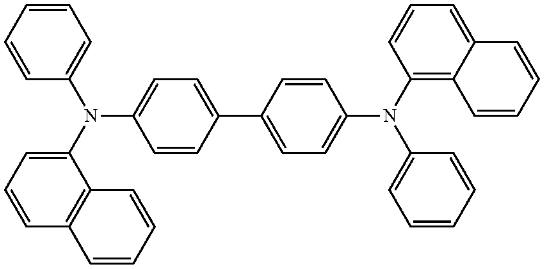
NPB
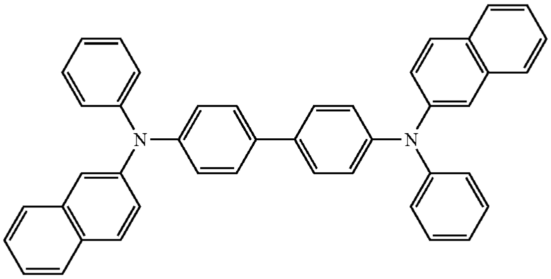
β-NPB -continued

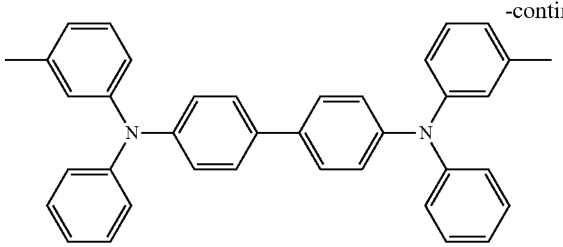

TPD

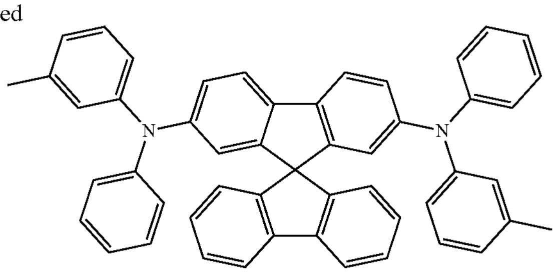

Spiro-TPD

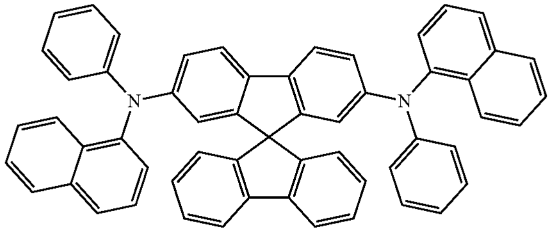

Spiro-NPB

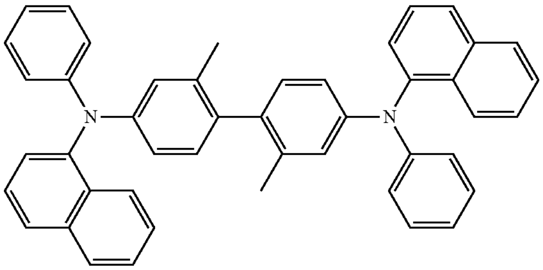

methylated-NPB

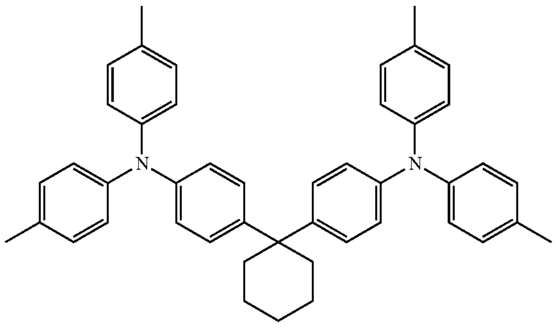

TAPC

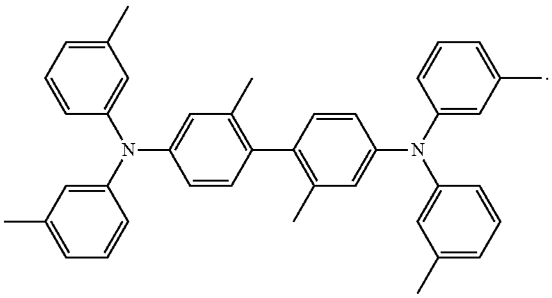

HMTPD

A thickness of the hole transport region may be in a range of about 50 Å to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory (suitable) hole transporting characteristics may be obtained without a substantial increase in driving voltage.

The emission auxiliary layer may increase light-emission efficiency by compensating for an optical resonance distance according to the wavelength of light emitted from the emission layer, and the electron blocking layer may block (reduce) the leakage of electrons from the emission layer to the hole transport region. Materials that may be included in the hole transport region may also be included in the emission auxiliary layer and the electron blocking layer.

p-Dopant

The hole transport region may further include, in addition to the foregoing materials, a charge-generation material for the improvement of conductive properties.

The charge-generation material may be substantially uniformly or non-uniformly dispersed in the hole transport region (for example, in the form of a single layer including (e.g., consisting of) a charge-generation material).

The charge-generation material may be, for example, a p-dopant.

For example, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and/or element EL2, or one or more combinations thereof.

Examples of the quinone derivative are TCNQ, F4-TCNQ, etc.

Examples of the cyano group-containing compound are HAT-CN, and/or a compound represented by Formula 221 below

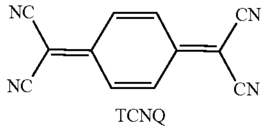

TCNQ

-continued

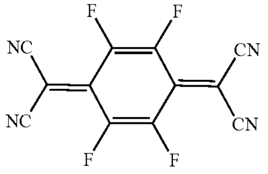

F4-TCNQ

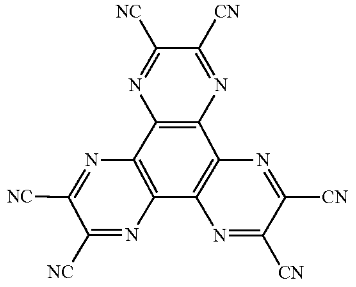

HAT-CN

Formula 221

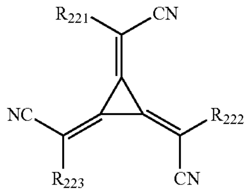

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or one or more combinations thereof.

In the compound including element EL1 and element EL2, element EL1 may be metal, metalloid, or a combination thereof, and element EL2 may be non-metal, metalloid, or a combination thereof.

Examples of the metal are an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid are silicon (Si), antimony (Sb), and tellurium (Te).

Examples of the non-metal are oxygen (O) and halogen (for example, F, Cl, Br, I, etc.).

Examples of the compound including element EL1 and element EL2 are metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or one or more combinations thereof.

Examples of the metal oxide are tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and/or rhenium oxide (for example, $ReO_3$, etc.).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Examples of the transition metal halide are titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, Hf $F_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and/or gold halide (for example, AuF, AuCl, AuBr, AuI, etc.).

Examples of the post-transition metal halide are zinc halide (for example, $ZnF_2$, $ZnCl_2$, $ZnBr_2$, $ZnI_2$, etc.), indium halide (for example, $InI_3$, etc.), and/or tin halide (for example, $SnI_2$, etc.).

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

An example of the metalloid halide is antimony halide (for example, $SbCl_5$, etc.).

Examples of the metal telluride are alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and/or lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other to emit white light. In one or more embodiments, the emission layer may include two or more materials selected from a red light-emitting material, a green light-emitting material, and a blue light-emitting material, in which the two or more materials are mixed with each other in a single layer to emit white light.

The emission layer may include; a host and a dopant; or a quantum dot. The dopant may include a phosphorescent dopant, a fluorescence dopant, or a combination thereof.

The amount of the dopant in the emission layer may be from about 0.01 part by weight to about 15 parts by weight based on 100 parts by weight of the host.

In one or more embodiments, the emission layer may include a delayed fluorescence material. The delayed fluorescence material may act as a host or a dopant in the emission layer.

least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ are each the same as described herein with respect to $Q_1$.

For example, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or a combination thereof:

Formula 301-1

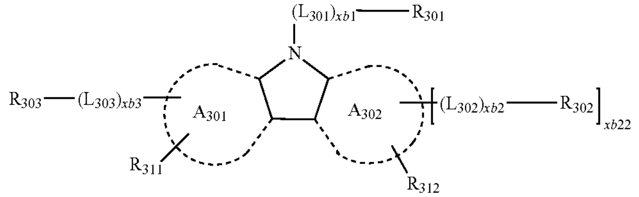

Formula 301-2

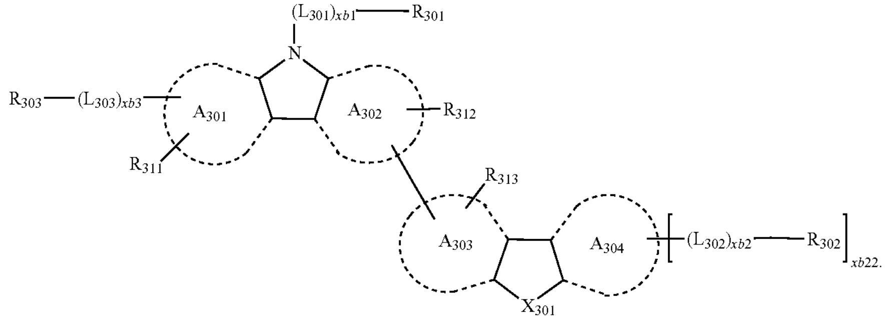

A thickness of the emission layer may be in a range of about 100 Å to about 1,000 Å, for example, about 200 Å to about 600 Å. When the thickness of the emission layer is within the foregoing ranges, excellent (suitable) light-emission characteristics may be obtained without a substantial increase in driving voltage.

Host

In one or more embodiments, the host may include a compound represented by Formula 301 below:

$$[Ar_{301}]_{xb11}\text{-}[(L_{301})_{xb1}\text{-}R_{301}]_{xb21} \qquad \text{Formula 301}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described herein with respect to with $L_{301}$, xb2 to xb4 may each independently be the same as described herein with respect to xb1, and $R_{302}$ to $R_{305}$ and $R_{311}$ to $R_{314}$ may each be the same as described herein with respect to $R_{301}$.

In one or more embodiments, the host may include an alkali earth metal complex, a post-transition metal complex, or a combination thereof. For example, the host may include a Be complex (for example, Compound H55), an Mg complex, a Zn complex, or one or more combinations thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or one or more combinations thereof:

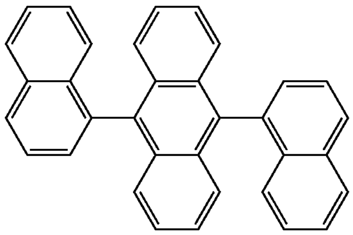
H1

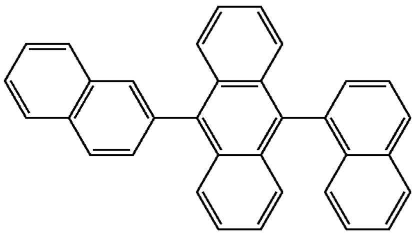
H2

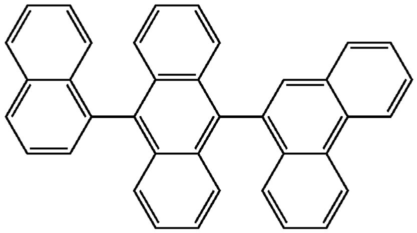
H3

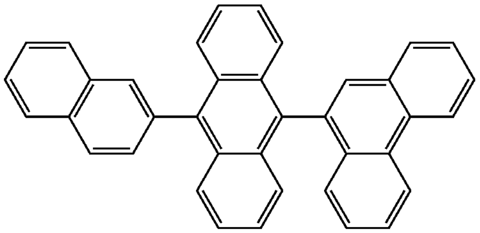
H4

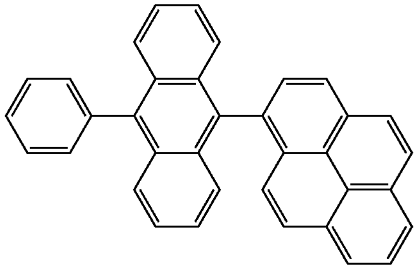
H5

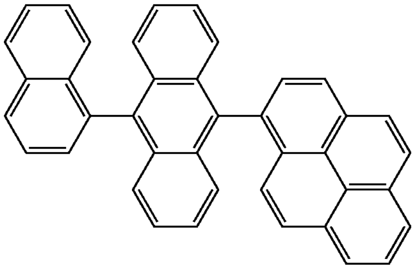
H6

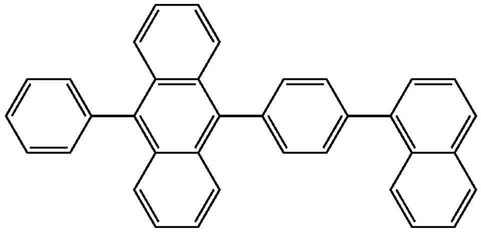
H7

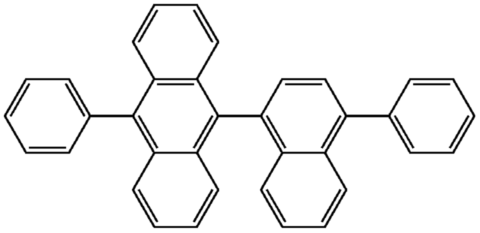
H8

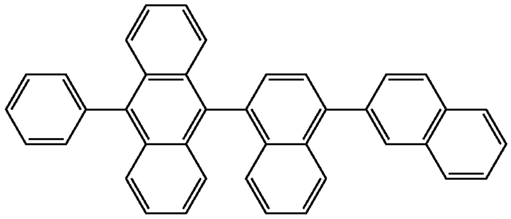
H9

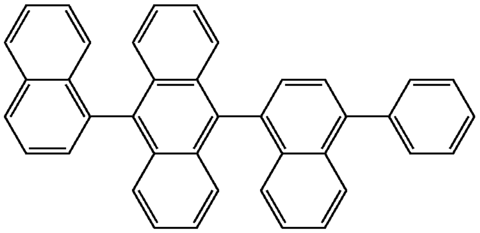
H10

-continued
H11
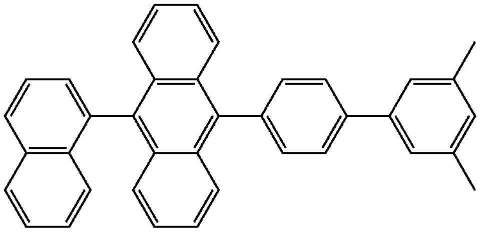
H12
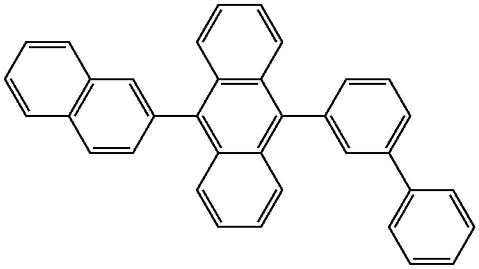
H13
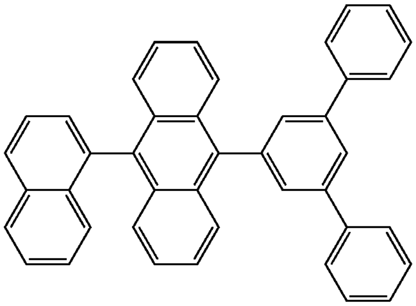
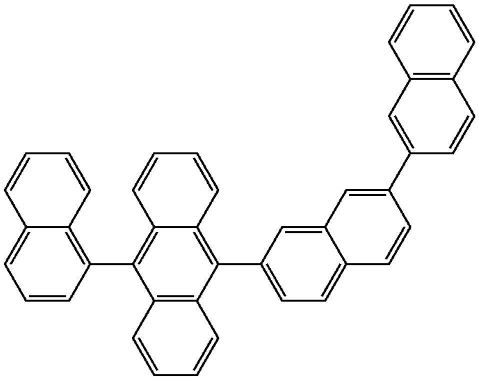
H15
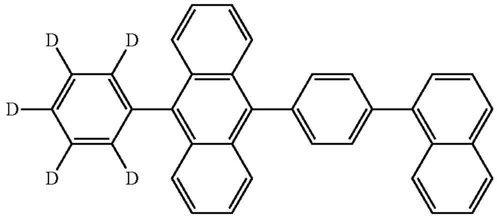
H16
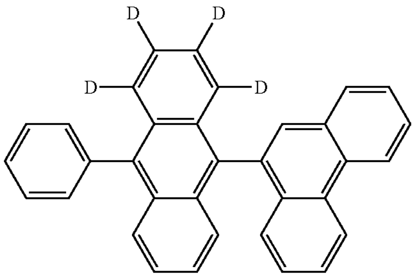
H17
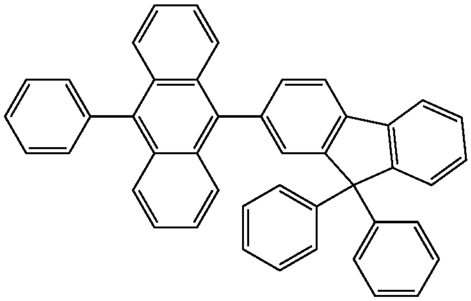
H18
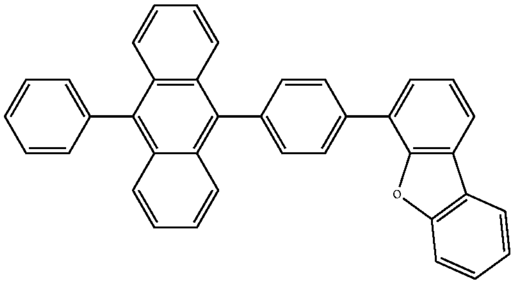
H19
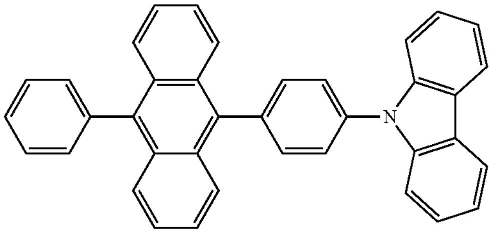
H20
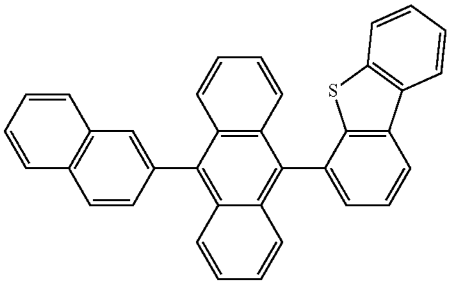

-continued
H21
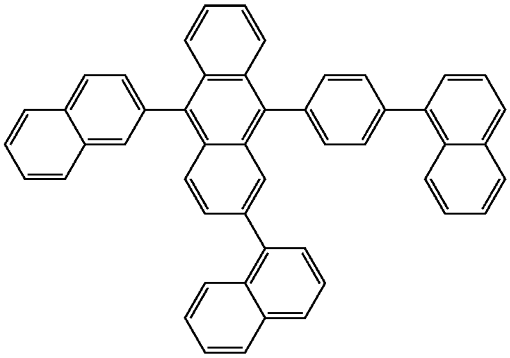
H22
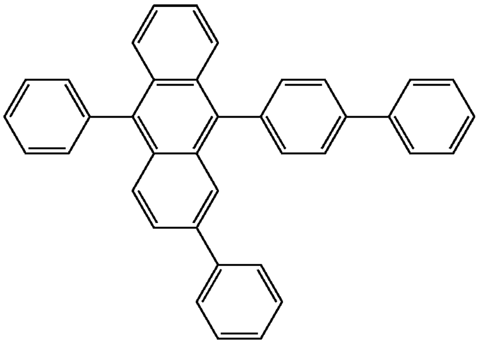
H23
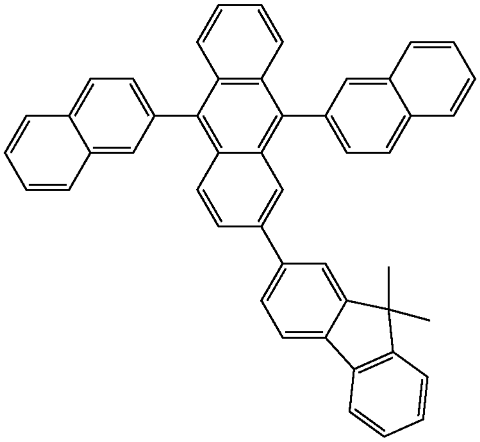
H27
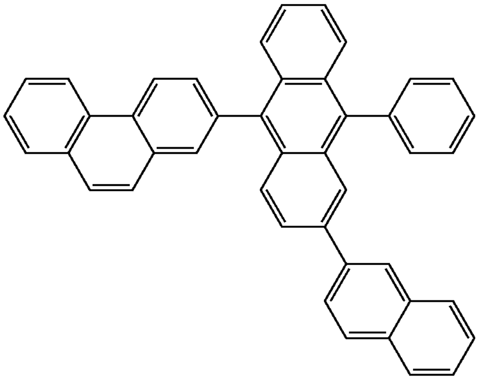
H25
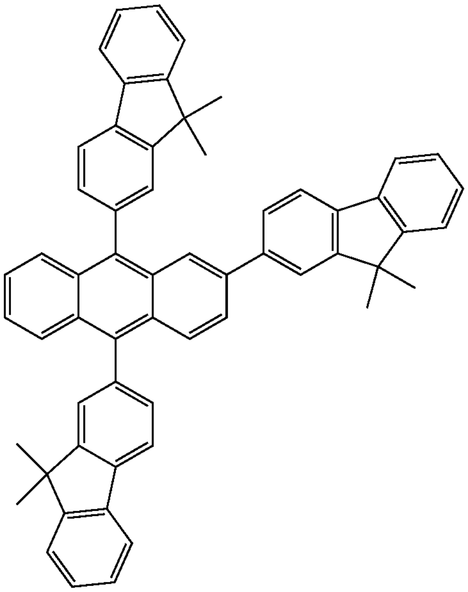
H26
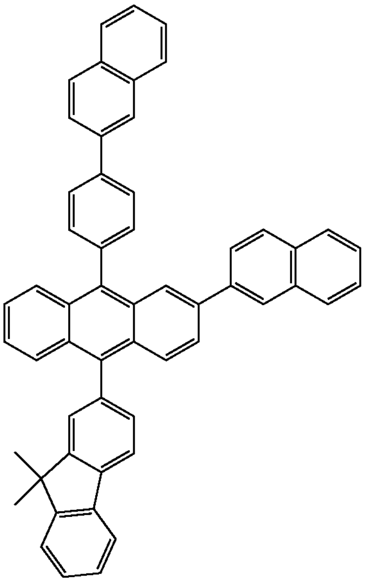

-continued
H27
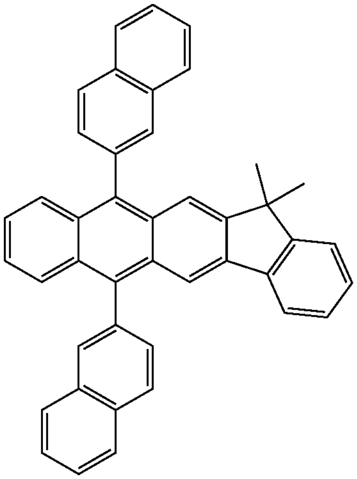
H28
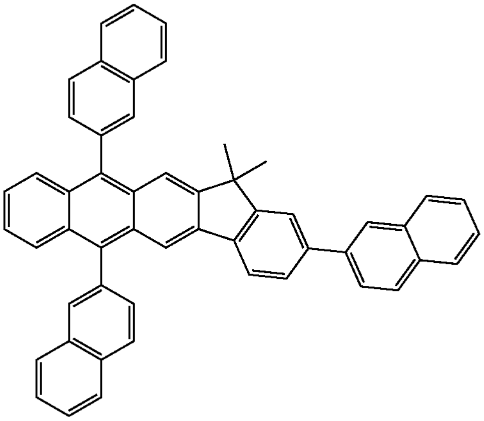
H29
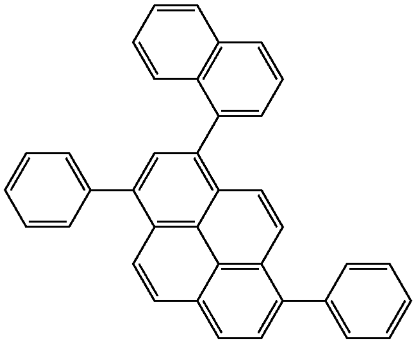
H30
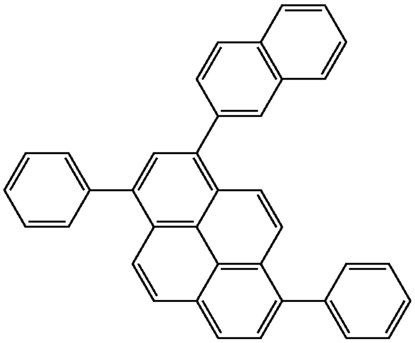
H31
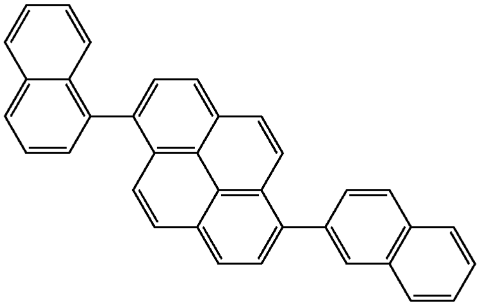
H32
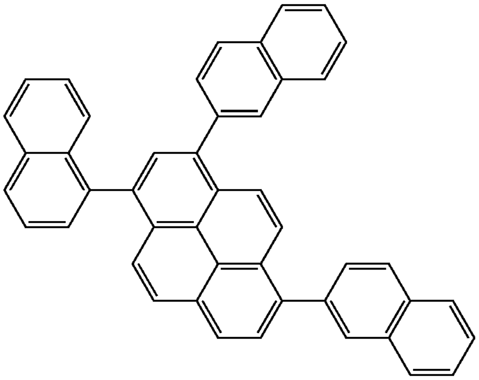
H33
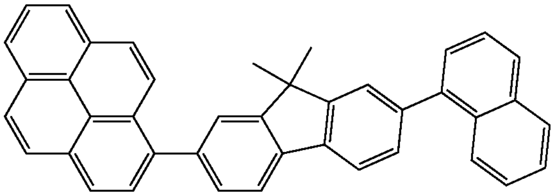

-continued
H34
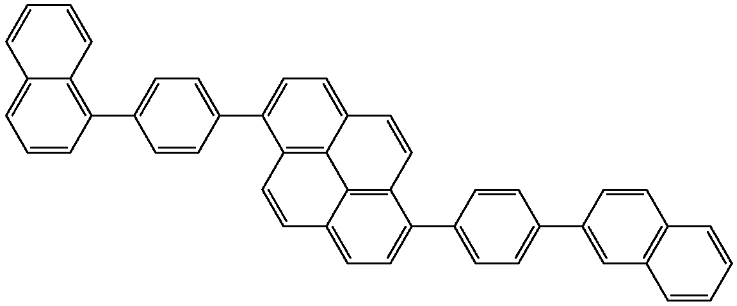
H35
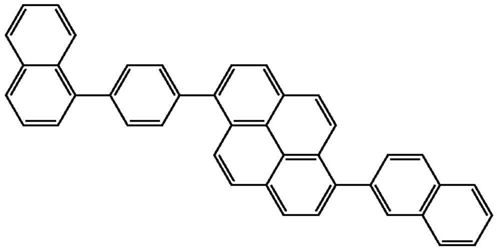
H36
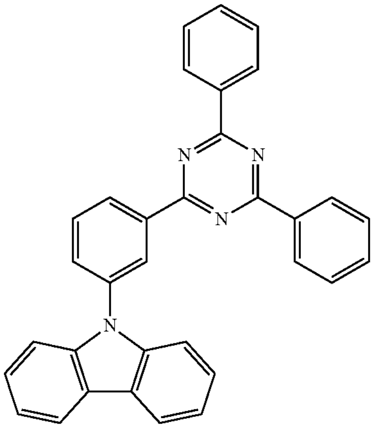
H37
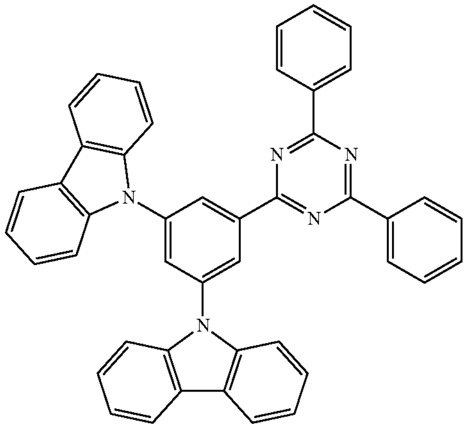
H38
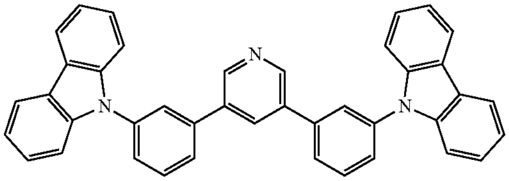

-continued
H39
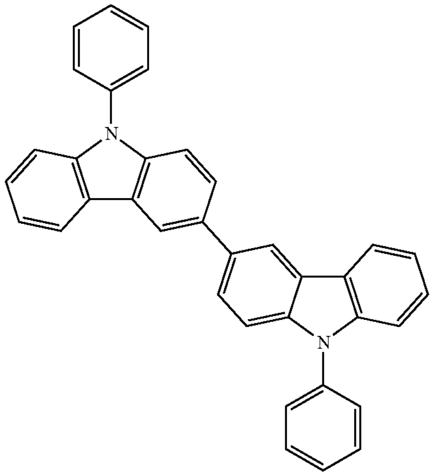
H40
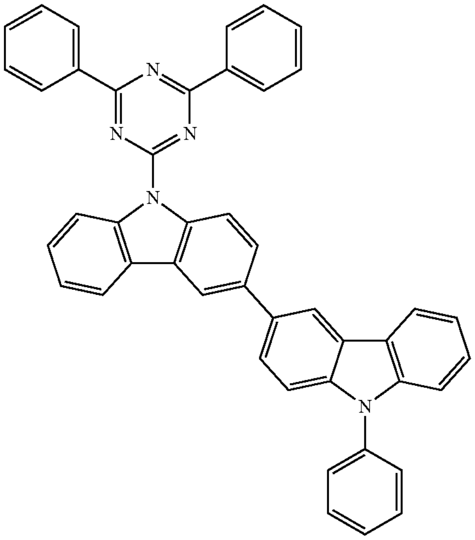
H41
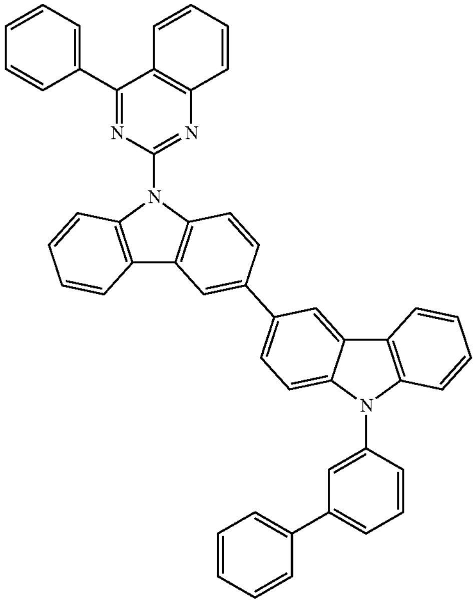
H42
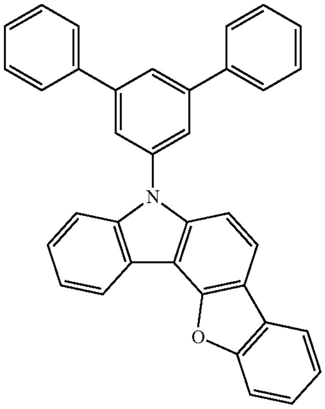
H43
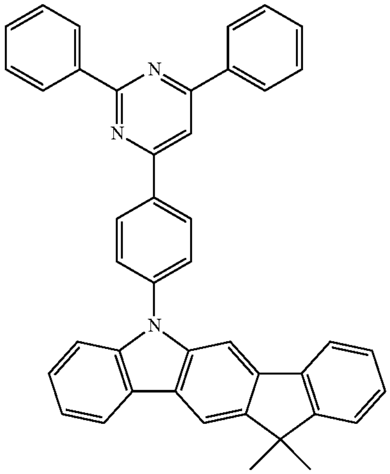
H44
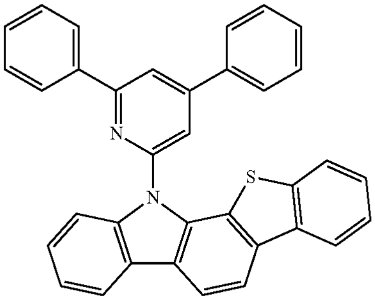

-continued
H45
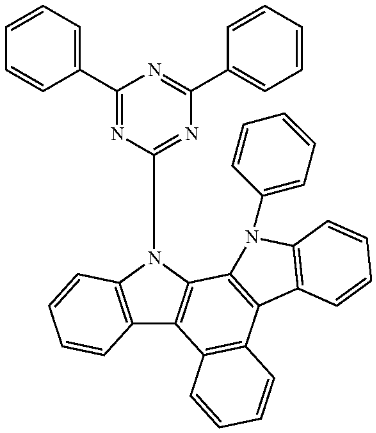
H46
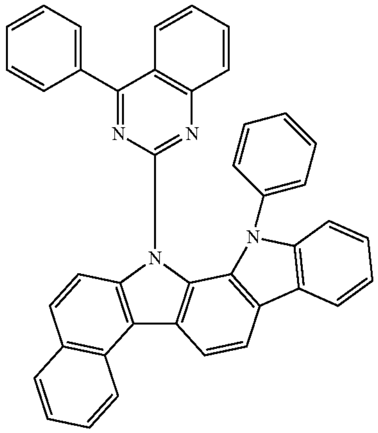
H47
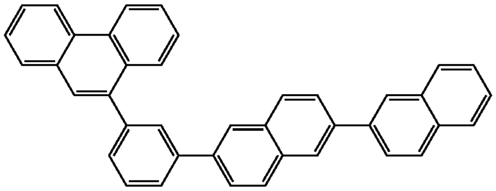
H48
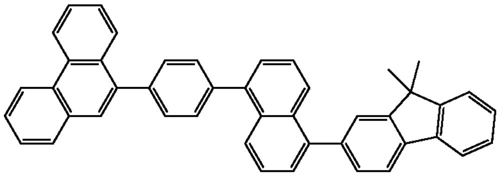
H49
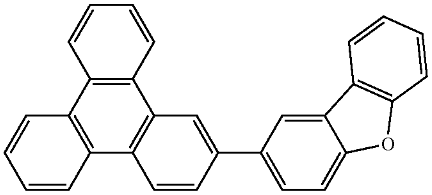
H50
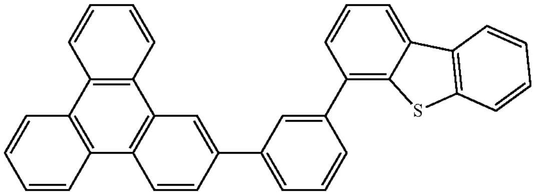
H51
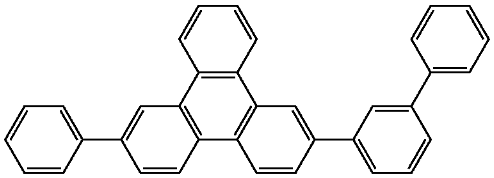
H52
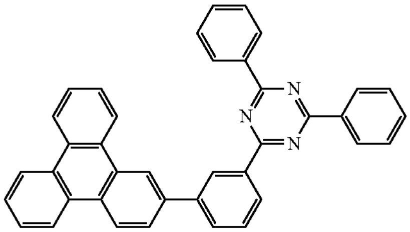
H53
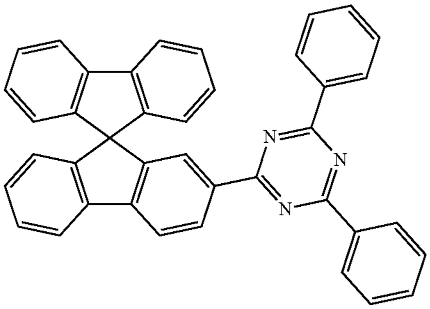
H54
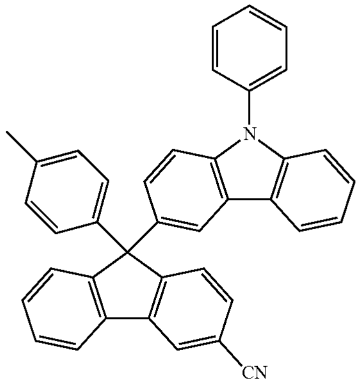

-continued
H55
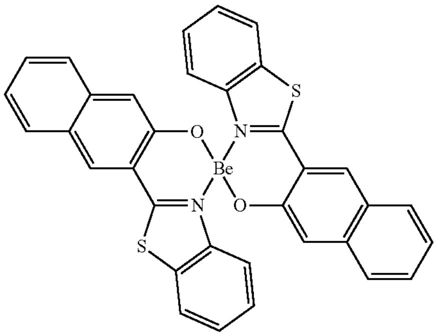
H56
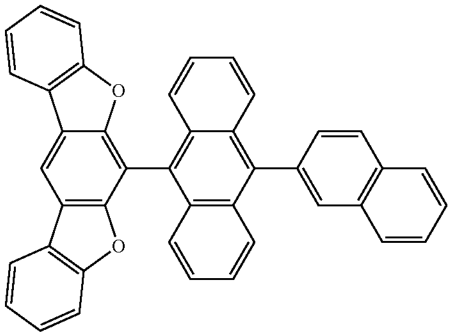
H57
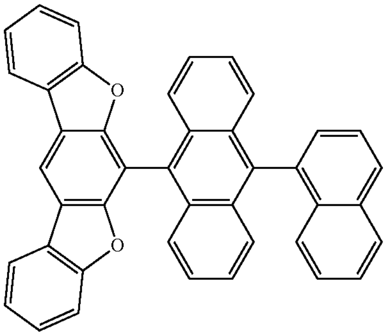
H58
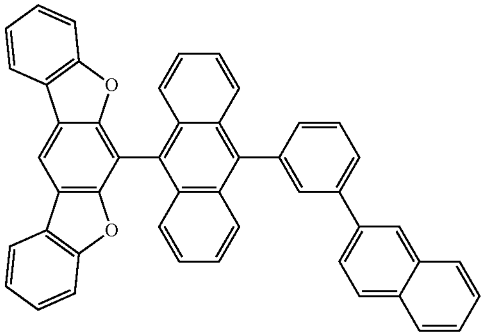
H59
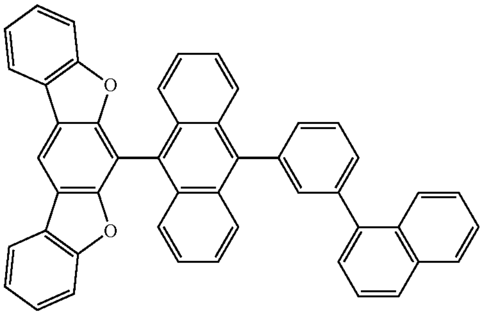
H60
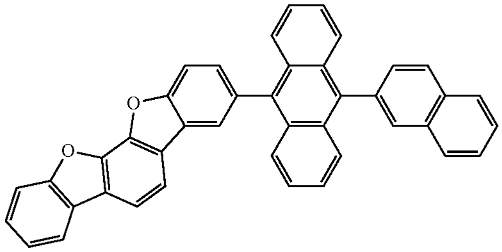
H61
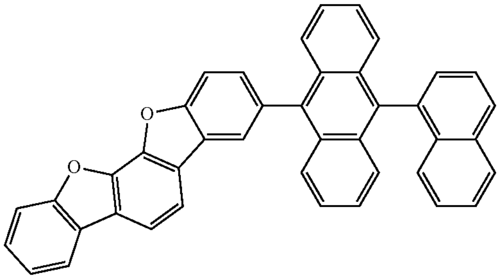
H62
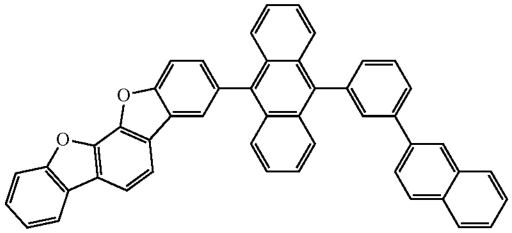
H63
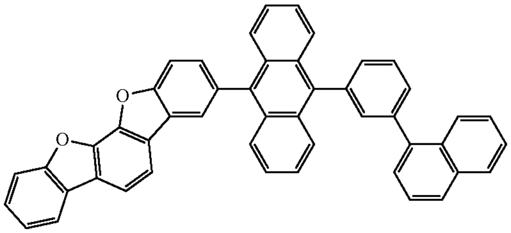
H64
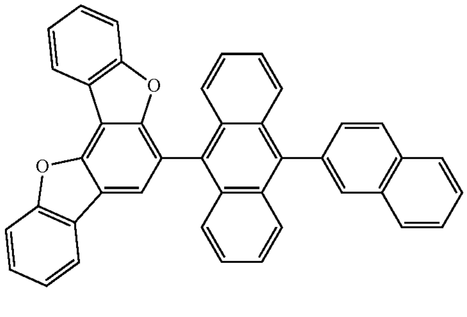

-continued
H65
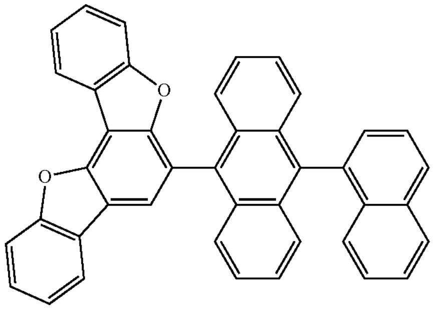
H66
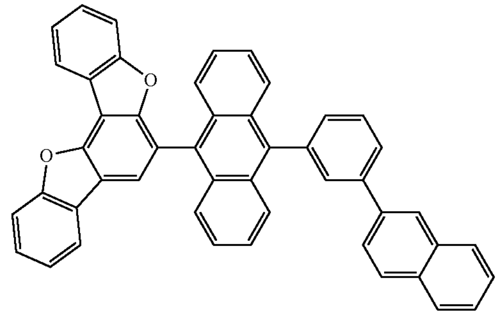
H67
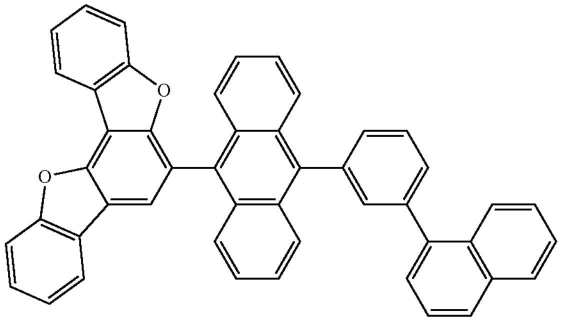
H68
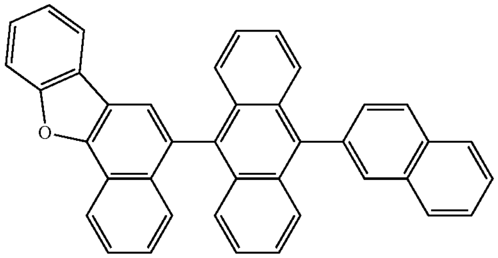
H69
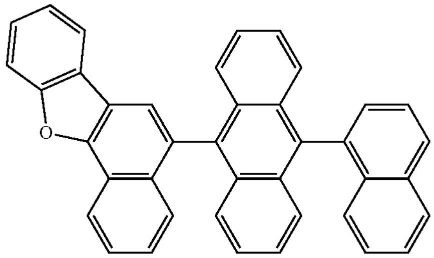
H70
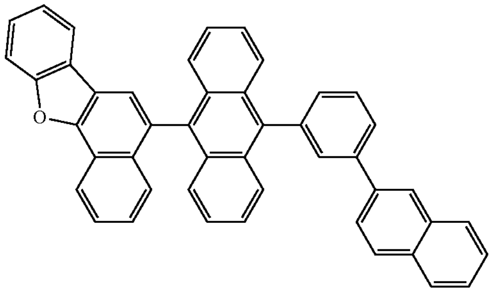
H71
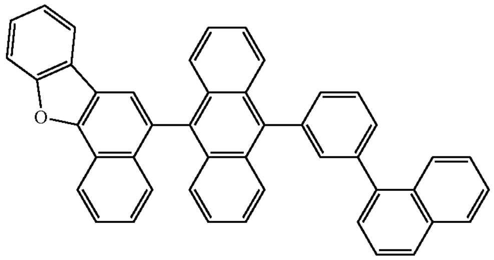
H72
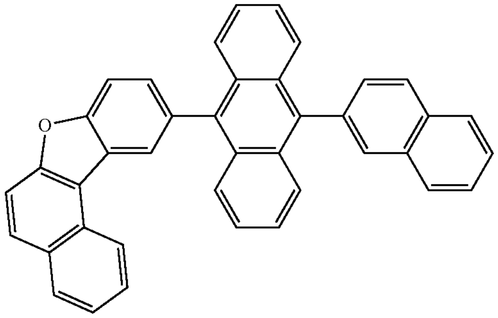
H73
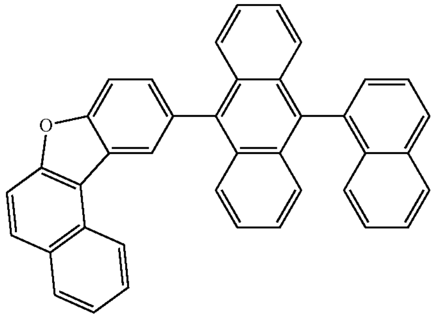

-continued
H74
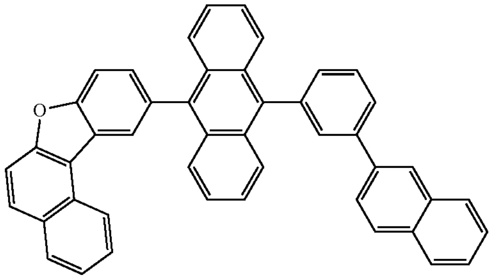
H75
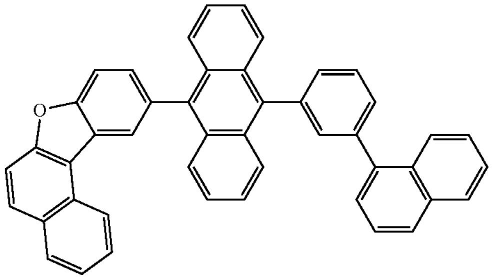
H76
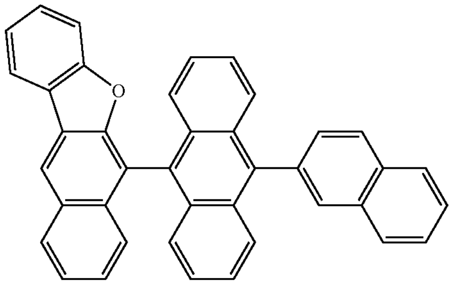
H77
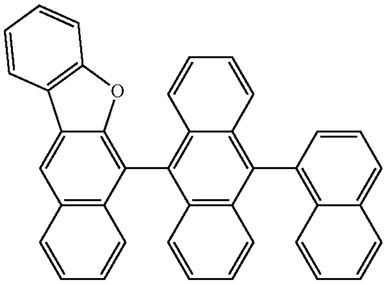
H78
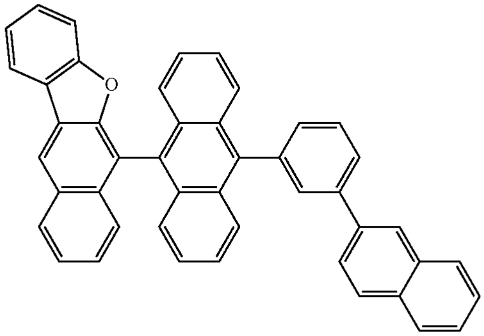
H79
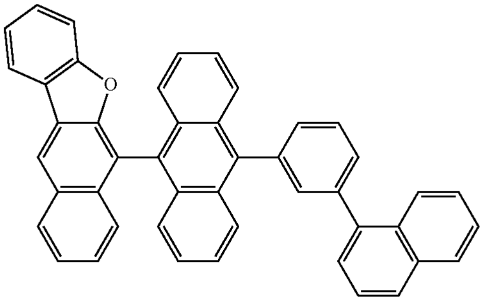
H80
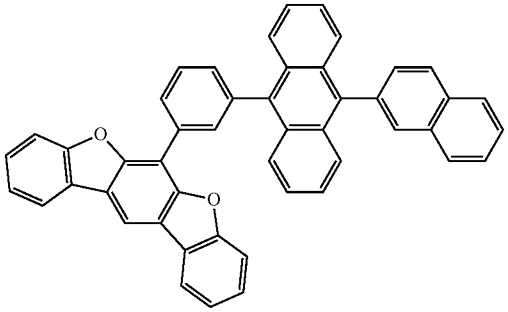
H81
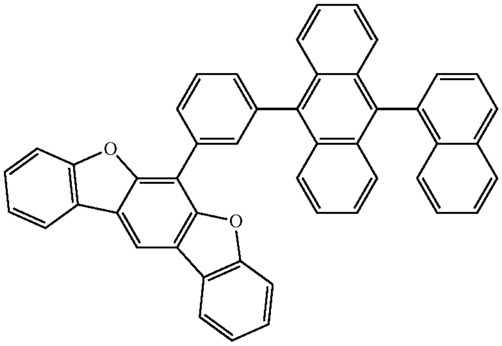
H82
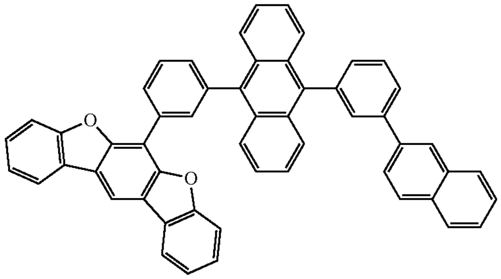
H83
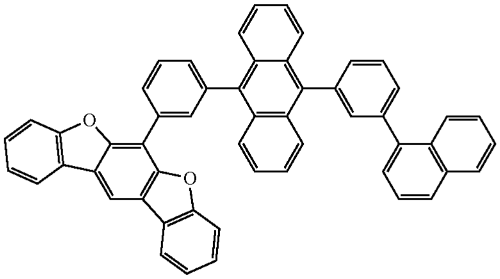

-continued
H84
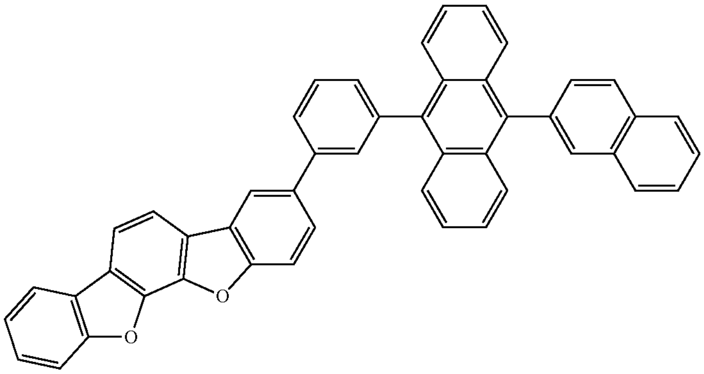
H85
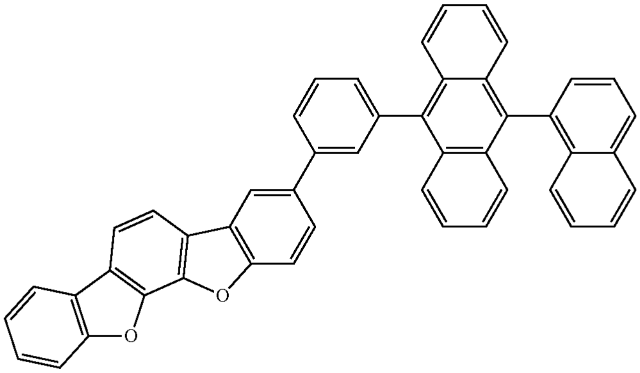
H86
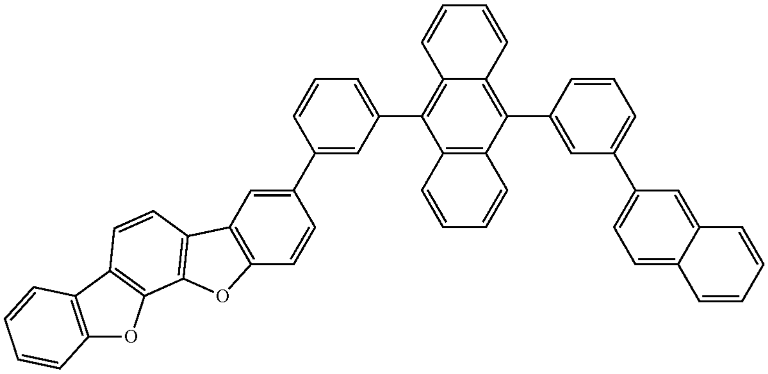
H87
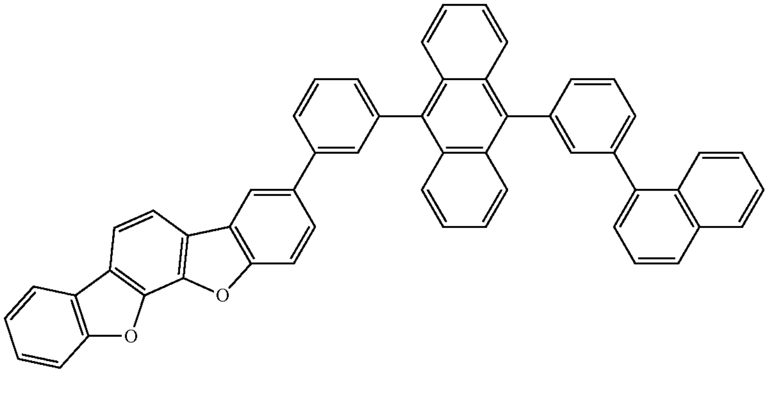

-continued
H88
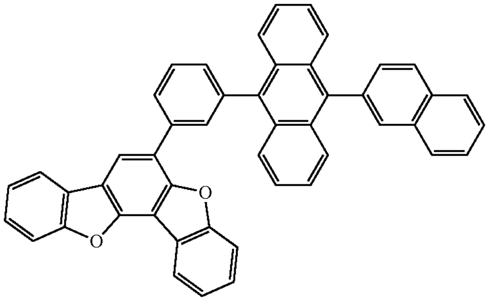
H89
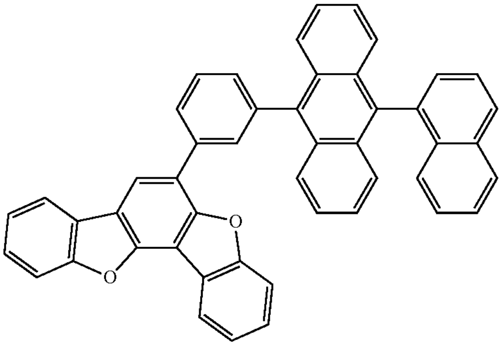
H90
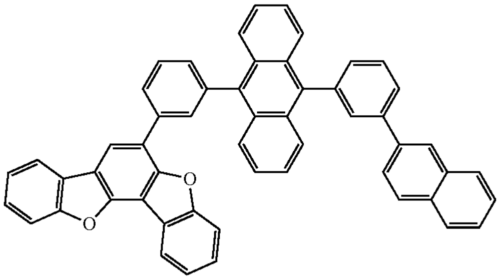
H91
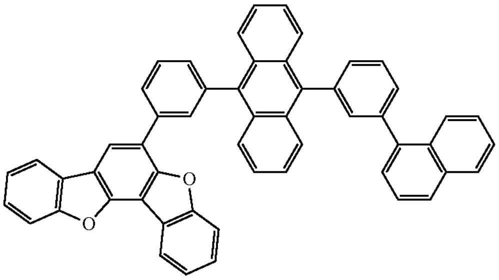
H92
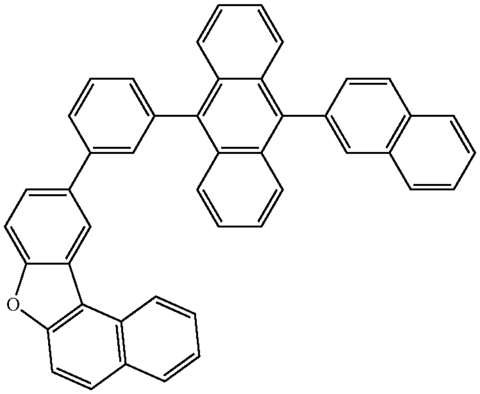
H93
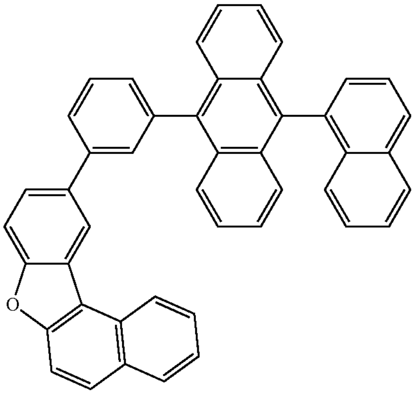
H94
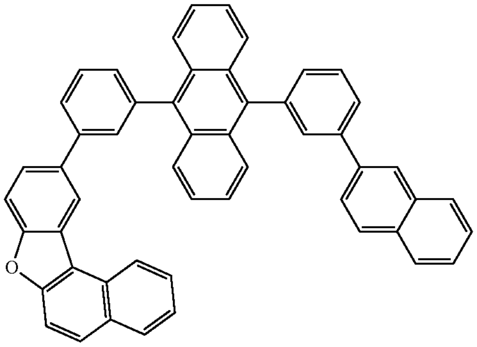
H95
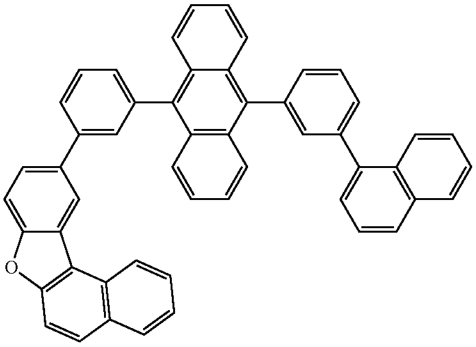

-continued
H96
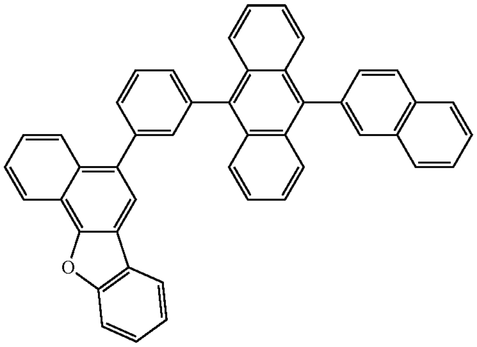
H97
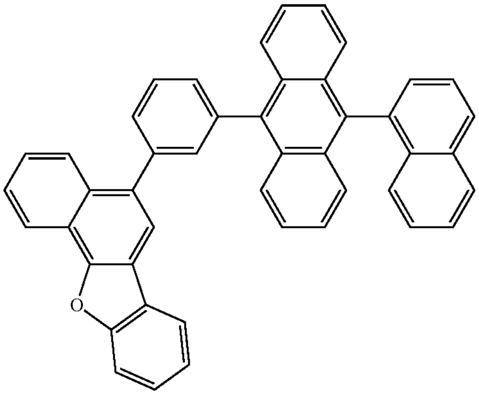
H98
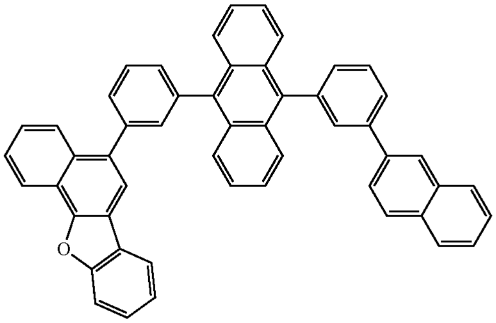
H99
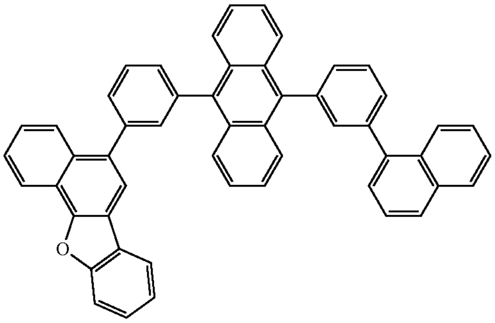
H100
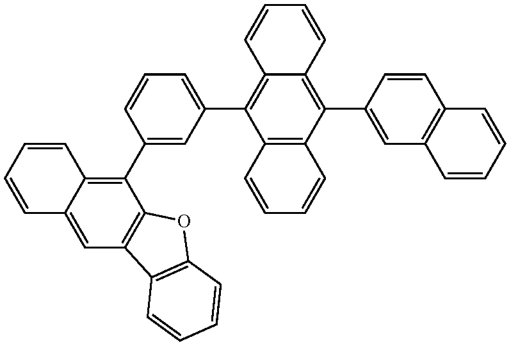
H101
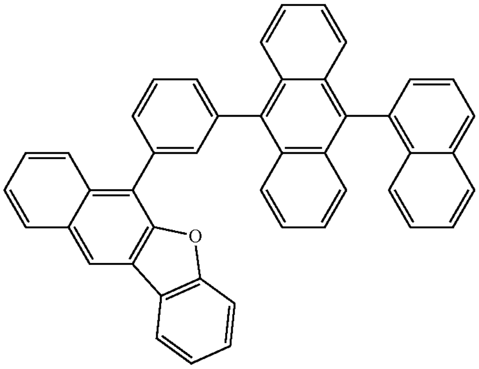
H102
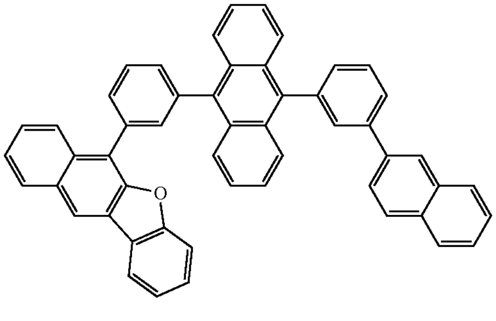
H103
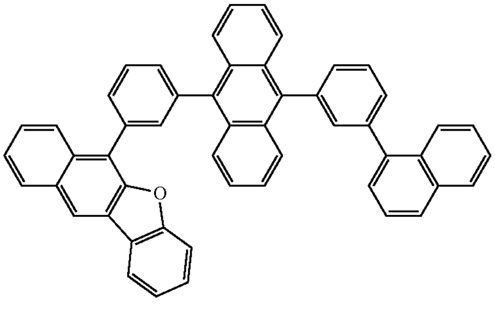

-continued
H104
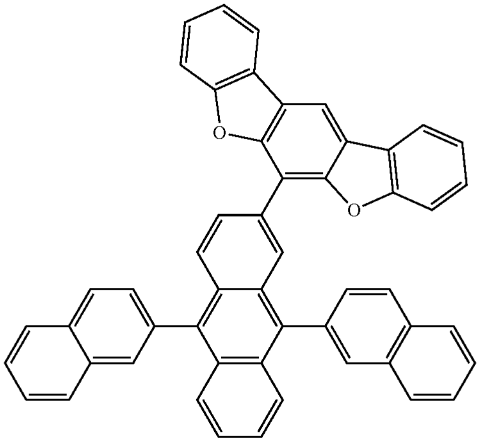
H105
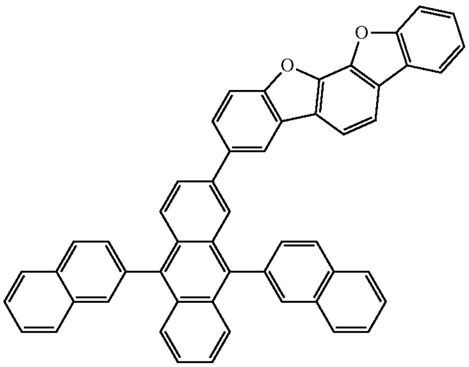
H106
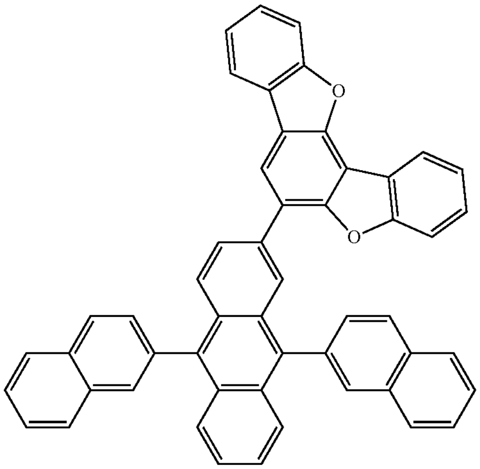
H107
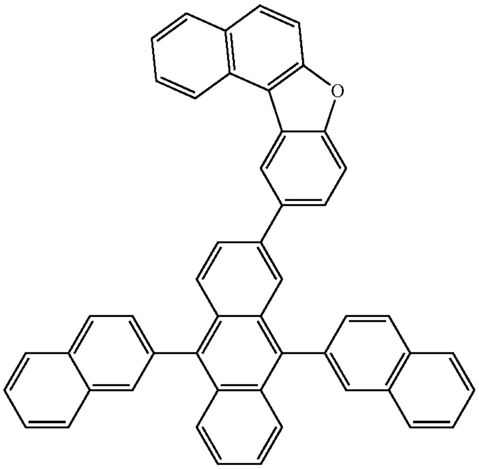
H108
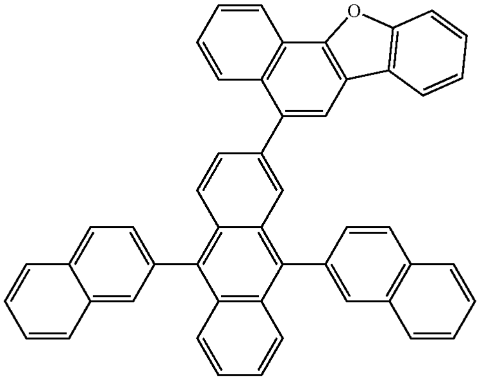
H109
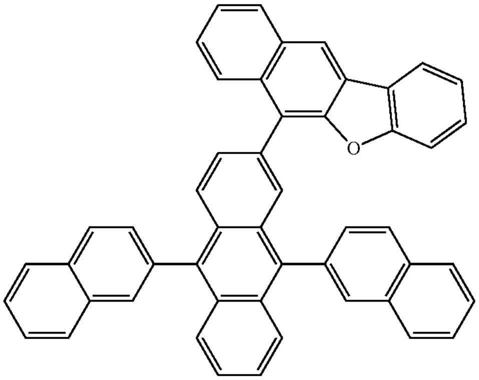
H110
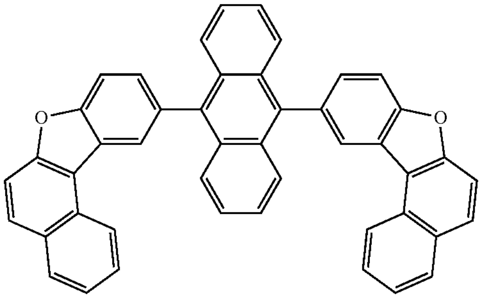
H111
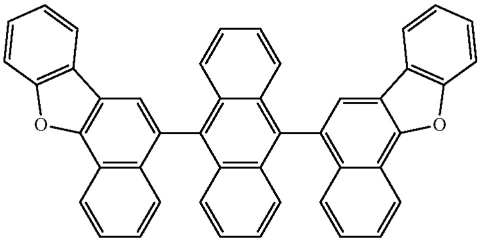

-continued
H112
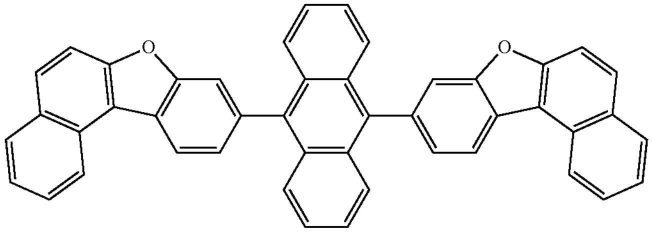
H113
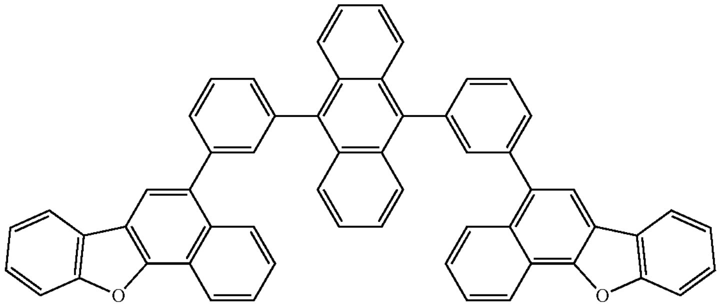
H114
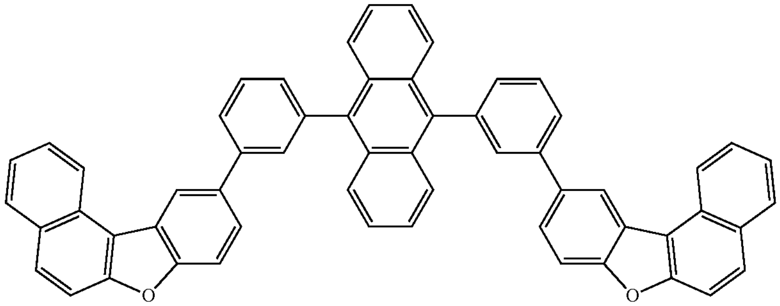
H115
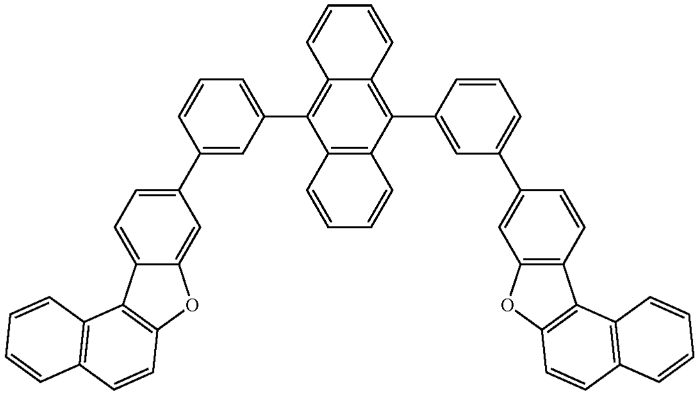

-continued
H116
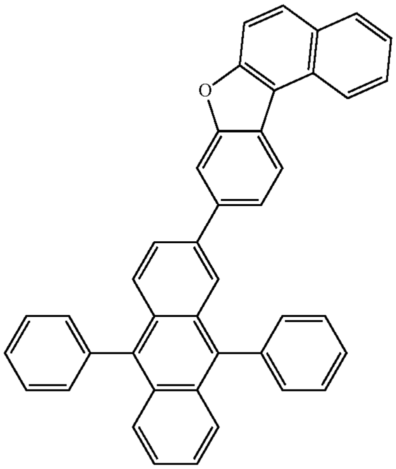
H117
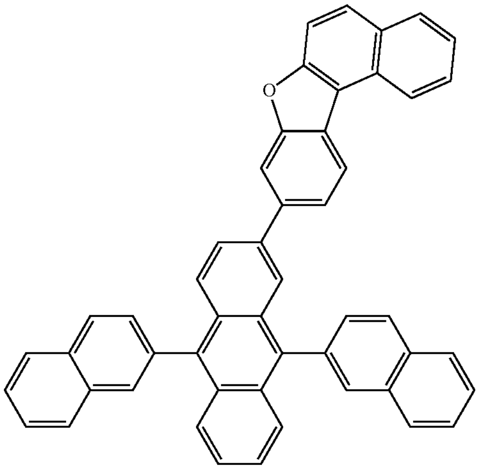
H118
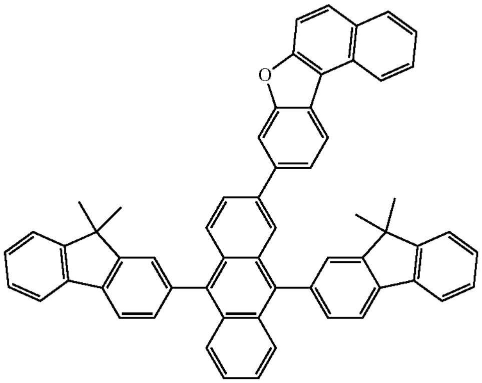
H119
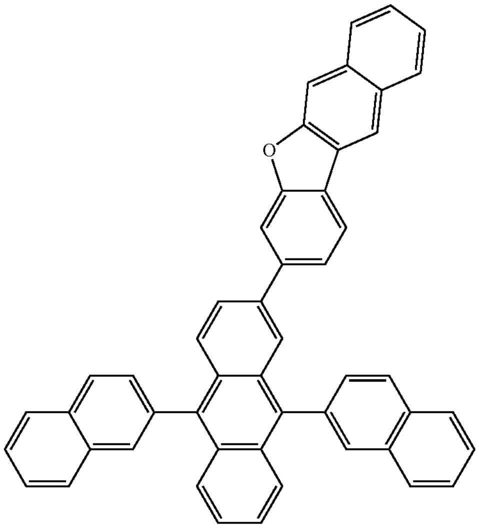
H120
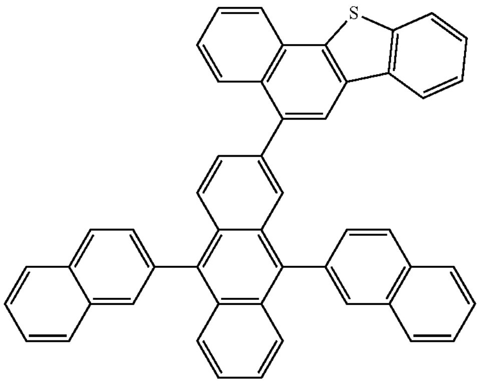
H121
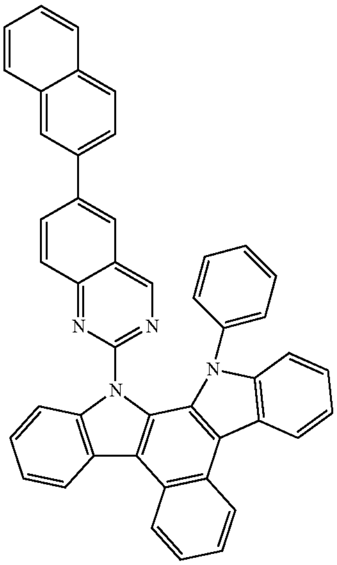

-continued

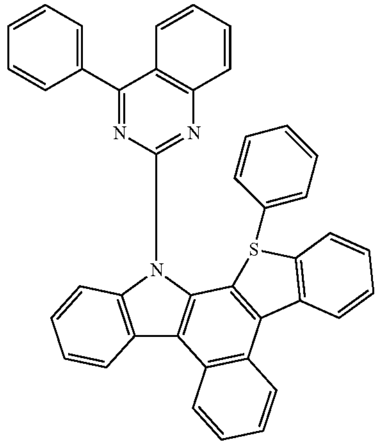

H122

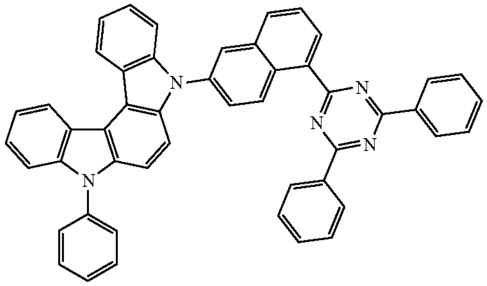

H123

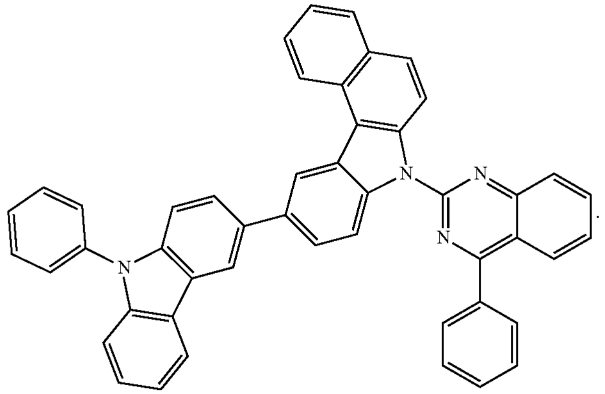

H124

Phosphorescent Dopant

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or one or more combinations thereof.

The phosphorescent dopant may be electrically neutral.

For example, the phosphorescent dopant may include an organometallic compound represented by Formula 401:

$$M(L_{401})_{xc1}(L_{402})_{xc2}$$ Formula 401

Formula 402

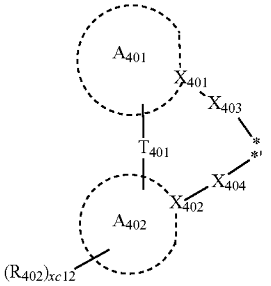

wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(═O)—, —N($Q_{411}$)-, —C($Q_{411}$)($Q_{412}$)-, —C($Q_{411}$)═C($Q_{412}$)-, —C($Q_{411}$)═, or ═C═, $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described herein with respect to $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ may each be the same as described herein with respect to $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more of $L_{401}$(s) may be optionally linked to each other via $T_{402}$, which is a linking group, and two ring $A_{402}$(s) may be optionally linked to each other via $T_{403}$, which is a linking group (see Compounds PD1 to PD4 and PD7). $T_{402}$ and $T_{403}$ may each be the same as described herein with respect to $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or one or more combinations thereof.

The phosphorescent dopant may include, for example, one of compounds PD1 to PD39, or one or more combinations thereof:

PD1

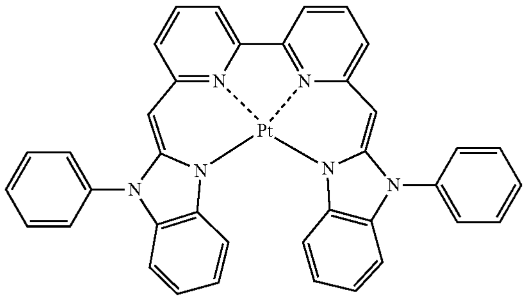

PD2

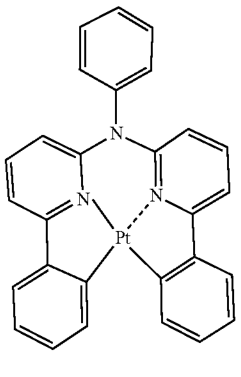

-continued

PD3

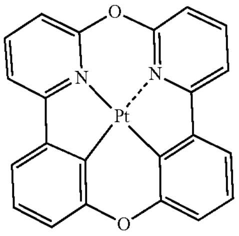

PD4

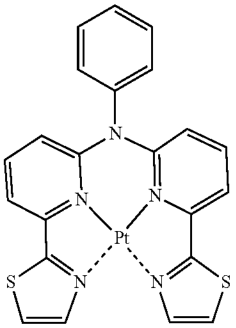

PD5

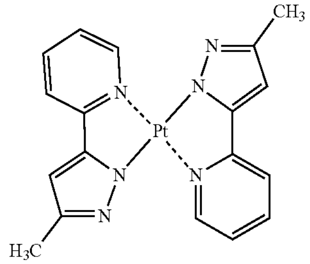

PD6

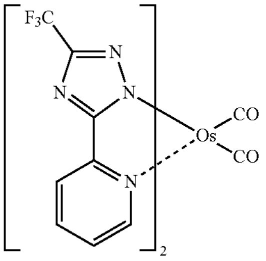

PD7

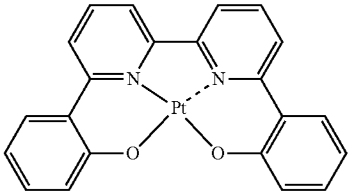

PD8

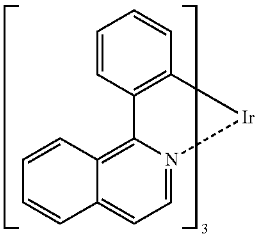

-continued
PD9
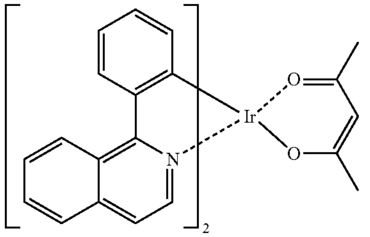
PD10
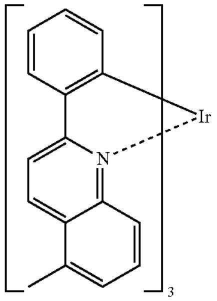
PD11
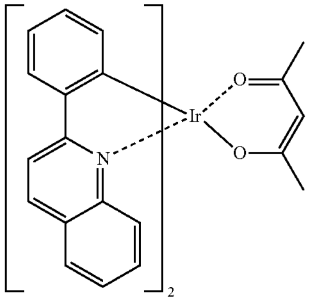
PD12
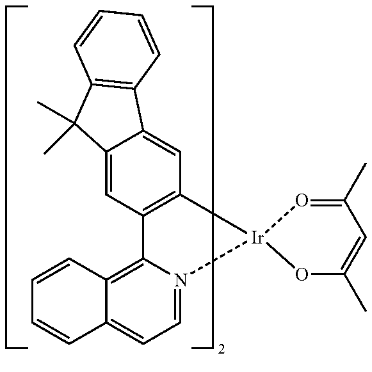
PD13
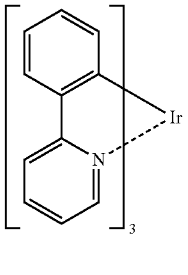
-continued
PD14
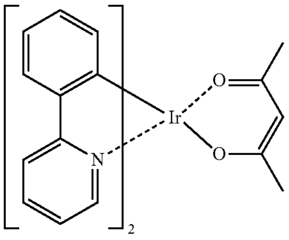
PD15
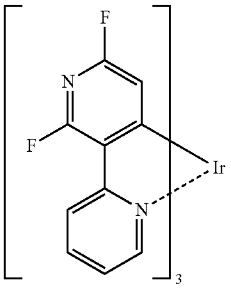
PD16
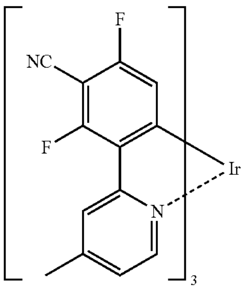
PD17
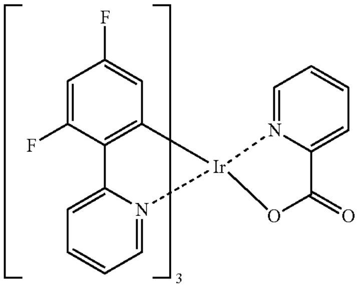
PD18
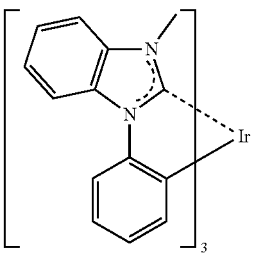

-continued
PD19
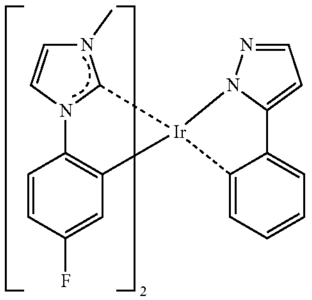
PD20
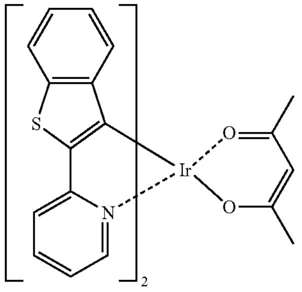
PD21
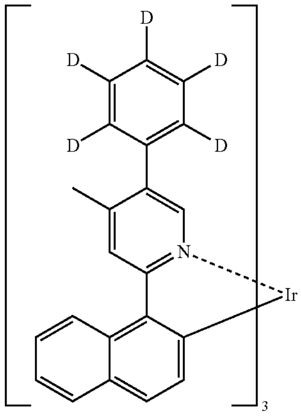
PD22
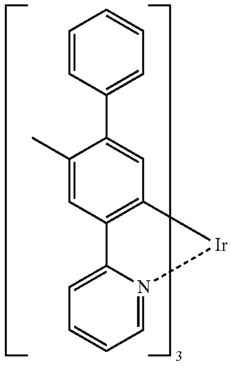
-continued
PD23
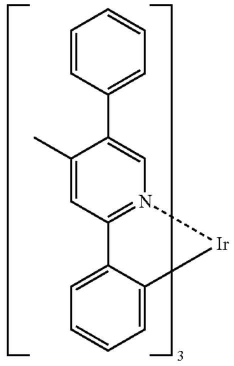
PD24
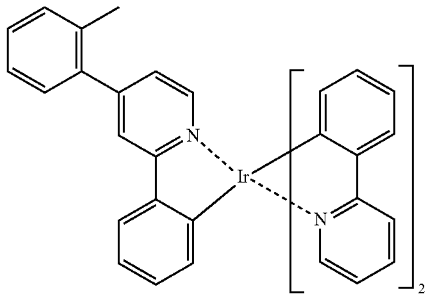
PD25
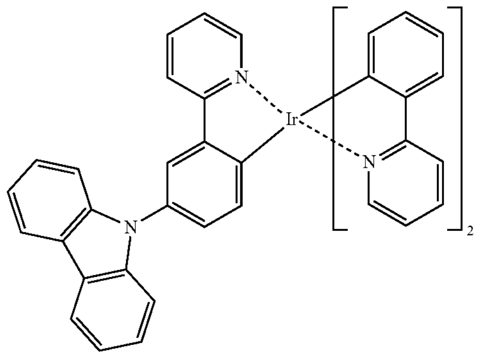
PD26
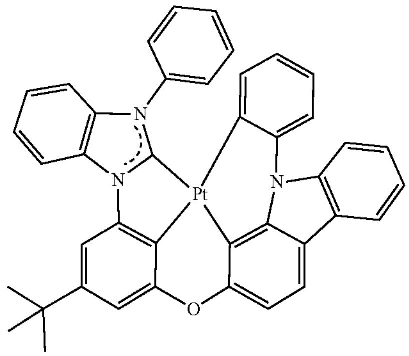

-continued
PD27
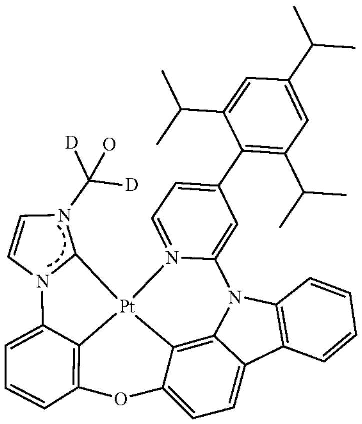
PD28
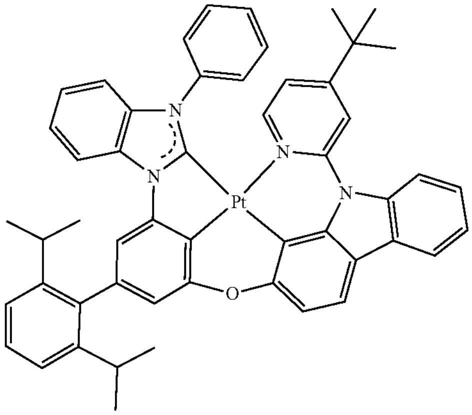
PD29
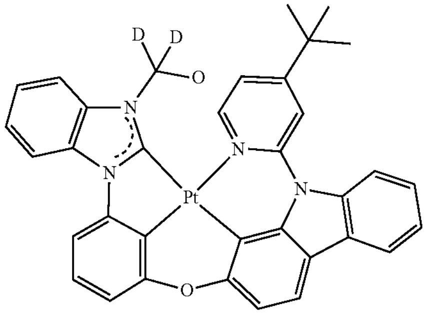
PD30
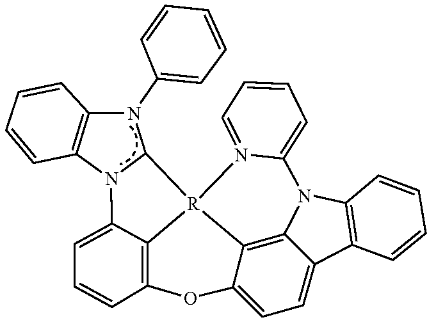
-continued
PD31
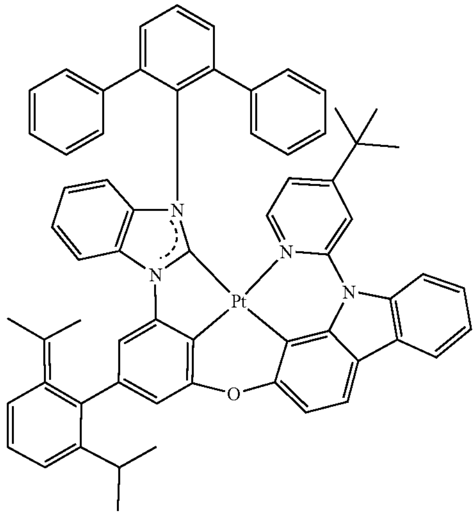
PD32
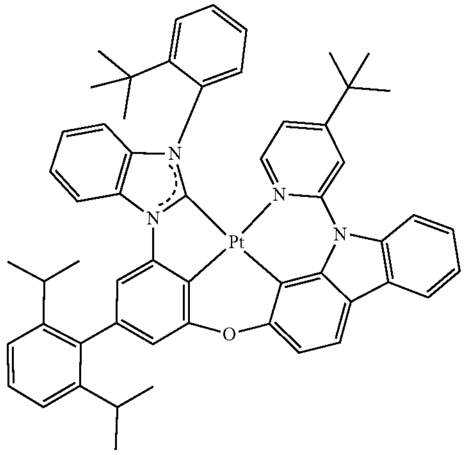
PD33
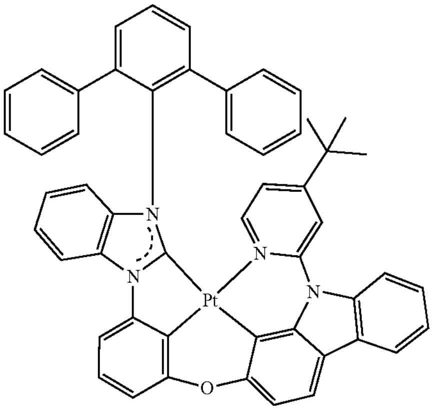

-continued
PD34
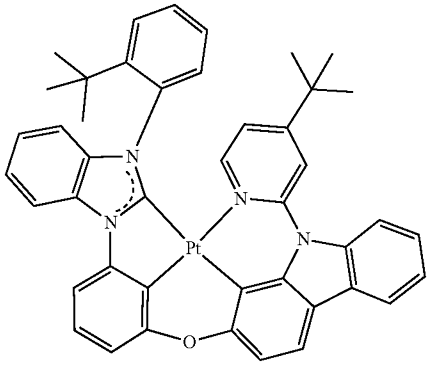
PD35
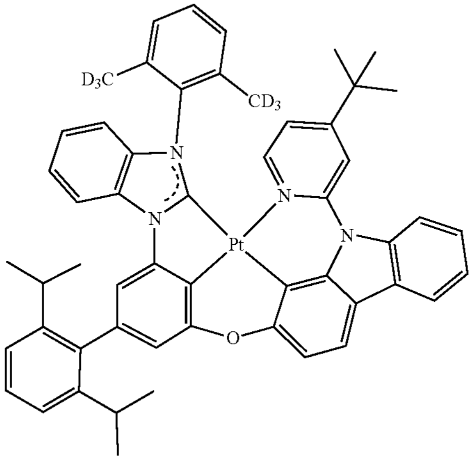
PD36
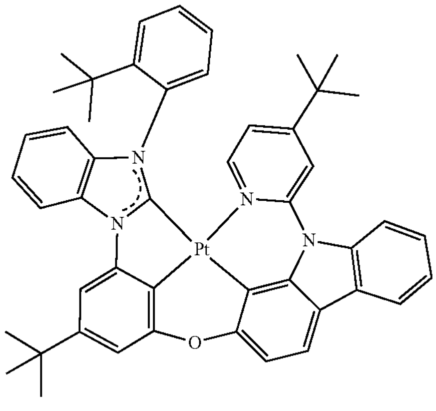
-continued
PD37
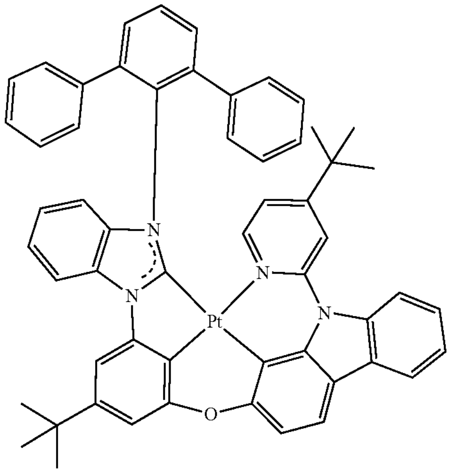
PD38
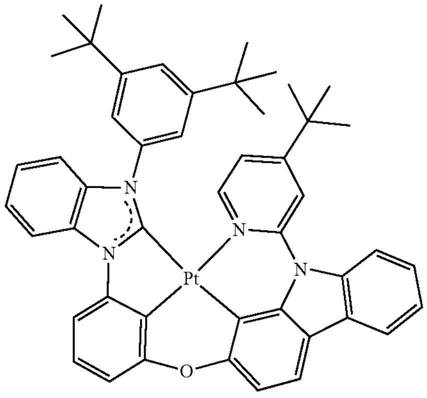
PD39
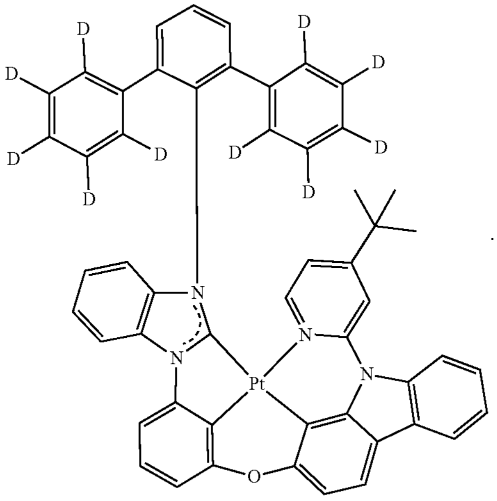
.
Fluorescence Dopant
The fluorescence dopant may include an amine group-containing compound, a styryl group-containing compound, or a combination thereof.
For example, the fluorescence dopant may include a compound represented by Formula 501:

Formula 501

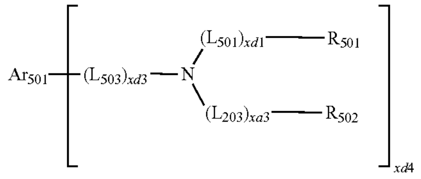

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

For example, the fluorescence dopant may include: at least one of Compounds FD1 to FD36; DPVBi; DPAVBi; or one or more combinations thereof:

FD1

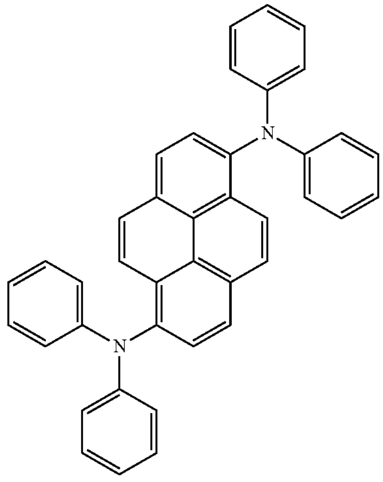

FD2

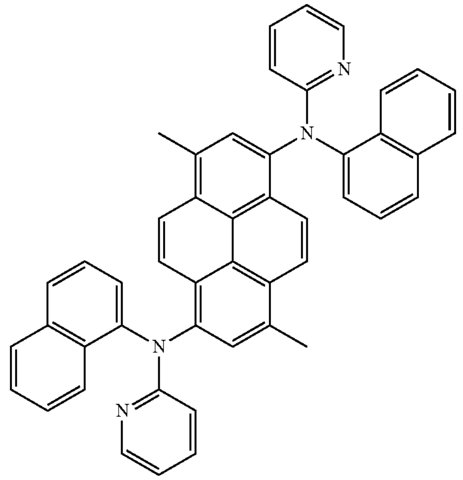

FD3

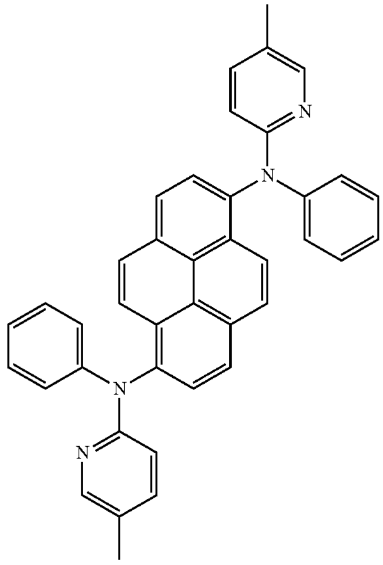

FD4

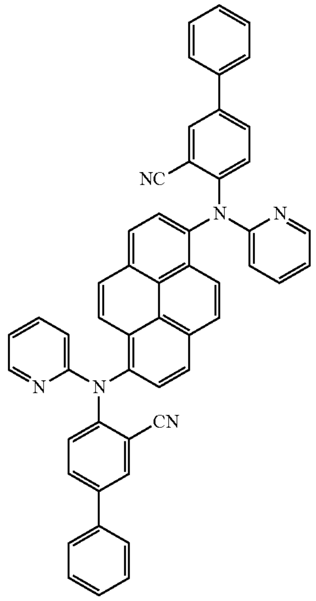

-continued
FD5
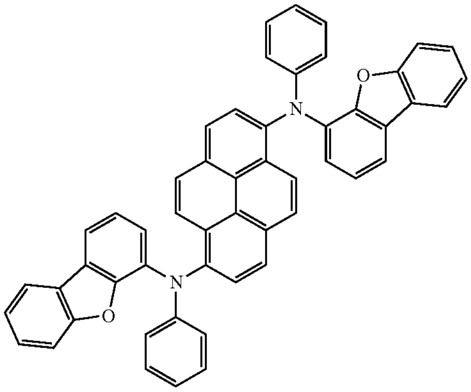
FD6
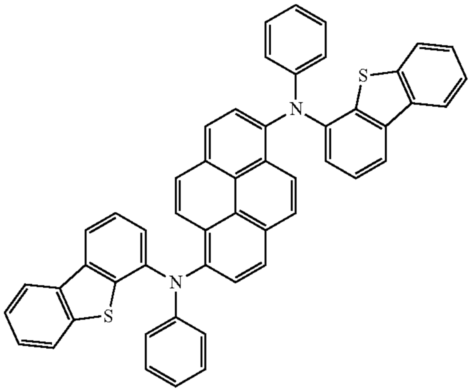
FD7
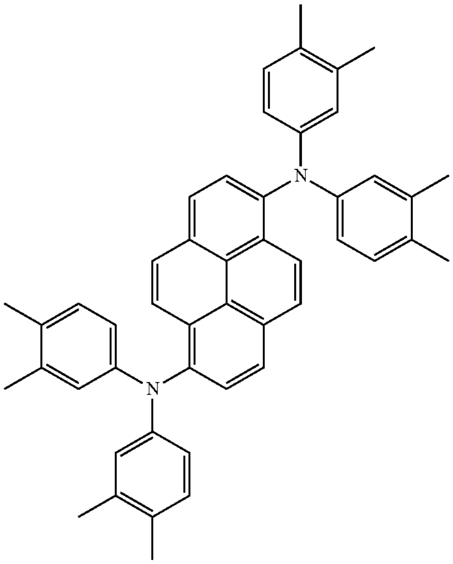
FD8
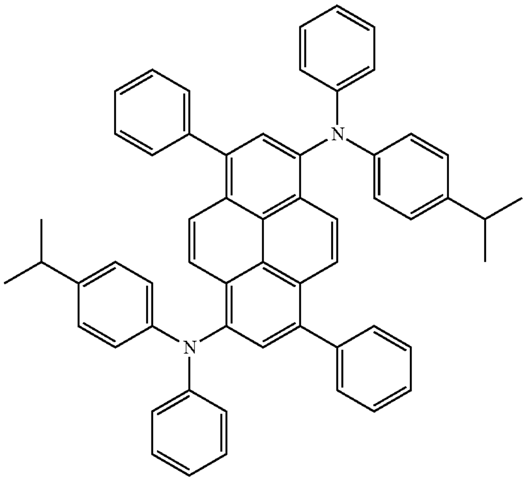
FD9
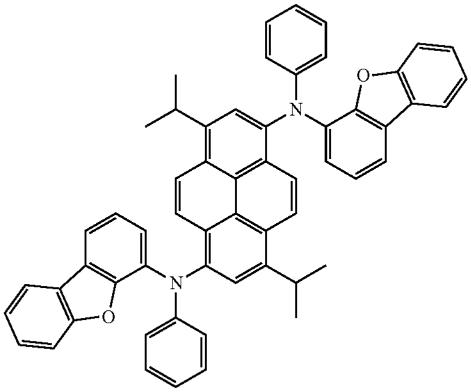
FD10
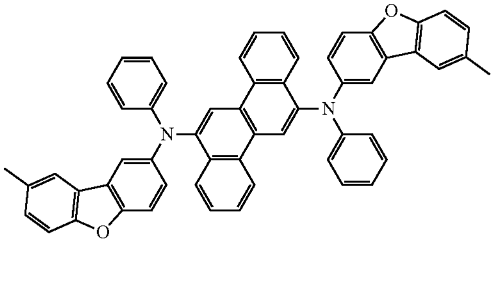

-continued
FD11
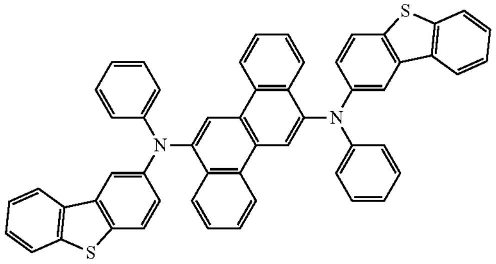
FD12
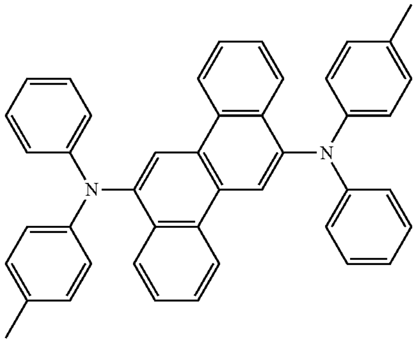
FD13
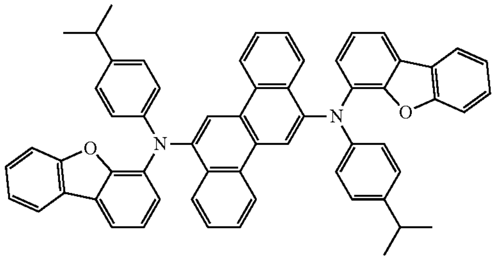
FD14
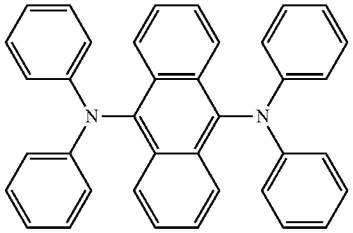
FD15
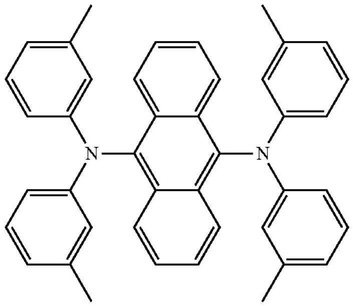
FD16
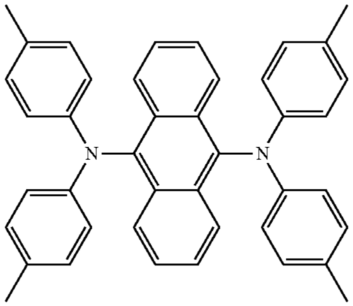
FD17
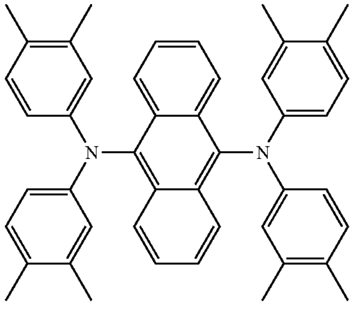
FD18
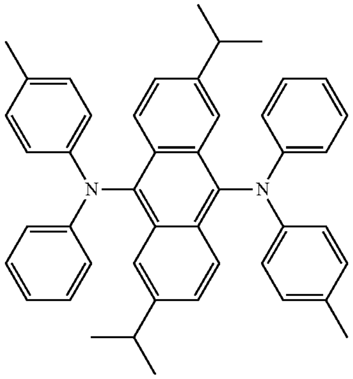

-continued
FD19
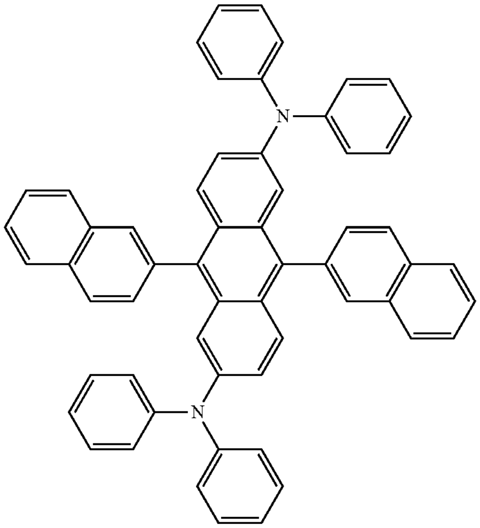
FD20
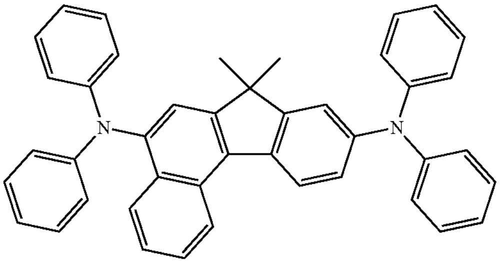
FD21
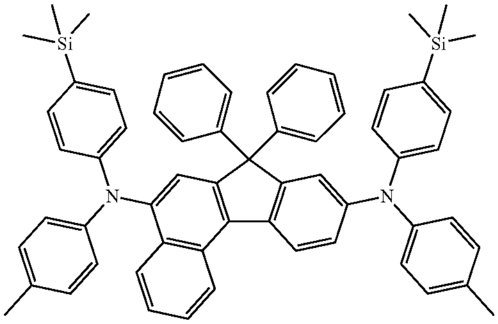
FD22
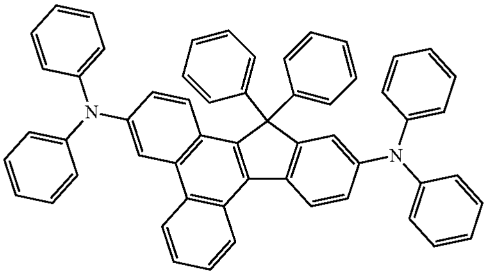
FD23
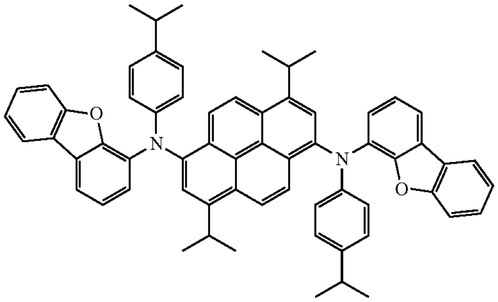
FD24
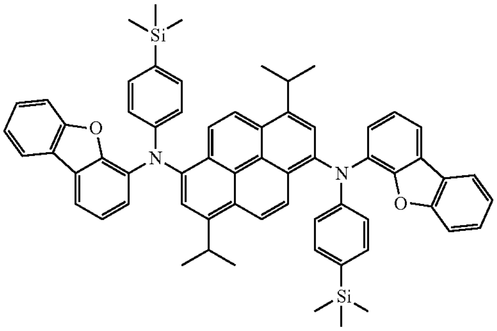
FD25
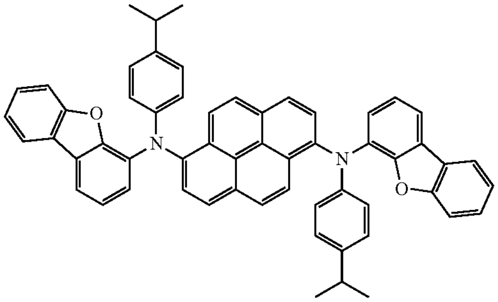
FD26
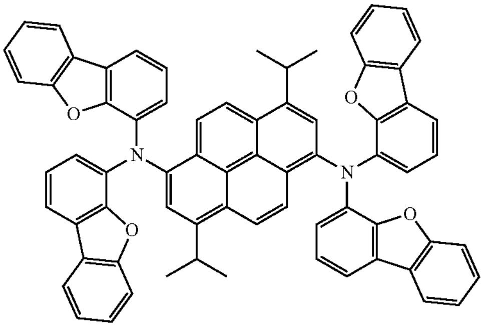

-continued
FD27
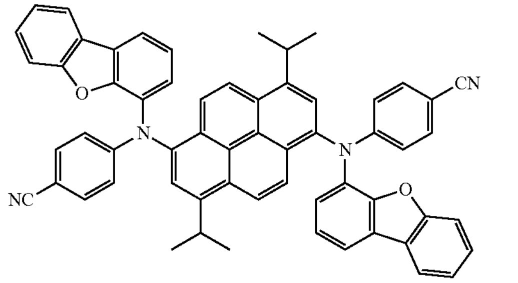
FD28
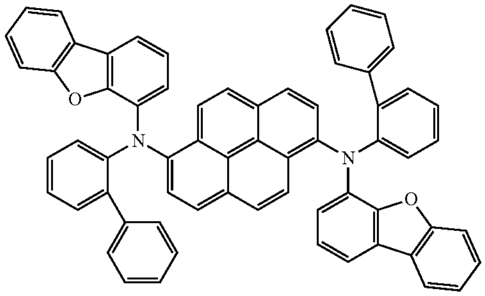
FD29
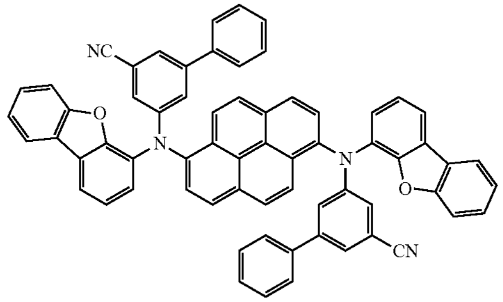
FD30
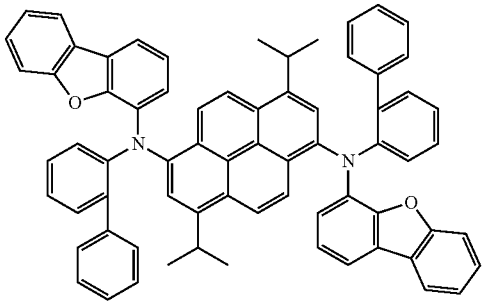
FD31
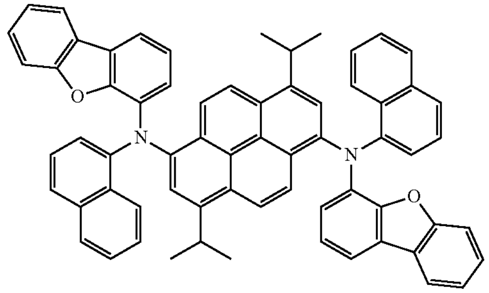
FD32
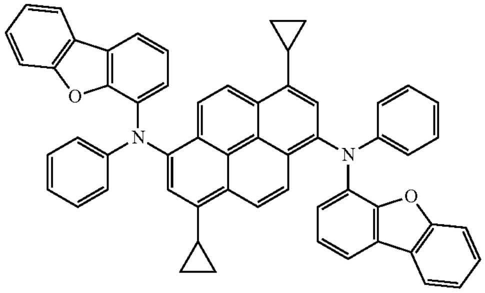
FD33
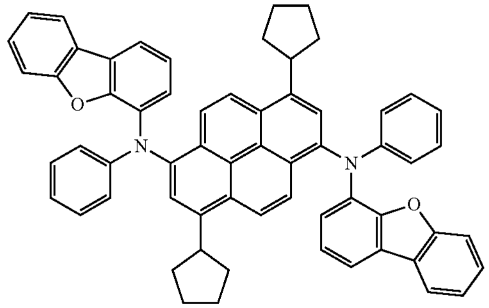
FD34
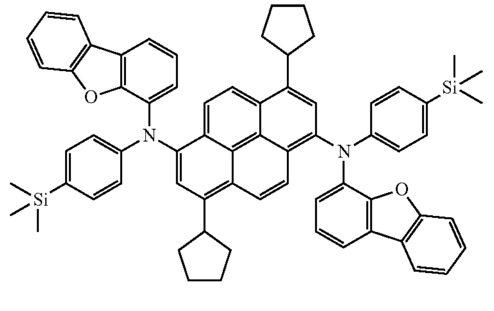
FD35
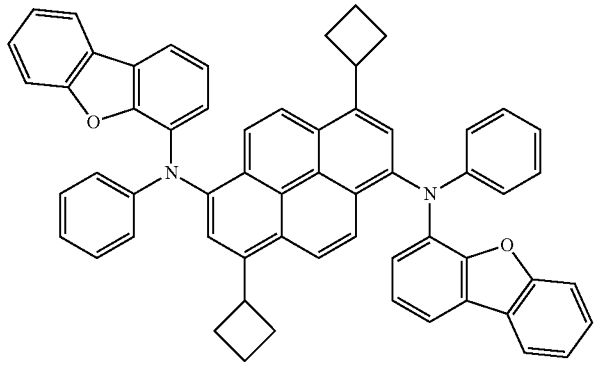

-continued

FD36

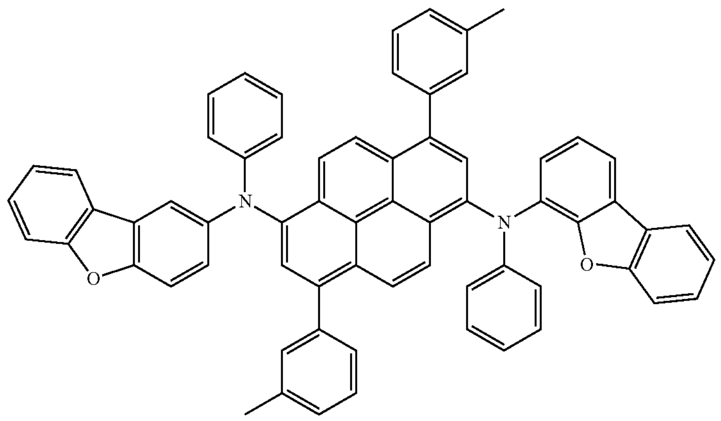

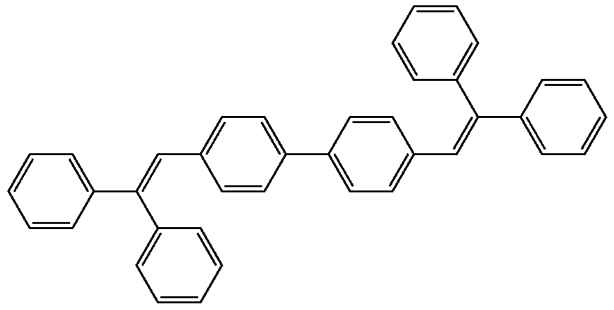

DPVBi

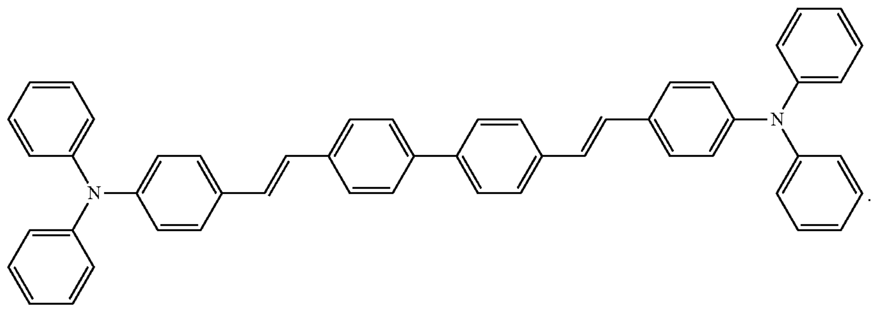

DPAVBi

Delayed Fluorescence Material

The emission layer may include a delayed fluorescence material.

In the present disclosure, the delayed fluorescence material may be selected from compounds capable of emitting delayed fluorescent light based on a delayed fluorescence emission mechanism.

The delayed fluorescence material included in the emission layer may act as a host or a dopant depending on the type or kind of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved (increased).

For example, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of the following compounds DF1 to DF9:

DF1
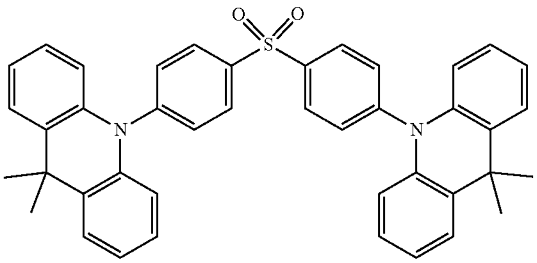
(DMAC-DPS)
DF2
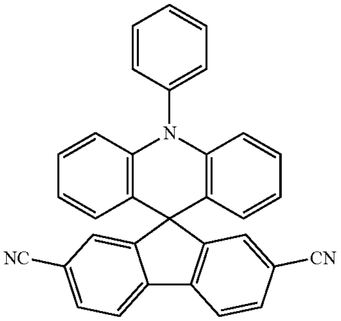
(ACRFLCN)
DF3
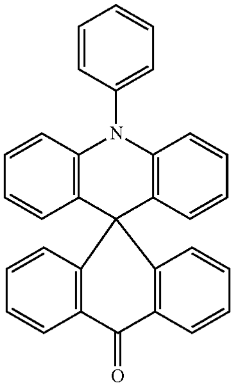
(ACRSA)
DF4
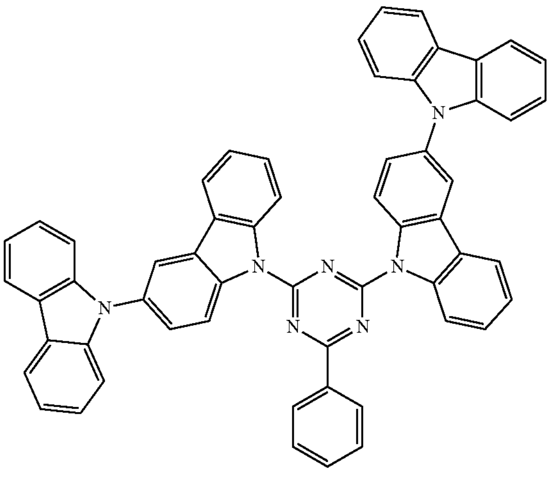
(CC2TA)
-continued
DF5
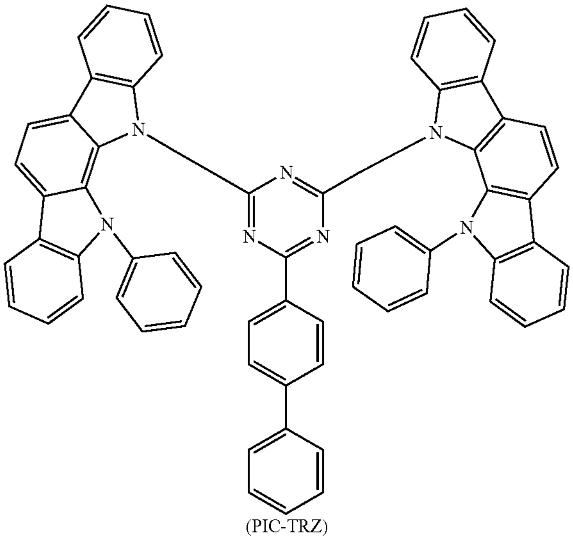
(PIC-TRZ)
DF6
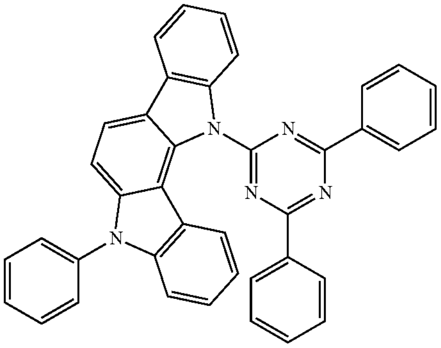
(TRZ2)
DF7
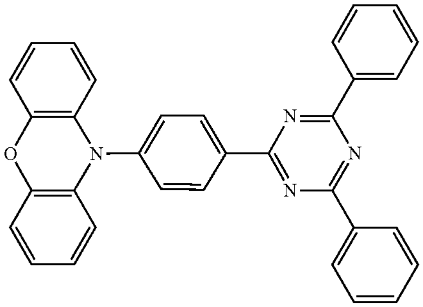
(PXZ-TRZ)
DF8
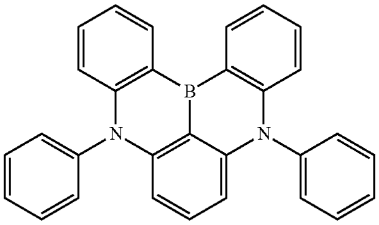
(DABNA-1)

-continued

DF9

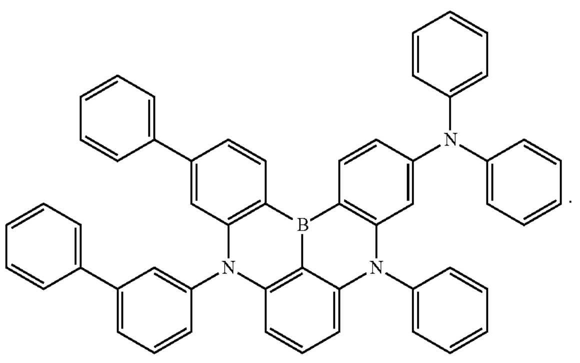

(DABNA-2)

Quantum Dot

The term "quantum dot" as used herein refers to a crystal of a semiconductor compound, and may include any suitable material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any suitable process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled or selected through a process which costs less, and is easier than vapor deposition methods, such as metal organic chemical vapor deposition (MOCVD) or molecular beam epitaxy (MBE), The quantum dot may include Group II-VI semiconductor compounds, Group III-V semiconductor compounds, Group III-VI semiconductor compounds, Group I-III-VI semiconductor compounds, Group IV-VI semiconductor compounds, Group IV elements or compounds, or one or more combinations thereof.

Examples of the Group II-VI semiconductor compound are a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or one or more combinations thereof.

Examples of the group III-V semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or one or more combinations thereof. In some embodiments, the Group III-V semiconductor compound may further include a Group II element. Examples of the Group III-V semiconductor compound further including a Group II element are InZnP, InGaZnP, InAlZnP, etc.

Examples of the Group III-VI semiconductor compound are: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and one or more combinations thereof.

Examples of the Group I-III-VI semiconductor compound are: a ternary compound, such as AgInS, $AgInS_2$, CuInS, $CuInS_2$, $CuGaO_2$, $AgGaO_2$, or $AgAlO_2$; or one or more combinations thereof.

Examples of the Group IV-VI semiconductor compound are: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or one or more combinations thereof.

The Group IV element or compound may include: a single element compound, such as Si or Ge; a binary compound, such as SiC or SiGe; or one or more combinations thereof.

Each element included in a multi-element compound such as the binary compound, the ternary compound, and the quaternary compound may be present at a substantially uniform concentration or non-uniform concentration in a particle.

In one or more embodiments, the quantum dot may have a single structure in which the concentration of each element in the quantum dot is substantially uniform, or a core-shell dual structure. For example, the material included in the core and the material included in the shell may be different from each other.

The shell of the quantum dot may act as a protective layer that prevents (reduces) chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Examples of the shell of the quantum dot may be an oxide of metal, metalloid, or non-metal, a semiconductor compound, and/or one or more combinations thereof. Examples of the oxide of metal, metalloid, or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $C_3O_4$, or NiO; a ternary compound, such as $MgAl_2O_4$, $CoFe_2O_4$, $NiFe_2O_4$, or $CoMn_2O_4$; and/or one or more combinations thereof. Examples of the semiconductor compound are, as described herein, a Group II-VI semiconductor compound; a Group III-V semiconductor compound; a Group III-VI semiconductor compound; a Group I-III-VI semiconductor compound; a Group IV-VI semiconductor compound; and/or one or more combinations thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or one or more combinations thereof.

A full width at half maximum (FWHM) of the emission wavelength spectrum of the quantum dot may be about 45 nm or less, for example, about 40 nm or less, for example, about 30 nm or less, and within these ranges, color purity or color reproducibility may be increased. In addition, since the light emitted through the quantum dot is emitted in all directions, the wide viewing angle may be improved (increased).

In addition, the quantum dot may be in the form of a substantially spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having one or more suitable wavelength bands may be obtained from the quantum dot emission layer. Accordingly, by using quantum dots of different sizes, a light-emitting device that emits light of one or more suitable wavelengths may be implemented. In one or more embodiments, the size of the quantum dot may be selected to emit red, green and/or blue light. In addition, the size of the quantum dot may be configured to emit white light by combination of light of one or more suitable colors.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include: an electron transport layer; and a hole blocking layer, an electron injection layer, or one or more combinations thereof.

The electron transport layer may be the same as described herein.

For example, the electron transport region may have a first electron transport layer/second electron transport layer structure, wherein layers are stacked sequentially from the first electrode.

In an embodiment, the electron transport region (for example, the hole blocking layer, or the electron transport layer in the electron transport region) may include a metal-free compound including at least one 7 electron-deficient nitrogen-containing $C_1$-$C_{60}$ cyclic group.

For example, the electron transport region may include a compound represented by Formula 601 below:

$$[Ar_{601}]_{xe11}\text{-}[(L_{601})_{xe1}\text{-}R_{601}]_{xe21}$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described herein with respect to $Q_1$, xe21 may be 1, 2, 3, 4, or 5, at least one of $Ar_{601}$, $L_{601}$, and $R_{601}$ may each independently be π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In other embodiments, $Ar_{601}$ in Formula 601 may be a substituted or unsubstituted anthracene group.

In other embodiments, the electron transport region may include a compound represented by Formula 601-1:

Formula 601-1

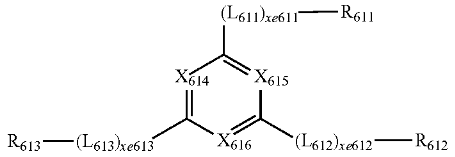

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be the same as described herein with respect to $L_{601}$, xe611 to xe613 may each be the same as described herein with respect to xe1, $R_{611}$ to $R_{613}$ may each be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or one or more combinations thereof:

ET1

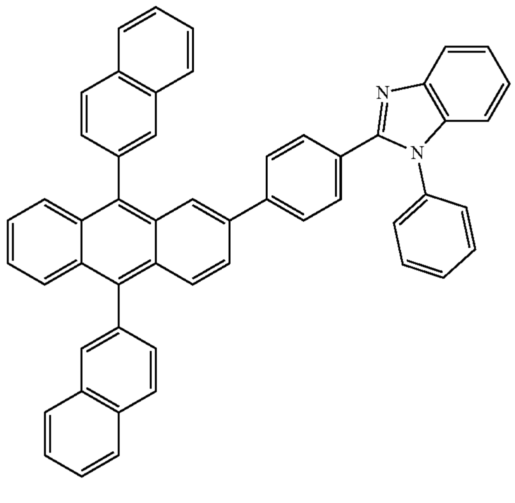

-continued
ET2
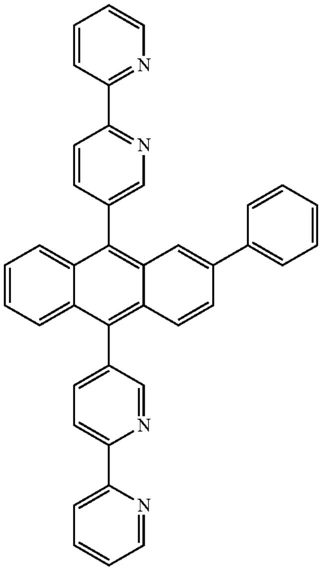
ET3
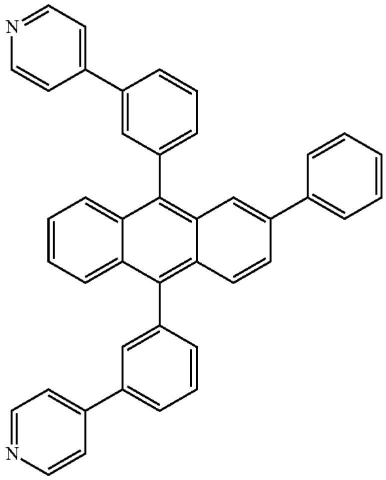
ET4
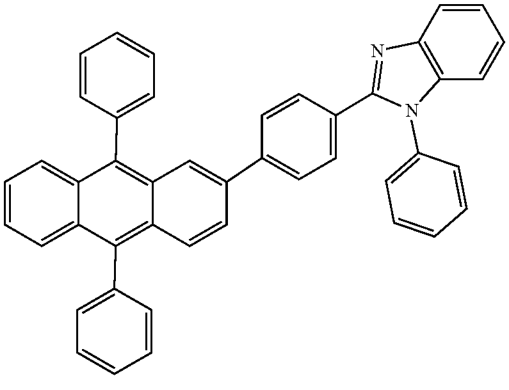
-continued
ET5
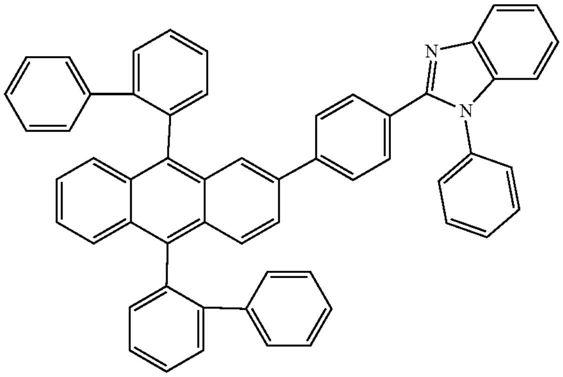
ET6
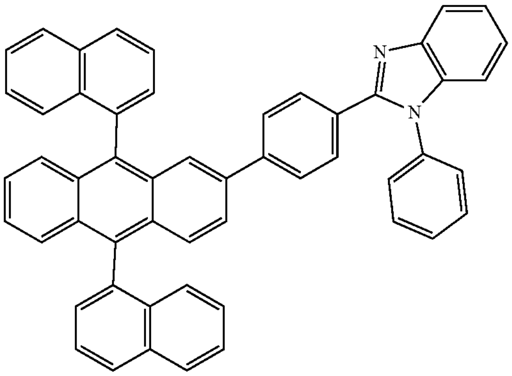
ET7
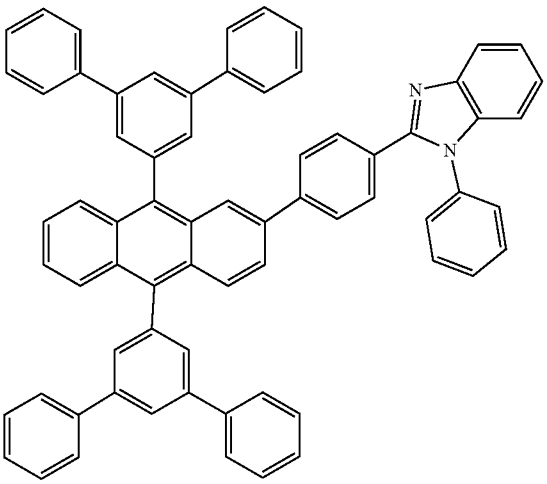

-continued
ET8
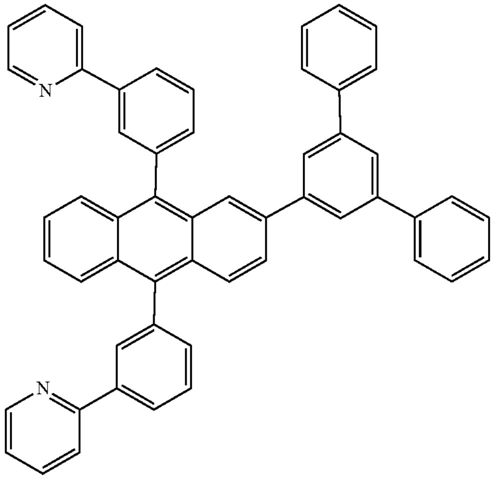
ET9
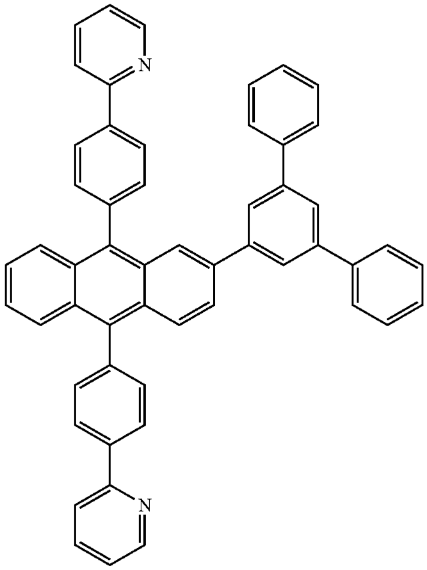
ET10
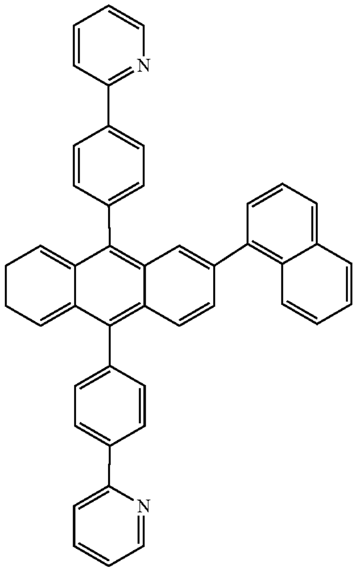
-continued
ET11
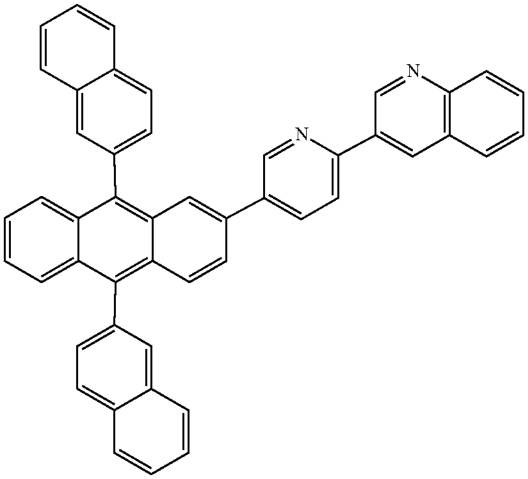
ET12
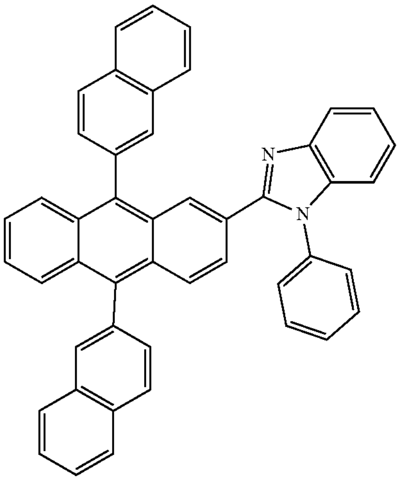
ET13
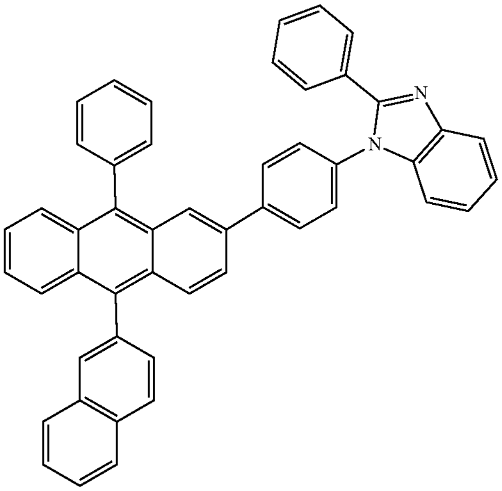

-continued
ET14
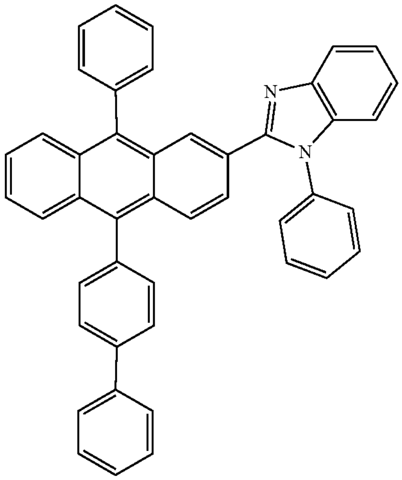
ET15
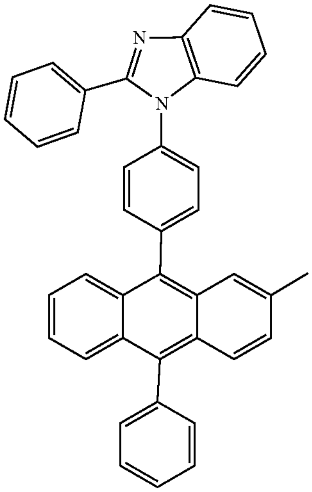
ET16
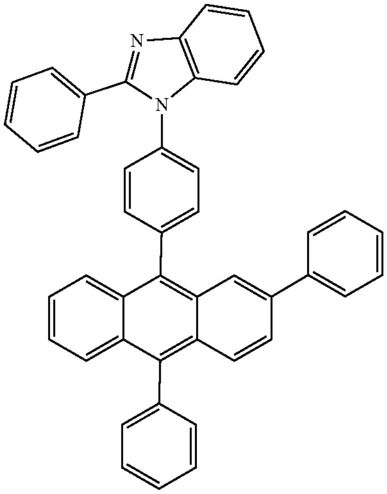
-continued
ET17
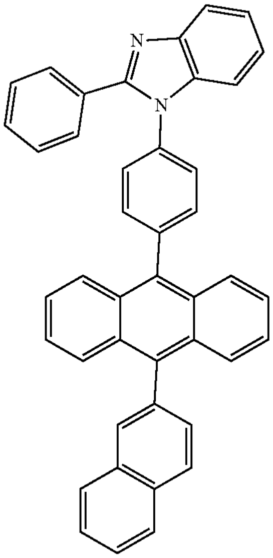
ET18
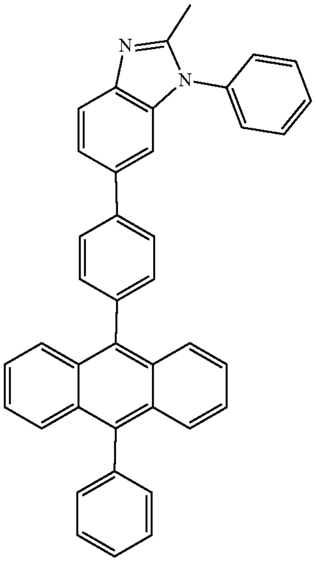
ET19
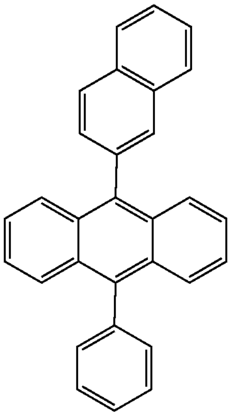

-continued
ET20
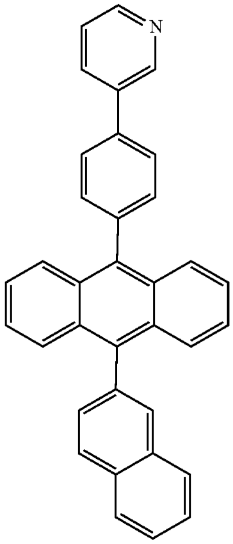
ET21
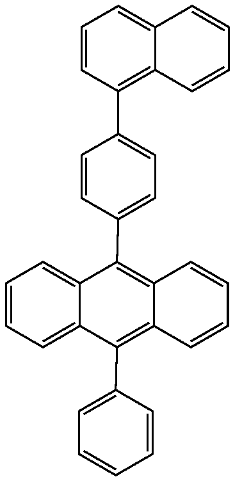
ET22
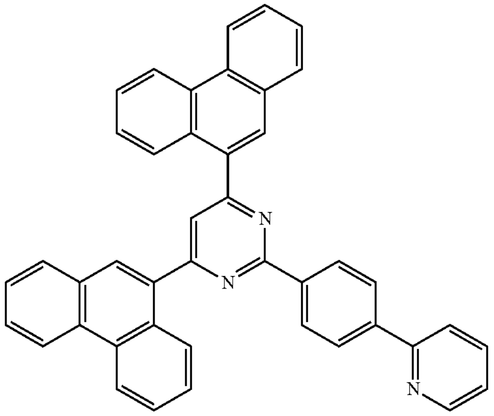
-continued
ET23
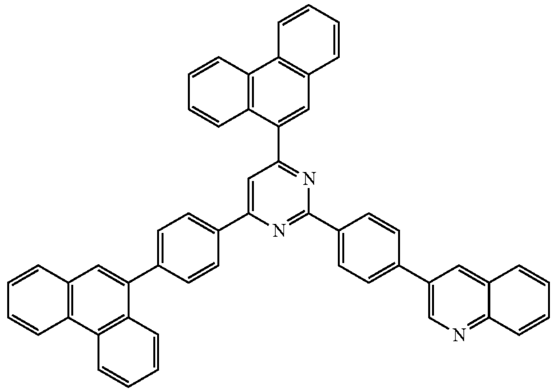
ET24
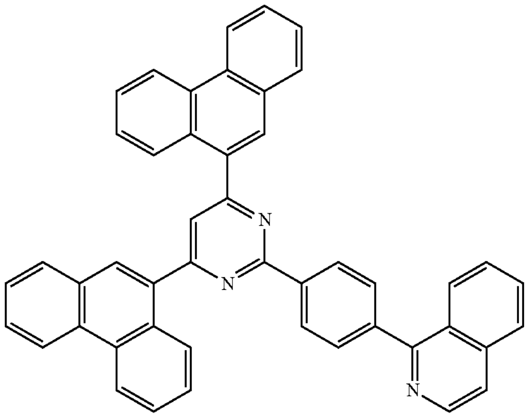
ET25
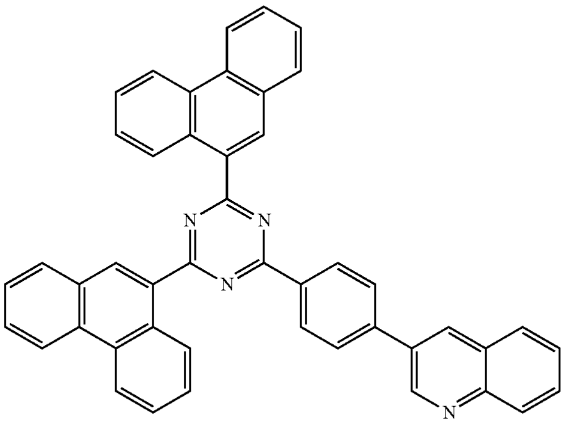

-continued
ET26
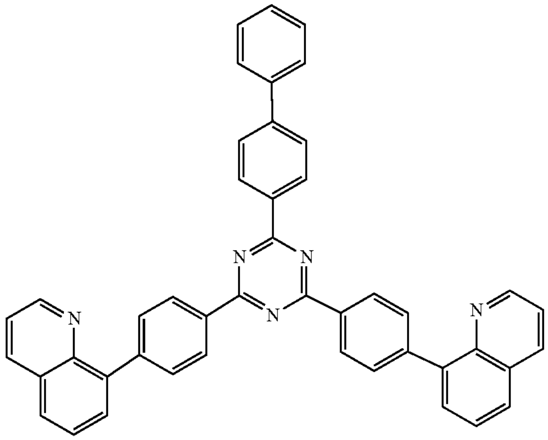
ET27
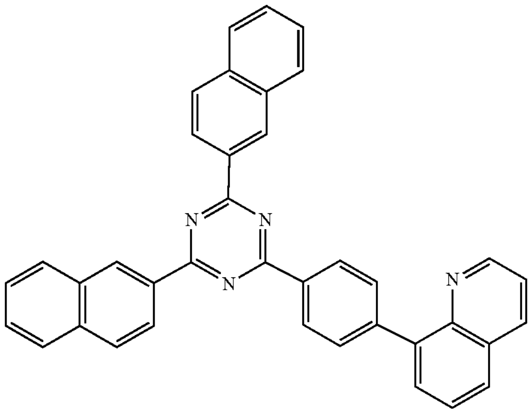
ET28
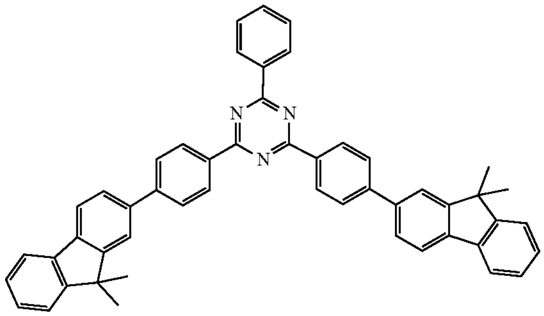
-continued
ET29
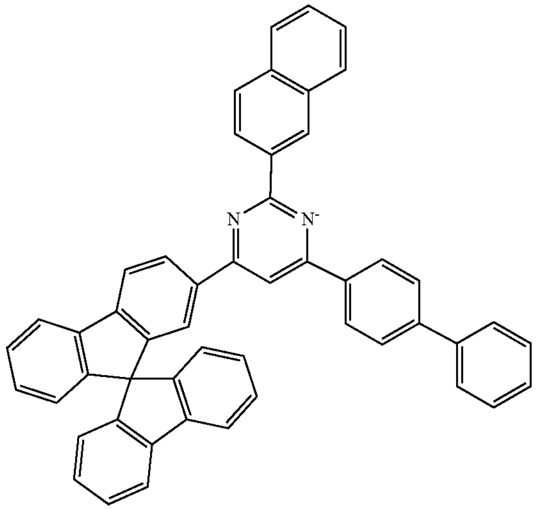
ET30
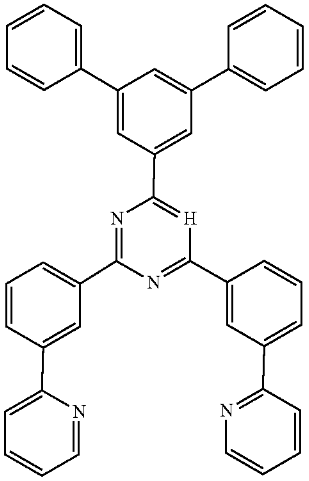
ET31
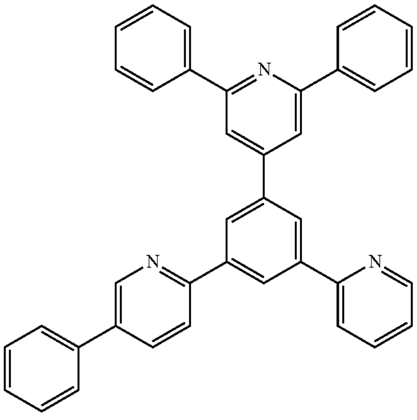

ET32
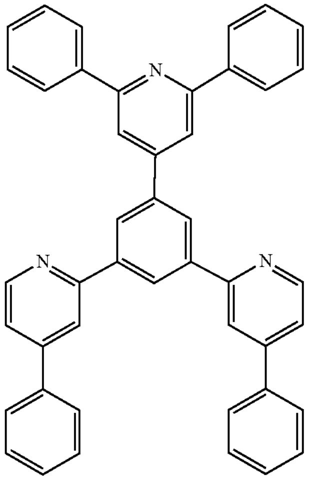
ET33
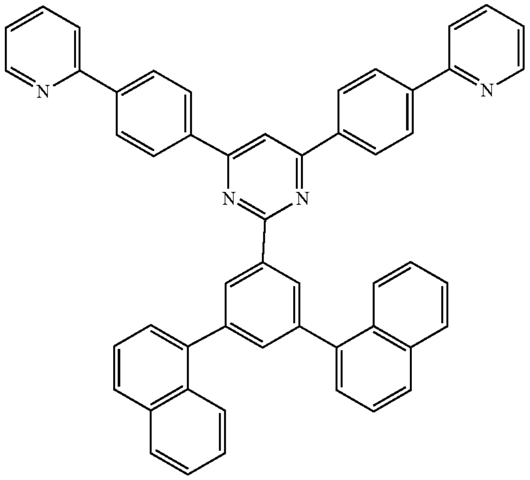
ET34
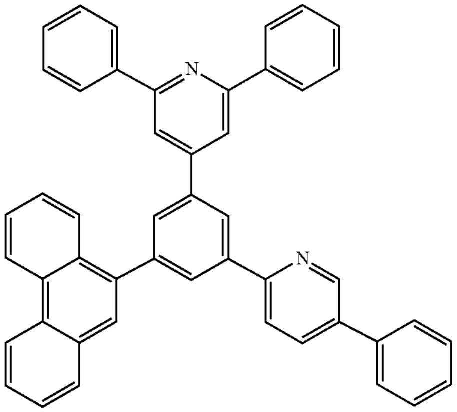
ET35
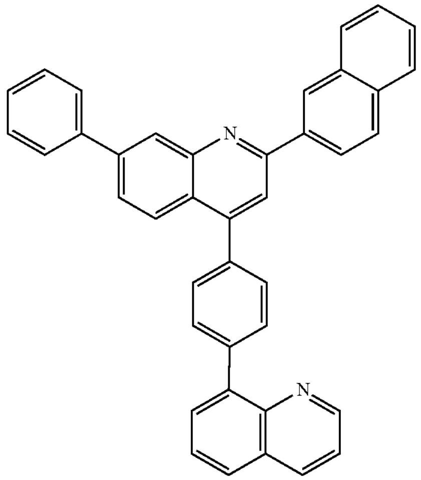
ET36
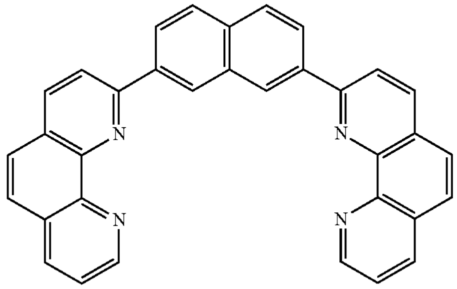
ET37
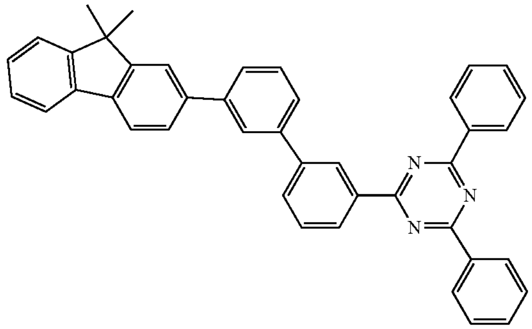
ET38
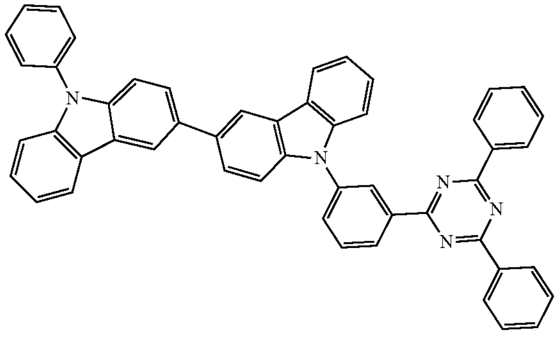

ET39
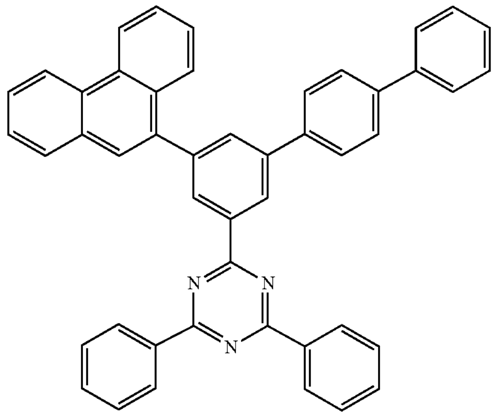
ET40
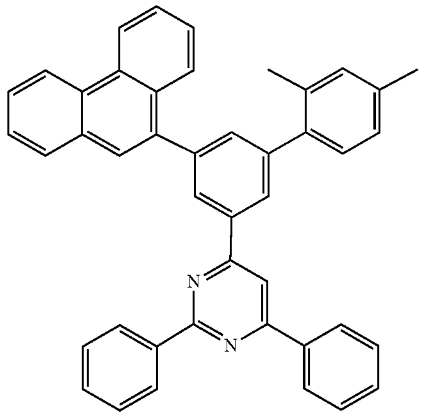
ET41
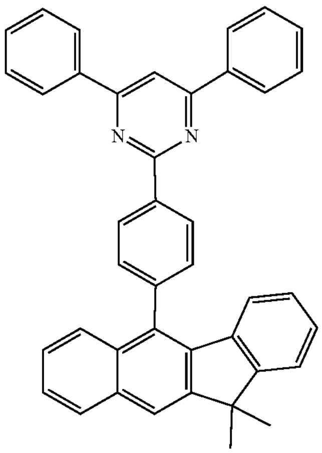
ET42
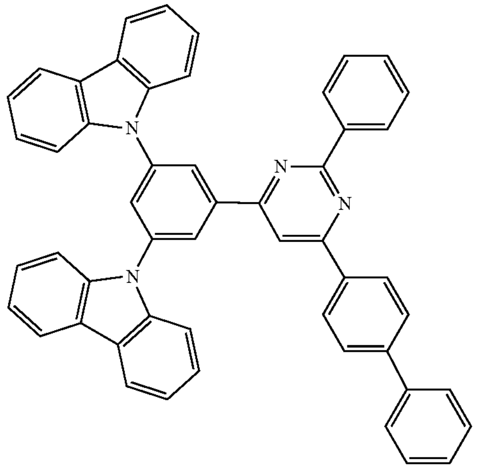
ET43
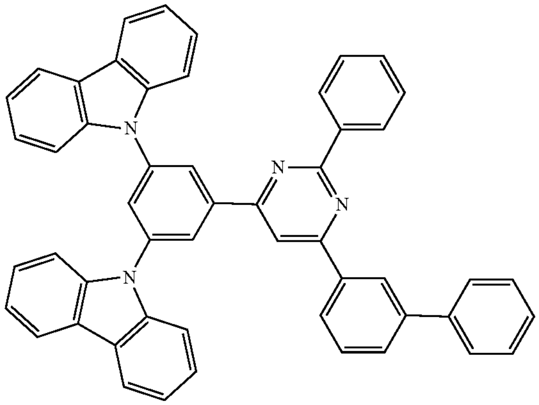
ET44
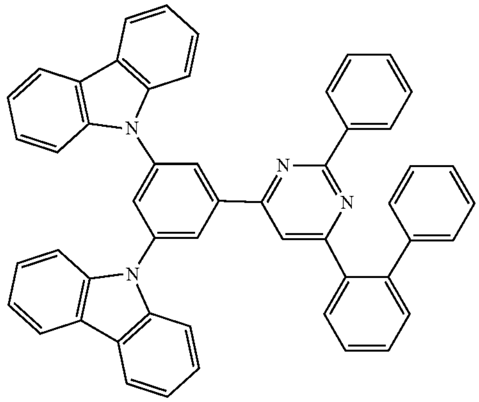
ET45
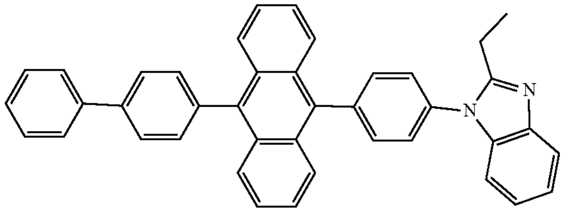

-continued

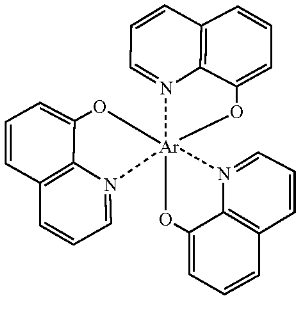

Alq3

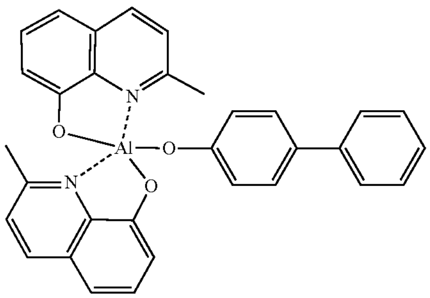

BAlq

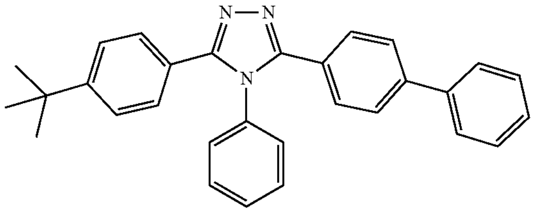

TAZ

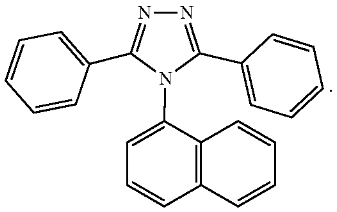

NTAZ

The first electron transport layer may include an oxide of Ti, Zn, Mg, Al, Sn, or one or more combinations thereof (however, ZnO is excluded). For example, the first electron transport layer may include $TiO_2$, ZnMgO, ZnAlO, $SnO_2$, or one or more combinations thereof.

The second electron transport layer may include a phosphine oxide compound. For example, the second electron transport layer may include any one of Compounds 101 to 107.

A thickness of the electron transport region may be from about 100 Å to about 5,000 Å, for example, about 160 Å to about 4,000 Å. When the electron transport region includes a hole blocking layer, an electron transport layer, or a combination thereof, a thickness of the hole blocking layer may be about 20 Å to about 1,000 Å, for example, about 30 Å to about 300 Å. When the thickness of the hole blocking layer is within these ranges, satisfactory (suitable) electron transporting characteristics may be obtained without a substantial increase in driving voltage.

The electron transport layer may be as the same as described herein.

The electron transport region (for example, the electron transport layer in the electron transport region) may further include, in addition to the materials described above, a metal-containing material.

The metal-containing material may include an alkali metal complex, an alkaline earth metal complex, or a combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or one or more combinations thereof.

For example, the metal-containing material may include a Li complex. The Li complex may include, for example, Compound ET-D1 (LiQ) or ET-D2:

ET-D1

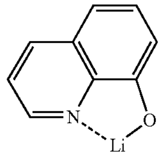

ET-D2

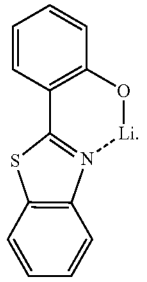

Second Electrode 150

The second electrode 150 may be on the interlayer 130 having a structure as described above. The second electrode 150 may be an anode and a semi-transmissive electrode or a transmissive electrode.

When the second electrode 150 is a semi-transmissive electrode or a transmissive electrode, magnesium (Mg), silver (Ag), aluminum (Al), aluminum-lithium (Al—Li), calcium (Ca), magnesium-indium (Mg—In), magnesium-silver (Mg—Ag), or one or more combinations thereof may be used as a material for forming a second electrode.

The second electrode 150 may have a single-layered structure including (e.g., consisting of) a single layer, or a multi-layered structure including a plurality of layers.

Capping Layer

A first capping layer may be outside the first electrode 110, and/or a second capping layer may be outside the second electrode 150. For example, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

For example, light generated by the emission layer in the interlayer 130 of the light-emitting device 10 may be extracted to the outside through the second electrode 150, which is a semi-transmissive electrode or a transmissive electrode, and the second capping layer 170.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved (increased).

Each of the first capping layer and the second capping layer may include a material having a refractive index of about 1.5 to about 2.0 (at 589 nm) (for example, a refractive index of 1.6 or more (at 589 nm)).

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or one or more combinations thereof. Optionally, the carbocyclic compound, the heterocyclic compound, and the amine group-containing compound may be substituted with a substituent including O, N, S, Se, Si, F, Cl, Br, I, or one or more combinations thereof. In one or more embodiments, at least one of the first capping layer and the second capping layer may each independently include an amine group-containing compound.

For example, at least one of the first capping layer and the second capping layer may each independently include a compound represented by Formula 201, a compound represented by Formula 202, or a combination thereof.

In one or more embodiments, at least one of the first capping layer and the second capping layer may each independently include one of Compounds HT28 to HT33, one of Compounds CP1 to CP6, β-NPB, or one or more combinations thereof:

CP1

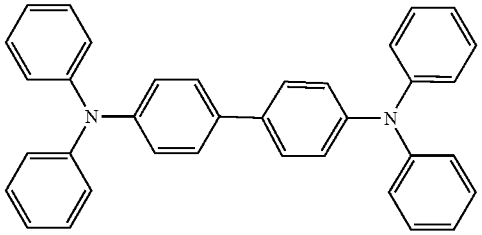

-continued

CP2

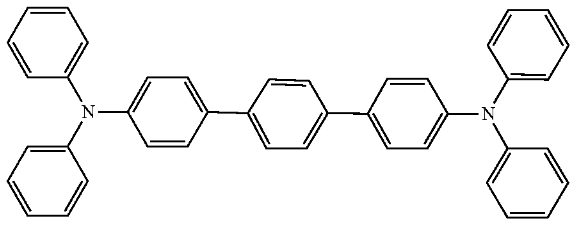

CP3

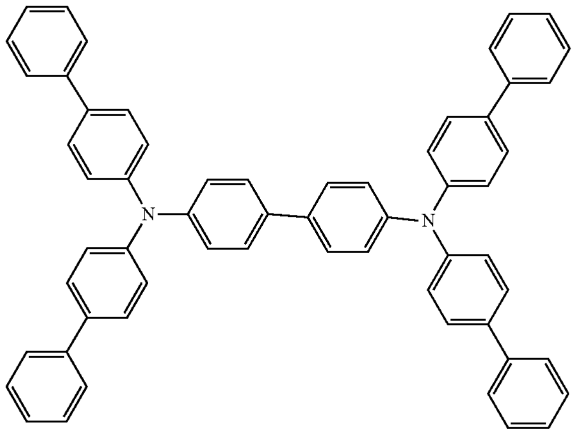

CP4

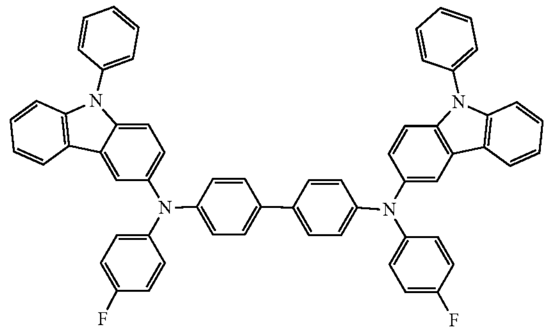

CP5

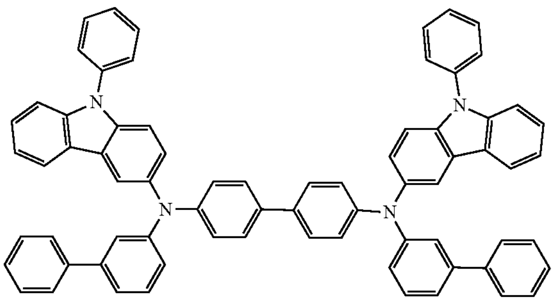

-continued

CP6

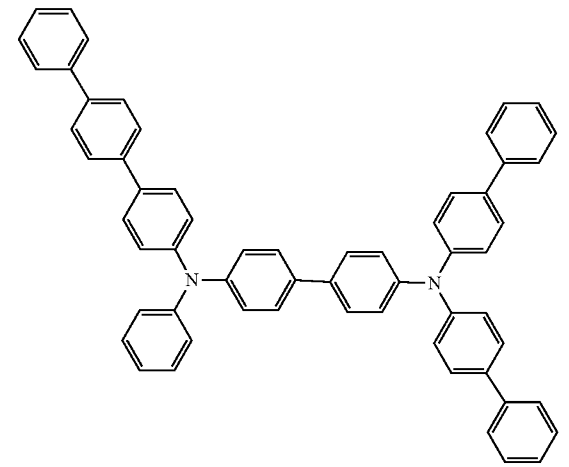

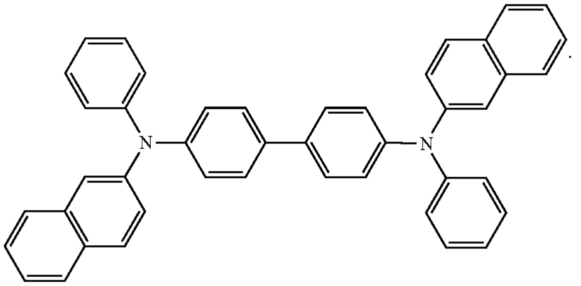

β-NPB

Electronic Apparatus

The light-emitting device may be included in various electronic apparatuses. For example, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, the light emitted from the light-emitting device may be blue light or white light. For more details on the light-emitting device, related description provided above may be referred to. In one or more embodiments, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel defining film may be located among the subpixel areas to define each of the subpixel areas.

The color filter may further include a plurality of color filter areas and light-shielding patterns located among the color filter areas, and the color conversion layer may further include a plurality of color conversion areas and light-shielding patterns located among the color conversion areas.

The plurality of color filter areas (or the plurality of color conversion areas) may include a first area emitting first color light, a second area emitting second color light, and/or a third area emitting third color light, wherein the first color light, the second color light, and/or the third color light may have different maximum emission wavelengths from one another. For example, the first color light may be red light, the second color light may be green light, and the third color light may be blue light. For example, the plurality of color filter areas (or the plurality of color conversion areas) may include quantum dots. In particular, the first area may include a red quantum dot, the second area may include a green quantum dot, and the third area may not include (e.g., may exclude) a quantum dot. For more details on the quantum dot, related descriptions provided herein may be referred to. The first area, the second area, and/or the third area may each include a scatterer.

For example, the light-emitting device may emit first light, the first area may absorb the first light to emit first-first color light, the second area may absorb the first light to emit second-first color light, and the third area may absorb the first light to emit third-first color light. In this regard, the first-first color light, the second-first color light, and the third-first color light may have different maximum emission wavelengths. In particular, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be located between the color filter and/or the color conversion layer and the light-emitting device. The sealing portion allows light from the light-emitting device to be extracted to the outside, and concurrently (e.g., simultaneously) prevents (reduces) ambient air and moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the use of the electronic apparatus. Examples of the functional layers may include a touch screen layer, a polarizing layer, and/or the like. The touch screen layer may be a pressure-sensitive touch screen layer, a capacitive touch screen layer, or an infrared touch screen layer.

The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and/or the like.

Figure 2:
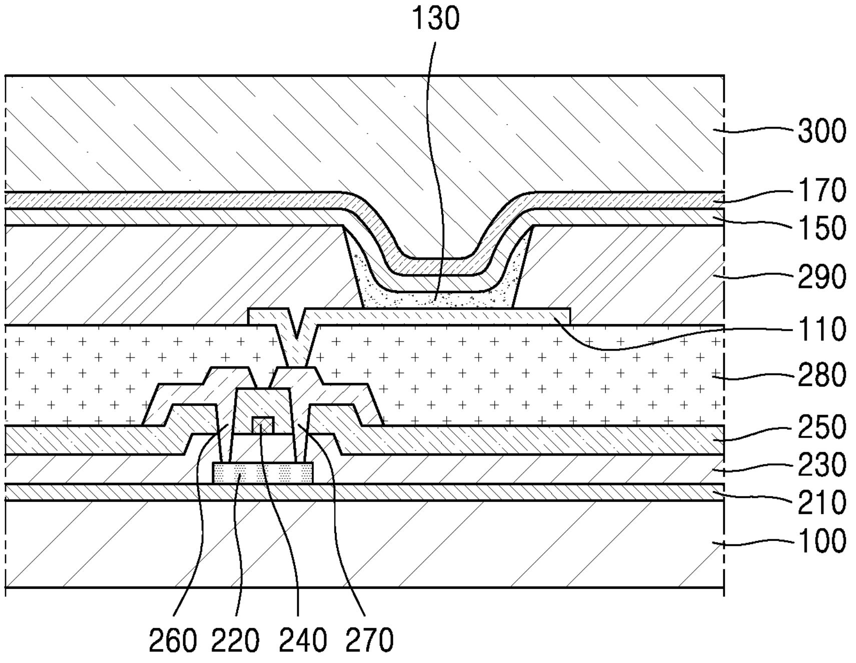
FIG. 2 is a cross-sectional view showing a light-emitting apparatus according to an embodiment of the present disclosure.
Figure 3:
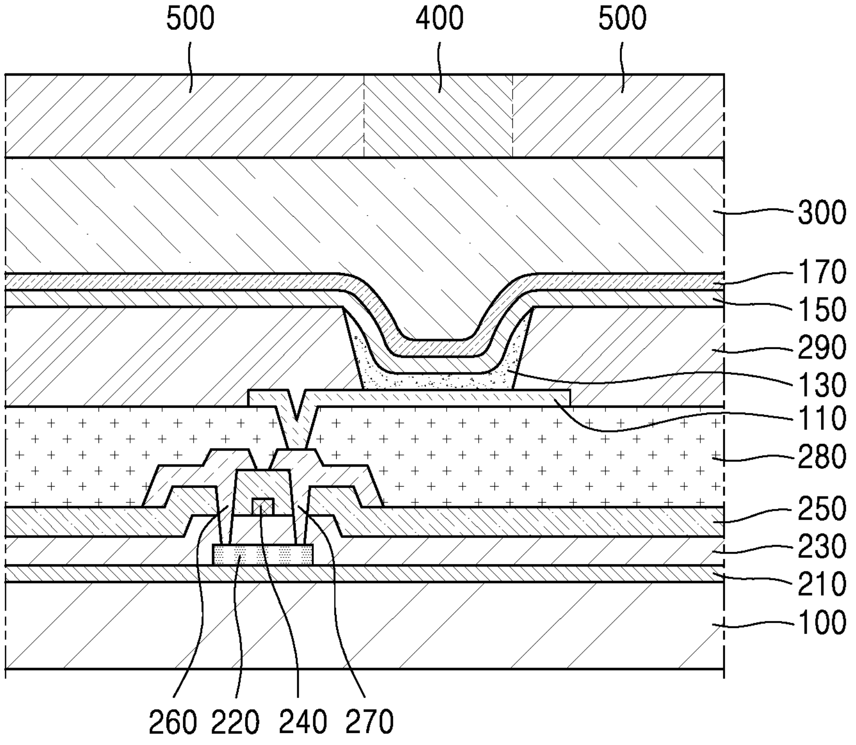
FIG. 3 shows a cross-sectional view showing a light-emitting apparatus according to an embodiment of the present disclosure.

Description of FIGS. 2 and 3

FIG. 2 is a cross-sectional view of an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent (reduce) penetration of impurities through the substrate 100 and may provide a substantially flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to insulate the gate electrode from the source electrode and the gate electrode from the drain electrode.

The source electrode 260 and the drain electrode 270 may be on the interlayer insulating film 250. The interlayer insulating film 250 and the gate insulating film 230 may be formed so as to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered and protected by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may be located so as to expose a portion of the drain electrode 270, not fully covering the drain electrode 270, and the first electrode 110 may be connected to the exposed portion of the drain electrode 270.

A pixel defining layer 290 including an insulating material may be located on the first electrode 110. The pixel defining layer 290 may expose a certain region of the first electrode 110, and an interlayer 130 may be formed in the exposed region of the first electrode 110. The pixel defining layer 290 may be a polyimide or polyacrylic organic film. At least some layers (for example, an electron transport layer) of the interlayer 130 may extend beyond the upper portion of the pixel defining layer 290 to be located in the form of a common layer (e. g., may be provided as a common layer).

The second electrode 150 may be on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or one or more combinations thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or one or more combinations thereof; or a combination of the inorganic films and the organic films.

FIG. 3 is a cross-sectional view of an electronic apparatus according to another embodiment of the present disclosure.

The electronic apparatus of FIG. 3 is substantially the same as the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacturing Method

The layers included in the hole transport region, the emission layer, and the layers included in the electron transport region may be formed in a certain region by using one or more suitable methods such as vacuum deposition, spin coating, casting, Langmuir-Blodgett (LB) deposition, ink-jet printing, laser-printing, laser-induced thermal imaging, and/or the like. The electron transport layer may be formed by using inkjetting. As an inkjet printer used in inkjetting, a known inkjet printer may be used.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

Definition of Terms

The term "$C_3$-$C_{60}$ carbocyclic group" as used herein refers to a cyclic group including (e.g., consisting of) carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group including (e.g., consisting of) one ring or a polycyclic group in which two or more rings are condensed with each other. For example, the $C_1$-$C_{60}$ heterocyclic group has 3 to 61 ring-forming atoms.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a T1 group or ii) a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which two or more T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a T1 group, ii) a condensed cyclic group in which two or more T1 groups are condensed with each other, iii) a T3 group, iv) a condensed cyclic group in which two or more T3 groups are condensed with each other, or v) a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a T4 group, ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group condensed to any cyclic group, a monovalent group, or a polyvalent group (for example, a divalent group, a trivalent group, a tetravalent group, etc.) according to the structure of a formula for which the corresponding term is used. For example, the "benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and specific examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by $-OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom, as ring-forming atoms, and specific examples are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and specific examples thereof are a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, and a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group described above.

The term "$C_6$-$C_{60}$ aryloxy group" as used herein indicates $-OA_{102}$ (wherein $A_{102}$ is the $C_6$-$C_{60}$ aryl group), and the term "$C_6$-$C_{60}$ arylthio group" as used herein indicates $-SA_{103}$ (wherein $A_{103}$ is the $C_6$-$C_{60}$ aryl group).

The term "$C_7$-$C_{60}$ aryl alkyl group" used herein refers to $-A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroaryl alkyl group" used herein refers to $-A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or one or more combinations thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or one or more combinations thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each substituted with deuterium, —F, a cyano group, a $C_1$-$C_{60}$ alkyl group, a $C_1$-$C_{60}$ alkoxy group, a phenyl group, a biphenyl group, or one or more combinations thereof.

The term "heteroatom" as used herein refers to any atom other than a carbon atom. Examples of the heteroatom are O, S, N, P, Si, B, Ge, Se, and/or one or more combinations thereof.

The term "the third-row transition metal" used herein includes hafnium (Hf), tantalum (Ta), tungsten (W), rhenium (Re), osmium (Os), iridium (Ir), platinum (Pt), gold (Au), etc.

"Ph" as used herein refers to a phenyl group, "Me" as used herein refers to a methyl group, "Et" as used herein refers to an ethyl group, "ter-Bu" or "But" as used herein refers to a tert-butyl group, and "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

The maximum number of carbon atoms in this substituent definition section is an example only. In an embodiment, the maximum carbon number of 60 in the $C_1$-$C_{60}$ alkyl group is an example, and the definition of the alkyl group is equally applied to a $C_1$-$C_{20}$ alkyl group. The same applies to other cases.

* and*' as used herein, unless defined otherwise, each refer to a binding site to a neighboring atom in a corresponding formula.

Hereinafter, compounds according to embodiments and light-emitting devices according to embodiments will be described in more detail with reference to the following synthesis examples and examples. The wording "B was used instead of A" used in describing Synthesis Examples means that an identical molar equivalent of B was used in place of A.

EXAMPLES

Manufacture of Light-Emitting Device

Comparative Example 1 (Conventional Light-Emitting Device)

A 15 Ω/cm$^2$ (800 Å) Ag/ITO glass substrate (a product of Corning Inc.) was cut to a size of 50 mm×50 mm×0.7 mm, sonicated with isopropyl alcohol and pure water each for 5 minutes, and then cleaned by exposure to ultraviolet rays and ozone for 15 minutes. The resultant glass substrate was loaded onto a vacuum deposition apparatus.

HATCN (1,4,5,8,9,11-Hexaazatriphenylenehexacarbonitrile) was deposited on the Ag/ITO anode of the glass substrate to form a hole injection layer having a thickness of 50 Å, NPB was deposited on the hole injection layer to form a hole transport layer having a thickness of 1,000 Å, and BH3 and Compound 100 were deposited on the hole transport layer to a weight ratio of 97:3 to thereby form an emission layer (blue) having a thickness of 200 Å.

T2T was deposited on the emission layer to form an electron transport layer having a thickness of 1,000 Å, and then AgMg was vacuum-deposited on the electron transport layer to form a cathode electrode having a thickness of 130 Å.

CP1 was deposited on the cathode to form a capping layer having a thickness of 500 Å, thereby completing the manufacture of a light-emitting device.

Example 1 (Inverted Light-Emitting Device)

A 15 Ω/cm$^2$ (800 Å) Ag/ITO glass substrate (a product of Corning Inc.) was cut to a size of 50 mm×50 mm×0.7 mm, sonicated with isopropyl alcohol and pure water each for 5 minutes to prepare the substrate.

One ml of the first inkjet composition was inkjetted on Ag/ITO cathode of the glass substrate to form a film having a thickness of 800 Å, and then was baked for 10 minutes at 100° C. to thereby form a first electron transport layer. Then, one ml of the second inkjet composition was inkjetted on the first electron transport layer to form a film having a thickness of 200 Å and then baked for 10 minutes at 100° C. to thereby form a second electron transport layer.

BH3 and Compound 100 were co-deposited to a weight ratio of 97:3 on the second electron transport layer to form an emission layer (blue) having a thickness of 200 Å.

Then, NPB was deposited on the emission layer to form a hole transport layer having a thickness of 250 Å, and HATCN was deposited on the hole transport layer to form a hole injection layer having a thickness of 50 Å.

AgMg was deposited on the hole injection layer to form an anode electrode having a thickness of 130 Å.

CP1 was deposited on the anode to form a capping layer having a thickness of 500 Å, thereby completing the manufacture of a light-emitting device.

Compositions of the first inkjet composition and the second inkjet composition are as below.

First inkjet composition: 1 wt % of $TiO_2$ dissolved in 99 wt % of di-t-butyl ether solvent Second inkjet composition: 1 wt % of Compound 101 dissolved in 99 wt % of di-t-butyl ether solvent

Comparative Example 2

A 15 Ω/cm$^2$ (800 Å) Ag/ITO glass substrate (a product of Corning Inc.) was cut to a size of 50 mm×50 mm×0.7 mm, sonicated with isopropyl alcohol and pure water each for 5 minutes, and then cleaned by exposure to ultraviolet rays and ozone for 15 minutes to prepare the substrate.

One ml of PEDOT:PSS was inkjetted on Ag/ITO anode of the glass substrate to form a film having a thickness of 200 Å, and then was baked for 10 minutes at 100° C. to thereby form a hole injection layer. Then, one ml of poly(9,9-dioctylfluorene-alt-N-(4-sec-butylphenyl)-diphenylamine) (TFB) ink was inkjetted on the hole injection layer to form a film having a thickness of 800 Å, and then was baked for 10 minutes at 100° C. to form a hole transport layer.

A quantum dot InP was inkjetted on the hole transport layer having a thickness of 200 Å, and then baked for 10 minutes at 100° C. to form an emission layer (red).

Subsequently, one ml of ZnMgO was inkjetted on the emission layer to form a film having a thickness of 300 Å, and then AgMg was vacuum-deposited on a cathode electrode having a thickness of 130 Å.

CP1 was deposited on the cathode to form a capping layer having a thickness of 500 Å, thereby completing the manufacture of a light-emitting device.

Example 2

A light-emitting device was manufacture in the same manner as in Example 1, except that, when forming an emission layer, a quantum dot InP was inkjetted instead of Compounds BH3 and 100 to form a film having a thickness of 200 Å, and was baked for 10 minutes at 100° C. to thereby form the emission layer (red).

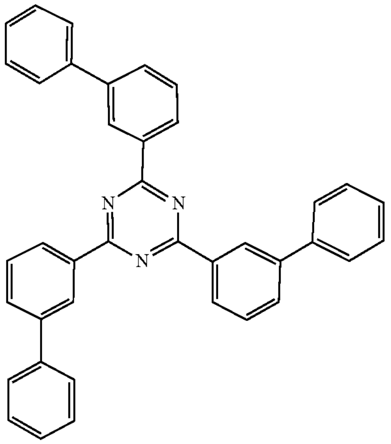

T2T

BH3

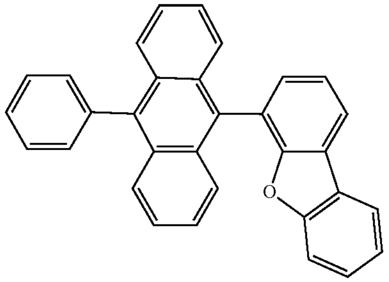

100

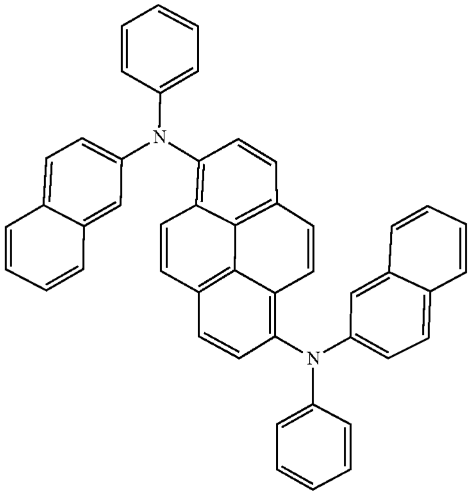

-continued

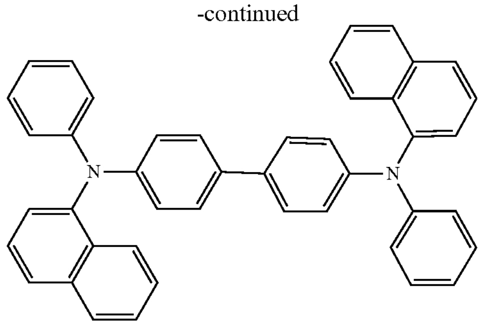

NPB

CP1

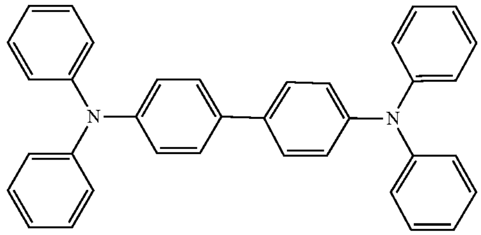

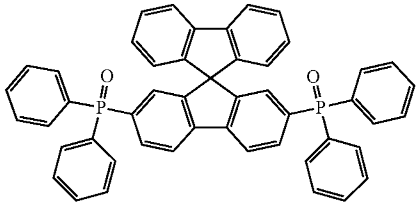

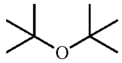

101 di-t-butyl ether

To evaluate the characteristics of the light-emitting devices manufactured according to Comparative Examples 1 and 2 and Examples 1 and 2, the driving voltage at a required luminance was measured, and the results thereof are shown in Table 1.

The driving voltage and current density of the light-emitting devices were measured using a source meter (2400 series, Keithley Instruments Inc.), and the efficiency was measured using C9920-2-12, which is a measurement system of Hamamatsu Photonics Inc.

TABLE 1

| | Driving voltage (V) | Efficiency (cd/A) |
|---|---|---|
| Comparative Example 1 | 4.0 | 7.1 |
| Example1 | 5.4 | 7.4 |
| Comparative Example 2 | 4.0 | 20.5 |
| Example 2 | 5.1 | 21.6 |

From the results of Table 1, it can be seen that the efficiency of the device of the Example has improved (increased) more than that of the device of the Comparative Example.

Although Examples 1 and 2 relate to a single pixel, for example, when including all RGB pixels, the thickness of the first hole transport layer and the second hole transport layer may be different according to each pixel. This is because the first hole transport layer and the second hole transport layer of the light-emitting device according to an embodiment are formed by inkjetting.

When forming a hole transport layer on an RGB pixel by spin coating or LB deposition, the thicknesses of the first hole transport layer and the second hole transport layer may not become different (the thicknesses are substantially the same) according to each pixel.

Therefore, the light-emitting device according to an embodiment of the disclosure may be applied to one or more suitable structures.

As described above, according to the one more embodiments, a light-emitting device may exhibit improved performance as compared with devices in the related art.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The light emitting device, electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope of the present disclosure as defined by the following claims and equivalents thereof.

What is claimed is:

1. A light-emitting device comprising:
a first electrode;
a second electrode facing the first electrode; and
an interlayer between the first electrode and the second electrode and comprising an emission layer, wherein
an electron transport layer is between the emission layer and the first electrode,
the electron transport layer comprises a first electron transport layer comprising an inorganic oxide and a second electron transport layer comprising a phosphine oxide compound, and
the first electrode is a reflective electrode.

2. The light-emitting device of claim 1, wherein the first electrode comprises indium tin oxide (ITO), indium zinc oxide (IZO), tin oxide ($SnO_2$), zinc oxide (ZnO), or any combination thereof.

3. The light-emitting device of claim 1, wherein the first electrode comprises magnesium (Mg), silver (Ag), aluminum (Al), aluminum-lithium (Al—Li), calcium (Ca), magnesium-indium (Mg—In), magnesium-silver (Mg—Ag), or any combination thereof.

4. The light-emitting device of claim 1, wherein
the first electrode is a cathode,
the second electrode is an anode, and
the light-emitting device further comprises a hole transport region between the second electrode and the emission layer and comprising a hole injection layer, a hole transport layer, an electron blocking layer, or any combination thereof.

5. The light-emitting device of claim 1, wherein the first electron transport layer is in direct contact with the second electron transport layer.

6. The light-emitting device of claim 1, wherein the first electron transport layer is in direct contact with the first electrode.

7. The light-emitting device of claim 1, wherein the second electron transport layer is in direct contact with the emission layer.

8. The light-emitting device of claim 1, wherein the inorganic oxide of the first electron transport layer comprises an oxide of Ti, Zn, Mg, Al, Sn, or any combination thereof, and wherein the oxide of Zn is not ZnO.

9. The light-emitting device of claim 1, wherein the inorganic oxide of the first electron transport layer comprises $TiO_2$, ZnMgO, ZnAlO, $SnO_2$, or any combination thereof.

10. The light-emitting device of claim 1, wherein the phosphine oxide compound of the second electron transport layer is one or more of the following compounds:

Compound 101

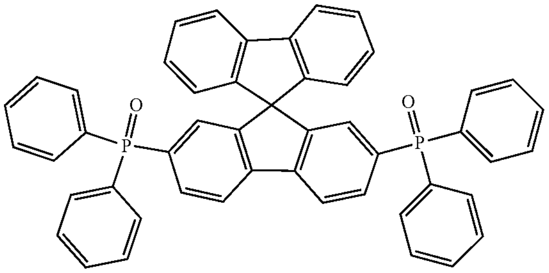

Compound 102

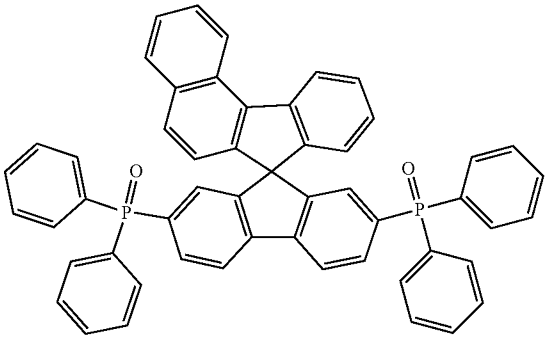

Compound 103

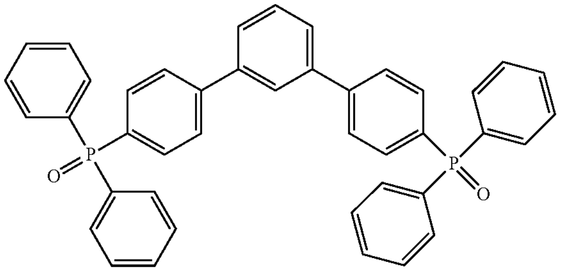

Compound 104

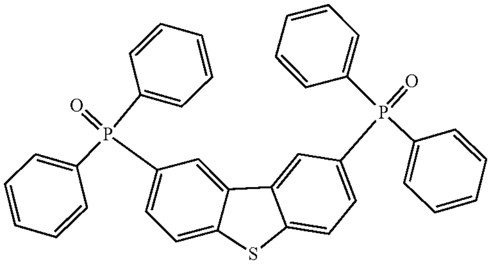

-continued

Compound 105

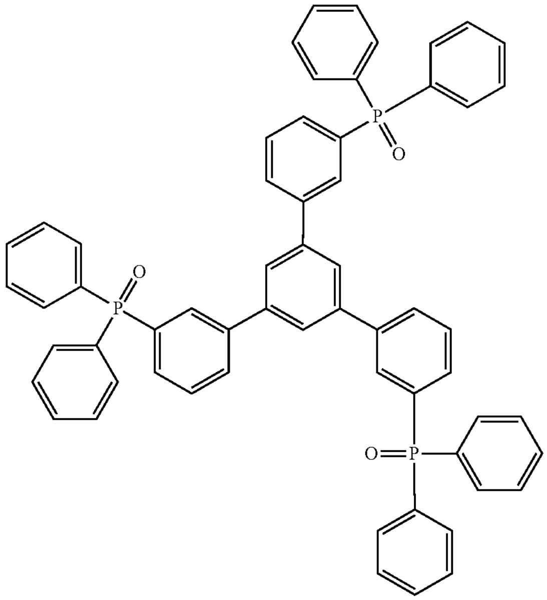

Compound 106

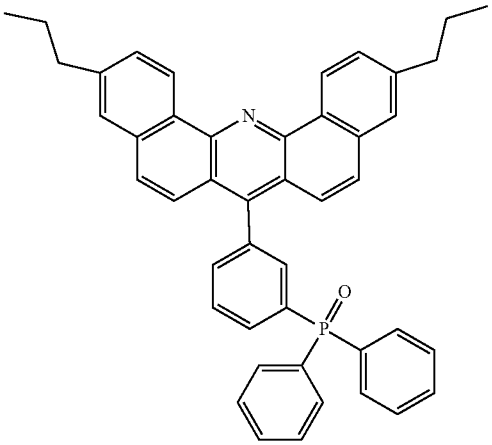

Compound 107

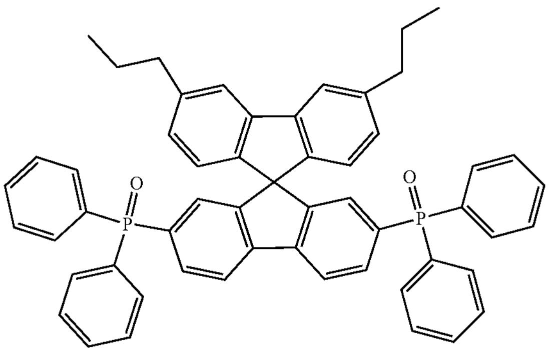

.

11. The light-emitting device of claim 1, wherein the first electron transport layer is thicker than the second electron transport layer.

12. The light-emitting device of claim 1, wherein a thickness of the first electron transport layer is about 200 Å to about 4,000 Å.

13. The light-emitting device of claim 1, wherein a thickness of the second electron transport layer is about 50 Å to about 600 Å.

14. The light-emitting device of claim 1, wherein the first electron transport layer and the second electron transport layer are formed by inkjetting.

15. The light-emitting device of claim 1, wherein the emission layer comprises: a host and a dopant; or a quantum dot.

16. The light-emitting device of claim 1, wherein the light-emitting device comprises a plurality of subpixels, the plurality of subpixels comprise:

a red subpixel comprising a red emission layer, a first electron transport layer (R), and a second electron transport layer (R);

a green subpixel comprising a green emission layer, a first electron transport layer (G), and a second electron transport layer (G);

a blue subpixel comprising a blue emission layer, a first electron transport layer (B), and a second electron transport layer (B); or any combination thereof, and thicknesses of each of the first electron transport layer (R), the second electron transport layer (R), the first electron transport layer (G), the second electron transport layer (G), the first electron transport layer (B), and the second electron transport layer (B) are identical to or different from each other.

17. An electronic apparatus comprising the light-emitting device of claim 1.

18. The electronic apparatus of claim 17, further comprising a thin-film transistor, wherein the thin-film transistor comprises a source electrode and a drain electrode, and the first electrode of the light-emitting device is electrically connected to the source electrode or the drain electrode of the thin-film transistor.

19. A method of manufacturing a light-emitting device, the method comprising:

forming a first electron transport layer by inkjetting a first inkjet composition; and forming a second electron transport layer by inkjetting a second inkjet composition on the first electron transport layer, wherein the second inkjet composition comprises a phosphine oxide compound and a solvent.

20. The method of claim 19, wherein the first inkjet composition further comprises: an oxide of Ti, Zn, Mg, Al, Sn, or any combination thereof and wherein the oxide of Zn is not ZnO; and a solvent.

21. The method of claim 19, wherein the phosphine oxide compound is one or more of the following compounds:

Compound 101

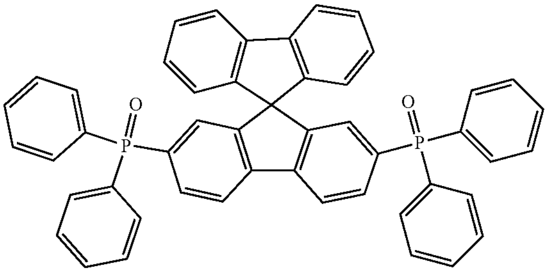

-continued

Compound 102

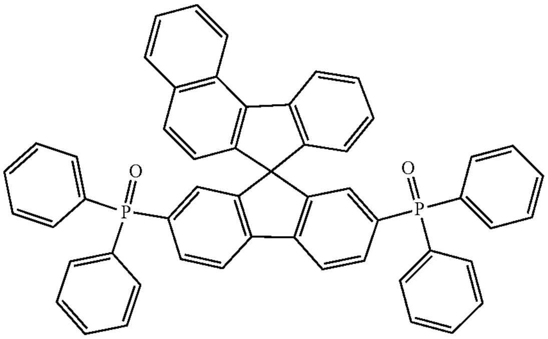

Compound 103

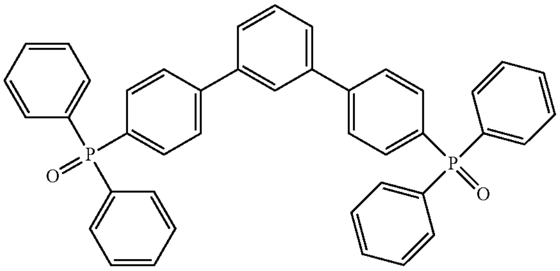

Compound 104

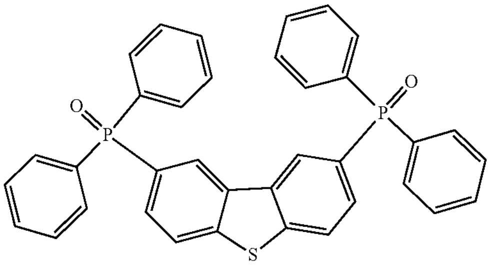

Compound 105

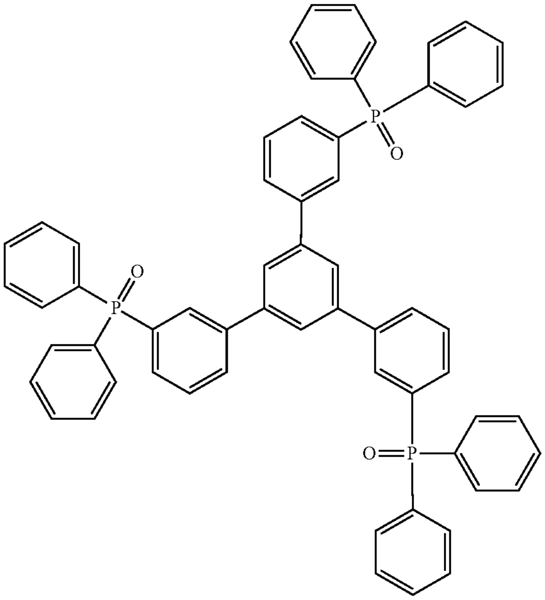

-continued

Compound 106

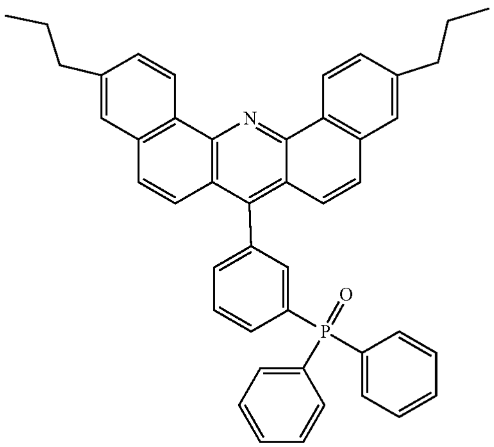

-continued

Compound 107

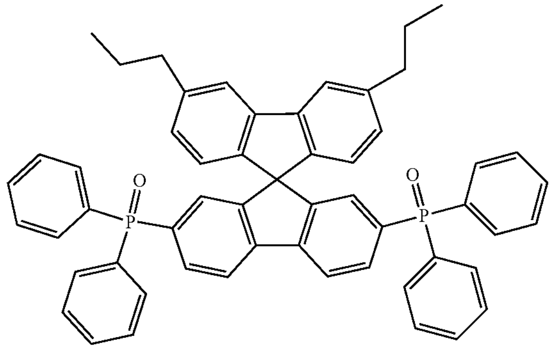

.

22. The method of claim 19, wherein the light-emitting device comprises:

a first electrode;

a second electrode facing the first electrode; and an interlayer between the first electrode and the second electrode and comprising an emission layer, wherein the first electron transport layer and the second electron transport layer are between the emission layer and the first electrode, and the first electrode is a reflective electrode.

* * * * *